(12) United States Patent
Kao

(10) Patent No.: US 12,107,148 B2
(45) Date of Patent: Oct. 1, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventor: Ching-Hung Kao, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 357 days.

(21) Appl. No.: 17/586,685

(22) Filed: Jan. 27, 2022

(65) Prior Publication Data

US 2023/0119077 A1 Apr. 20, 2023

Related U.S. Application Data

(60) Provisional application No. 63/257,875, filed on Oct. 20, 2021.

(51) Int. Cl.
*H01L 29/76* (2006.01)
*H01L 29/08* (2006.01)
(Continued)

(52) U.S. Cl.
CPC .... *H01L 29/66545* (2013.01); *H01L 29/0847* (2013.01); *H01L 29/0865* (2013.01);
(Continued)

(58) Field of Classification Search
CPC .......... H01L 29/66545; H01L 29/0847; H01L 29/0865; H01L 29/0882; H01L 29/401;
(Continued)

(56) References Cited

U.S. PATENT DOCUMENTS

| 8,558,310 B2* | 10/2013 | Nandakumar .. H01L 21/823814 |
| | | 257/408 |
| 2006/0017117 A1* | 1/2006 | Kotani ............ H01L 21/823412 |
| | | 257/E21.624 |

FOREIGN PATENT DOCUMENTS

| TW | 201336082 A | 9/2013 |
| TW | 202133244 A | 9/2021 |

OTHER PUBLICATIONS

Taiwan Office Action issued in connection with TW Appl. Ser. No. 111111024 dated Jul. 6, 2023.

* cited by examiner

*Primary Examiner* — Theresa T Doan
(74) *Attorney, Agent, or Firm* — FOLEY & LARDNER LLP

(57) ABSTRACT

A semiconductor device includes an active gate metal structure disposed over a substrate, the active gate metal structure having a first sidewall and a second sidewall opposite to each other. The semiconductor device includes a first source/drain region disposed adjacent the first sidewall of the active gate metal structure with a first lateral distance. The semiconductor device includes a second source/drain region disposed adjacent the second sidewall of the active gate metal structure with a second lateral distance, wherein the second lateral distance is substantially greater than the first lateral distance. The semiconductor device includes a resist protective oxide (RPO) comprising a first portion extending over a portion of a major surface of the substrate that is laterally located between the second sidewall and the second source/drain region, wherein the RPO has no portion extending over a top surface of the active gate metal structure.

20 Claims, 53 Drawing Sheets

(51) Int. Cl.
*H01L 29/40* (2006.01)
*H01L 29/66* (2006.01)
*H01L 29/78* (2006.01)
*H01L 29/94* (2006.01)

(52) U.S. Cl.
CPC ........ *H01L 29/0882* (2013.01); *H01L 29/401* (2013.01); *H01L 29/665* (2013.01); *H01L 29/7816* (2013.01); *H01L 29/7835* (2013.01); *H01L 29/66575* (2013.01)

(58) Field of Classification Search
CPC ............... H01L 29/665; H01L 29/7816; H01L 29/7835; H01L 29/66575; H01L 29/495; H01L 29/402; H01L 29/1045; H01L 29/4966; H01L 29/517; H01L 29/0653; H01L 29/66659
USPC ........................................................ 257/336
See application file for complete search history.

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/257,875, filed Oct. 20, 2021, entitled "FABRICATION OF RESIST PROTECTION OXIDE LAYER ON LATERAL-DIFFUSED METAL OXIDE SEMICONDUCTOR DEVICE," which is incorporated herein by reference in its entirety for all purposes.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-10 nanometer or angstrom node). As semiconductor devices are scaled down, new techniques are needed to maintain the electronic components' performance from one generation to the next. For example, low gate-to-drain capacitance and high breakdown voltage of transistors are desirable for high power applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
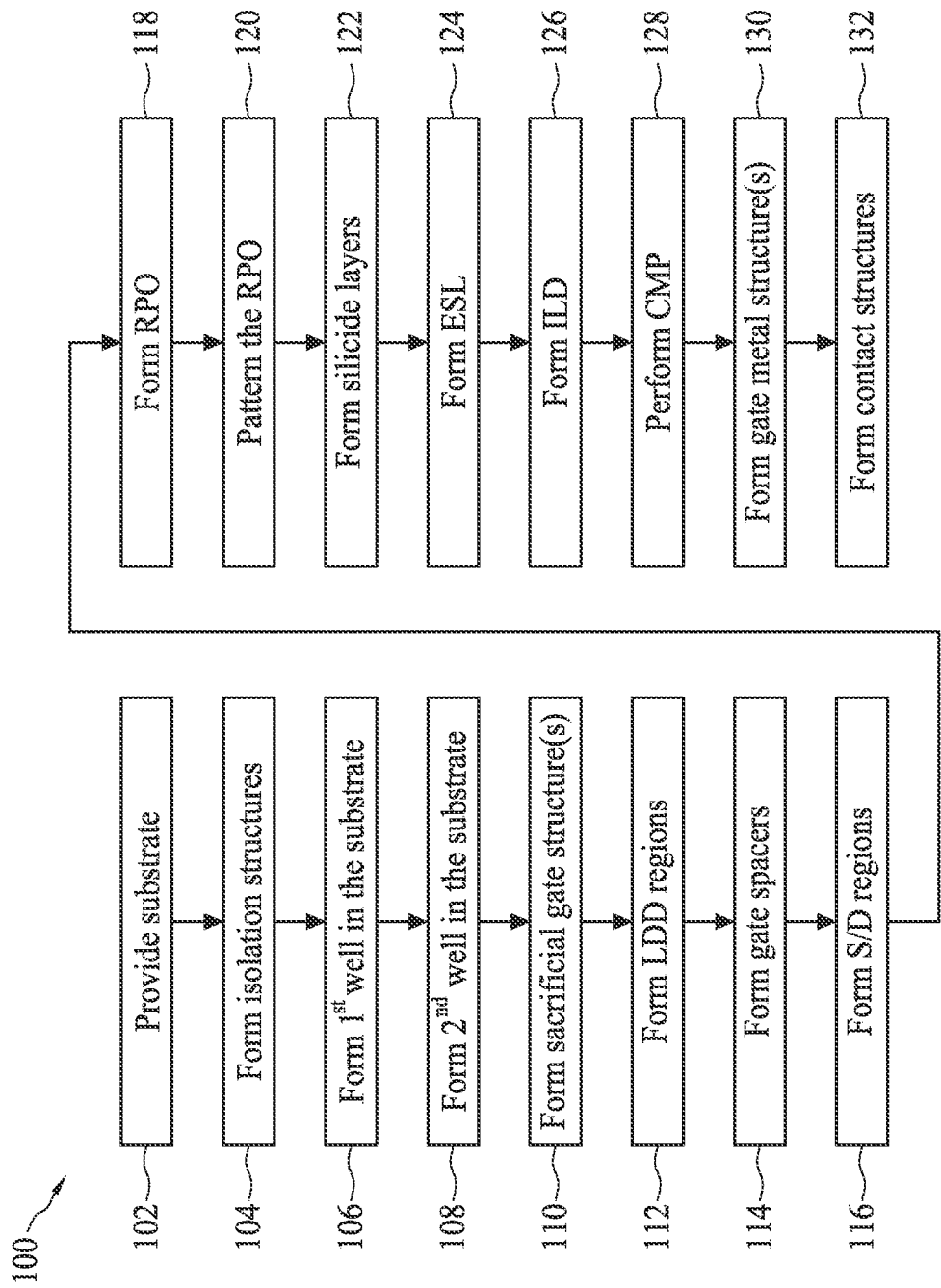
FIG. 1 is an example flow chart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technologies evolve, metal oxide semiconductor field effect transistors (MOSFET) have been widely used in today's integrated circuits. MOSFETs are voltage controlled device. When a control voltage is applied to the gate a MOSFET and the control voltage is greater than the threshold of the MOSFET, a conductive channel is built between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; and the other is p-channel MOSFETs. According to the structure difference, MOSFETs can be further divided into three sub-categories, planar MOSFETs, laterally diffused MOS (LDMOS) FETs and vertically diffused MOSFETs. In comparison with other MOSFETs, the LDMOS is capable of delivering more current per unit area because its asymmetric structure provides a short channel between the drain and the source of the LDMOS. Such an LDMOS can typically operate under a relatively high voltage, which makes it become an attractive power device for use in radio frequency (RF) power applications (e.g., cellular infrastructure power amplifier applications).

To effectively and massively produce such a power device, the LDMOS is generally fabricated with the contemporary CMOS-based technologies. Stated another way, a number of process steps to fabricate logic transistors (which typically operate under a relatively low voltage) can be shared to fabricate the LDMOS. For example, both of the logic transistor and LDMOS have their gate structures formed based on a metal gate replacement process. To fabricate the LDMOS with a gate metal structure, at least one polishing process (e.g., a chemical-mechanical polishing (CMP) process) shall generally be performed prior to performing the metal gate replacement process. In the existing technologies, however, such a polishing process can become increasingly challenging as the process node continues to shrink, which can in turn fail the metal gate replacement process.

For example, when forming source/drain regions (or structures) for the LDMOS, a dielectric protection layer is typically formed over the workpiece to cover one or more areas where a silicide layer is not desired to be formed. Such a silicide layer is formed over the source/drain region to reduce its corresponding contact resistance. The area with no silicide layer formed is typically referred to as a drift region of the LDMOS, where a corresponding resistance (sometimes referred to as a "drift resistance") is intentionally optimized to be large enough thereby allowing the LDMOS to tolerate a relatively high operation voltage (e.g., applied on its drain region). In the existing technologies, generally, the dielectric protection layer laterally extends over a poly gate structure (e.g., overlaying a portion of a top surface of the poly gate structure) that is to be replaced with a gate metal structure. With this lateral overlap on top of the poly gate structure, a hump can be formed around an upper corner of the poly gate structure, a height of which can be further increased with one or more layers (e.g., an etch stop layer) deposited thereon. The hump can hamper the following CMP process (as, e.g., blocked by the humped etch stop layer), which in turn fails the following metal gate replacement process. Thus, the existing LDMOS and methods for forming the same have not been entirely satisfactory in many aspects.

The present disclosure provides various embodiments of methods to fabricate semiconductor devices in the context of forming a power device. For example, the methods as disclosed herein can be used to make a laterally diffused metal-oxide-semiconductor (LDMOS) transistor. In some embodiments, the disclosed methods include patterning a dielectric layer configured to cover one or more areas where a silicide layer is not to be formed, such that the patterned dielectric layer does not extend over the top surface of an sacrificial gate structure (e.g., a poly gate structure) which is later to be replaced with a new gate structure (e.g., a gate metal structure). The LDMOS transistor, fabricated by the disclosed methods, can be immune from suffering from the "hump" issues as commonly seen in the existing technologies. For example, without any portion of the dielectric layer overlaying the top surface of the sacrificial gate structure, any later deposited layer (e.g., an etch stop layer) should not be raised with an abnormal height. Stated another way, a hump of the etch stop layer should not be present in the LDMOS transistor fabricated based on the disclosed methods. Consequently, the following CMP process should not be interfered by any hump structure and can successfully expose the sacrificial gate structure, which allows sacrificial gate structure to be replaced with the new gate structure.

FIG. 1 illustrates a flowchart of an example method 100 for forming at least a portion of a semiconductor device 200, in accordance with some embodiments. It should be noted that the method 100 is merely an example, and is not intended to limit the present disclosure. Accordingly, it is understood that the order of operation of the method 100 of FIG. 1 can change, that additional operations may be provided before, during, and after the method 100 of FIG. 1, and that some other operations may only be described briefly herein. In some embodiments, operations of the method 100 may be associated with cross-sectional views of the example semiconductor device 200 at various fabrication stages as shown in FIGS. 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, and 53, respectively.

Figure 2:
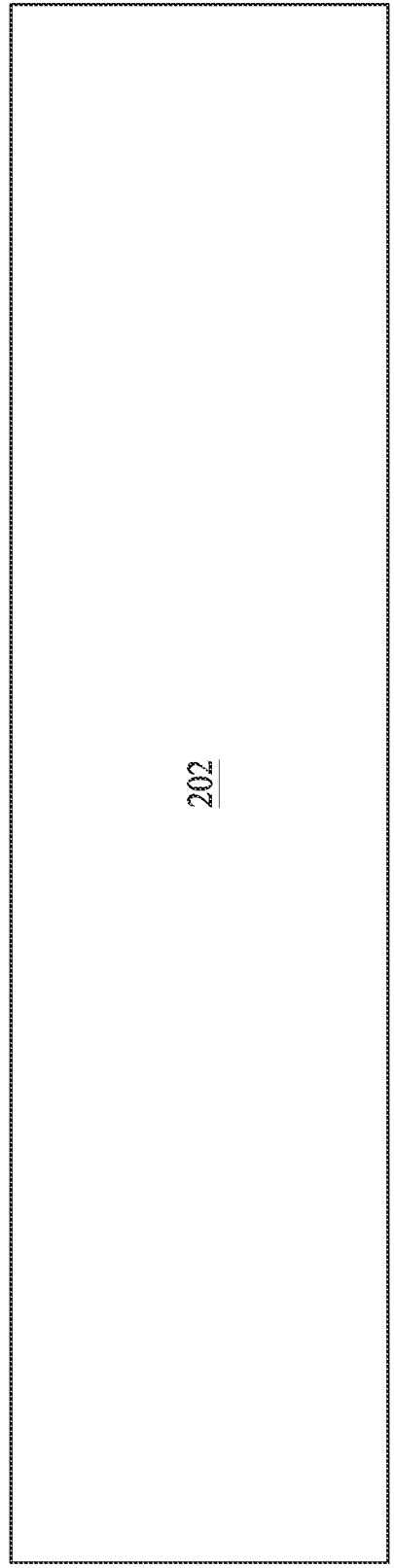
FIGS. 2, 3, 4, 5, 6, 7, 8, 9, 10, 11, 12, 13, 14, 15, 16, 17, 18, 19, 20, 21, 22, 23, 24, 25, 52, and 53 illustrate respective cross-sectional views of a number of example embodiments of a semiconductor device during various fabrication stages, made by the method of FIG. 1, in accordance with some embodiments.
Figure 53:
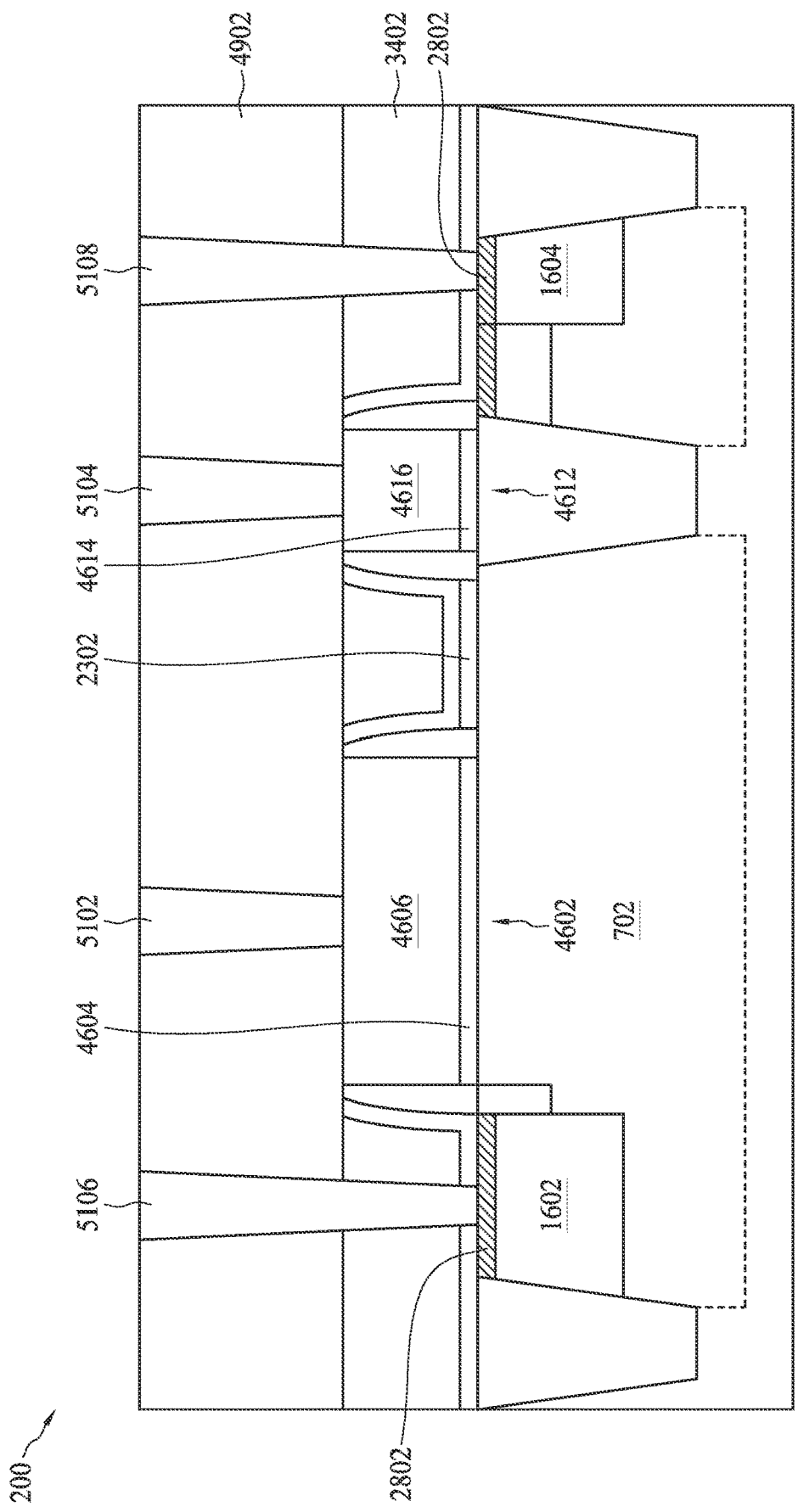

Further, the semiconductor device 200 shown in FIGS. 2-53 can include one or more transistors formed in a first area of a substrate that operate under a relatively high drain voltage (e.g., about 5-6V). These transistors are sometimes referred to as high-voltage transistors (e.g., LDMOS transistors). It should be appreciated that at least some of the operations of the method 100 of FIG. 1 can be shared (e.g., concurrently performed) to form one or more transistors in a second area of the same substrate that operate under a relatively low gate and/or drain voltage. These transistors are sometimes referred to as low-voltage or middle-voltage transistors (e.g., logic transistors). Each of the high-voltage, middle-voltage, and low-voltage transistors has a conduction type such as, for example an n-type transistor or a p-type transistor. The term "n-type," as used herein, may be referred to as the conduction type of a transistor having electrons as its conduction carriers; and the term "p-type," as used herein, may be referred to as the conduction type of a transistor having holes as its conduction carriers.

In a brief overview, the method 100 starts with the operation 102 of providing a substrate. The method 100 continues to operation 104 of forming a number of isolation structures. The method 100 continues to operation 106 of forming a first well in the substrate. The method 100 continues to operation 108 of forming a second well in the substrate. The method 100 continues to operation 110 of forming a number of sacrificial gate structures. The method 100 continues to operation 112 of forming lightly doped drain regions. The method 100 continues to operation 114 of forming gate spacers. The method 100 continues to operation 116 of forming source/drain regions. The method 100 continues to operation 118 of forming a resist protective oxide (RPO). The method 100 continues to operation 120 of patterning the RPO. The method 100 continues to operation 122 of forming silicide layers. The method 100 continues to operation 124 of forming an etch stop layer. The method 100 continues to operation 126 of forming an interlayer dielectric. The method 100 continues to operation 128 of performing a polishing or planarization process. The method 100 continues to operation 130 of forming a number of gate metal structures. The method 100 continues to operation 132 of forming a number of contact structures.

Corresponding to operation 102 of FIG. 1, FIG. 2 is a cross-sectional view of the semiconductor device 200 including a substrate 202, in accordance with various embodiments. As mention above, the substrate 202 may have a first area and a second area, where one or more high-voltage transistors and low/middle-voltage transistors are formed, respectively. The cross-sectional views of FIG. 2 (and the following figures) are directed to the first area of the substrate 202.

The substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In various embodiments, the substrate 202 may include a buried layer such as an n-type buried layer (NBL), a p-type buried layer (PBL), and/or a buried dielectric layer including a buried oxide (BOX) layer.

In the following examples where an n-type high-voltage transistor is formed, the substrate 202 includes a p-type silicon substrate (p-substrate) 202. To form complementary transistors, an n-type buried layer, sometimes referred to as a deep n-well (DNW), may be implanted deeply in the p-substrate (e.g., under an active region of the n-type high-voltage transistor) for forming a p-type high-voltage transistor in addition to the n-type transistor.

Figure 3:
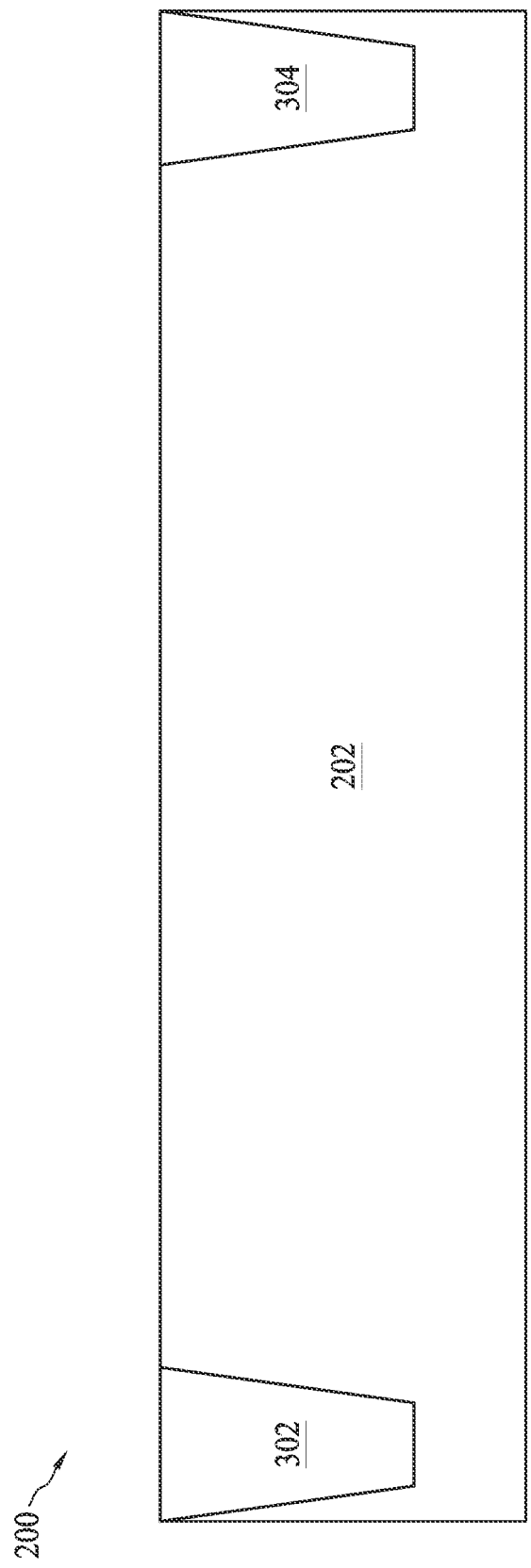
Figure 4:
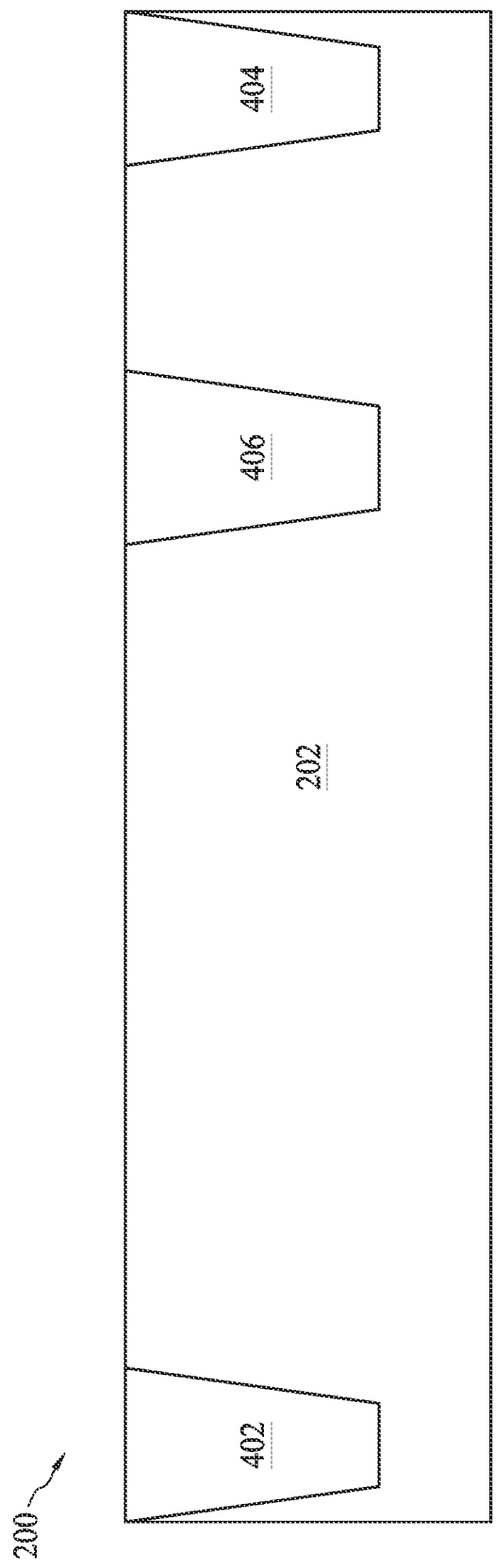

Corresponding to operation 104 of FIG. 1, FIG. 3 is a cross-sectional view of a first embodiment of the semiconductor device 200 including a number of isolation structures 302 and 304. Corresponding to the same operation, FIG. 4 is a cross-sectional view of a second embodiment of the semiconductor device 200 including a number of isolation structures 402, 404, and 406.

The isolation structures 302-304 and 402-406 such as a shallow trench isolation (STI) or local oxidation of silicon (LOCOS) may be formed in the substrate 202 to define and electrically isolate various active regions. Accordingly, the isolation structures 302-304 and 402-406 may sometimes be referred to as STIs 302-304 and 402-406, respectively. For example, the STIs 302 and 304 can be formed to define an area of the substrate 202 such as to isolate device(s) formed therein. The STIs 402 and 404 may be formed for the similar purposes. Additionally, the STI 406, laterally disposed between the STIs 402 and 404, may be optionally formed to extend the drift region of a high-voltage transistor formed within the area defined by the STIs 402 and 404.

As one example, the formation of an STI (e.g., 302-304 and 402-406) may include dry etching a trench in a substrate (e.g., 202) and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 5:
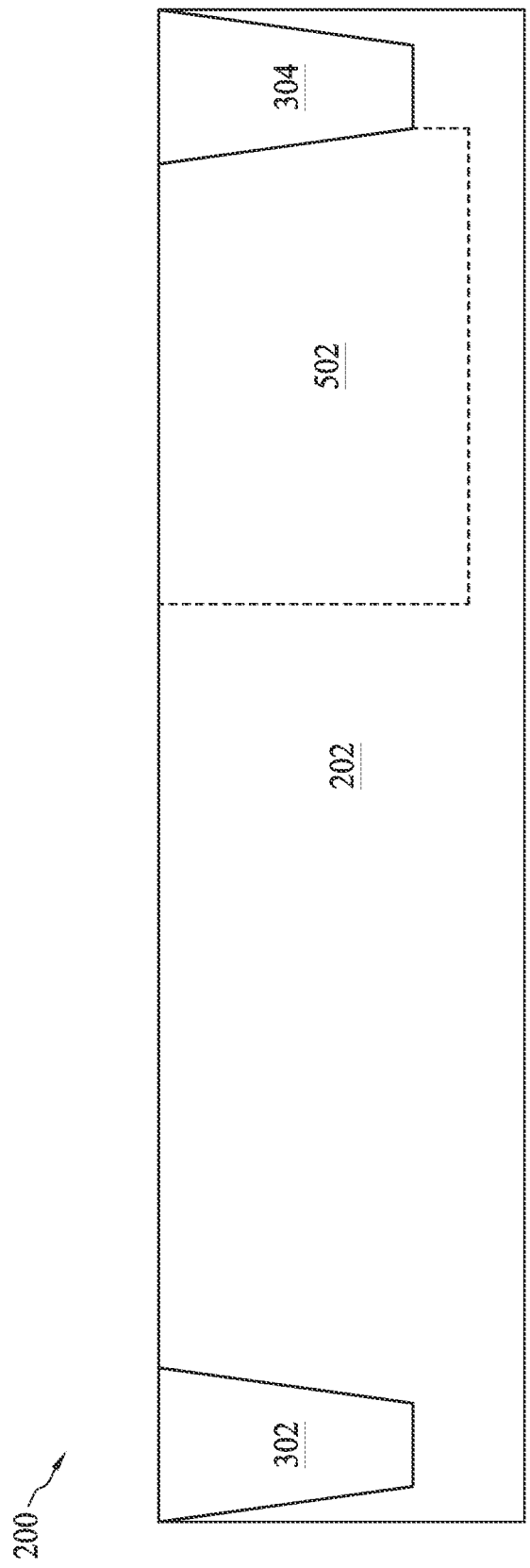
Figure 6:
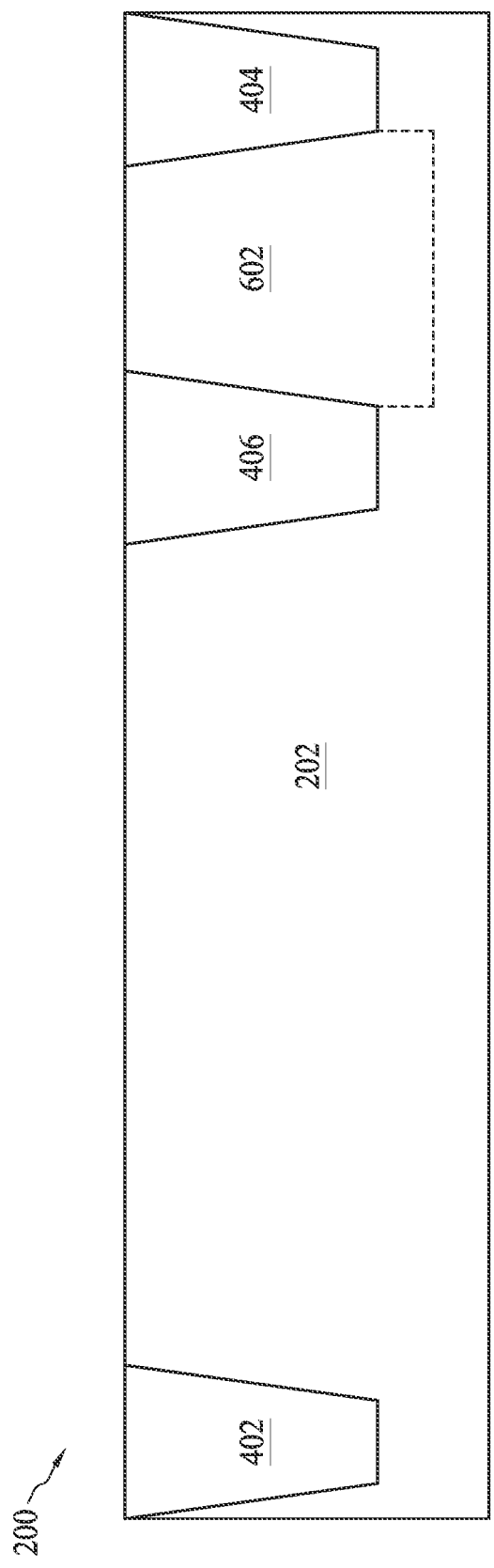

Corresponding to operation 106 of FIG. 1, FIG. 5 is a cross-sectional view of the first embodiment of the semiconductor device 200 including a first well 502 in the substrate 202, in which the isolation structures 302 and 304 (FIG. 3) have been formed. Corresponding to the same operation, FIG. 6 is a cross-sectional view of the second embodiment of the semiconductor device 200 including a first well 602 in the substrate 202, in which the isolation structures 402 to 406 (FIG. 4) have been formed.

The first wells 502 and 602 each have a first type of conductivity. For example, the first type of conductivity is an n-type, which causes the first well to sometimes be referred to as an N-well (NW). In the illustrated example of FIG. 5, such an N-well 502 may be formed in the p-substrate 202 next to one of the STIs, e.g., 304. In the illustrated example of FIG. 6, such an N-well 602 may be formed in the p-substrate 202 between two of the STIs, e.g., 404 and 406. The N-well 502/602 may sometimes be referred to as an extended drain or drain extension well.

Figure 7:
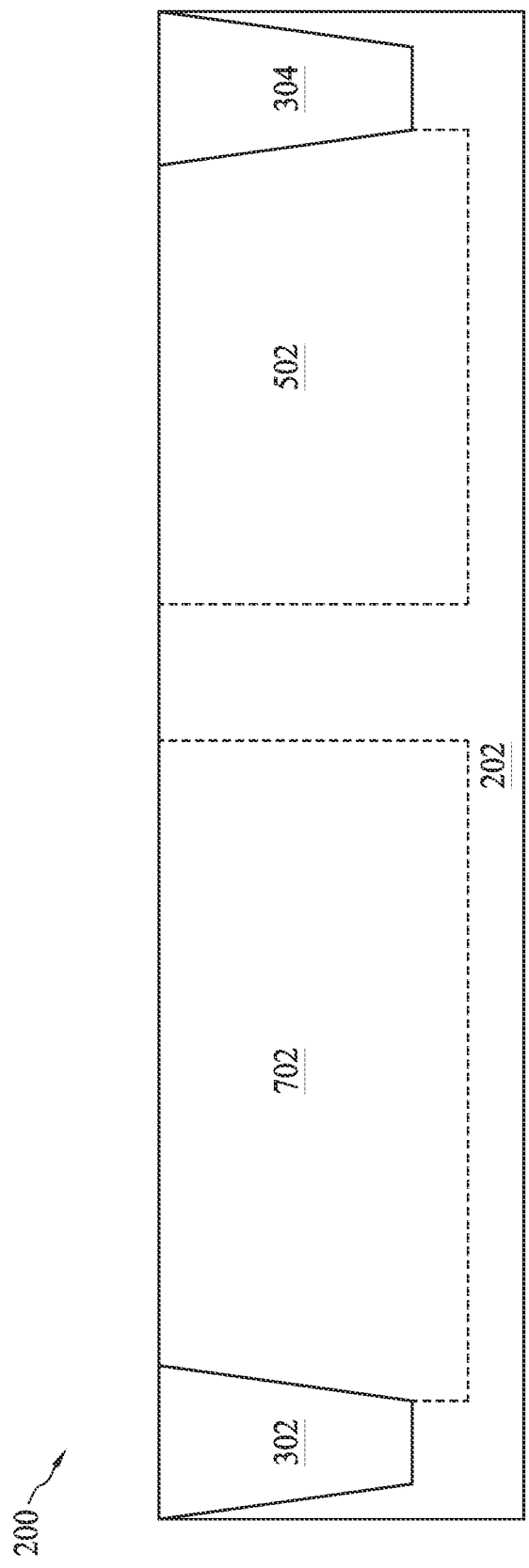
Figure 8:
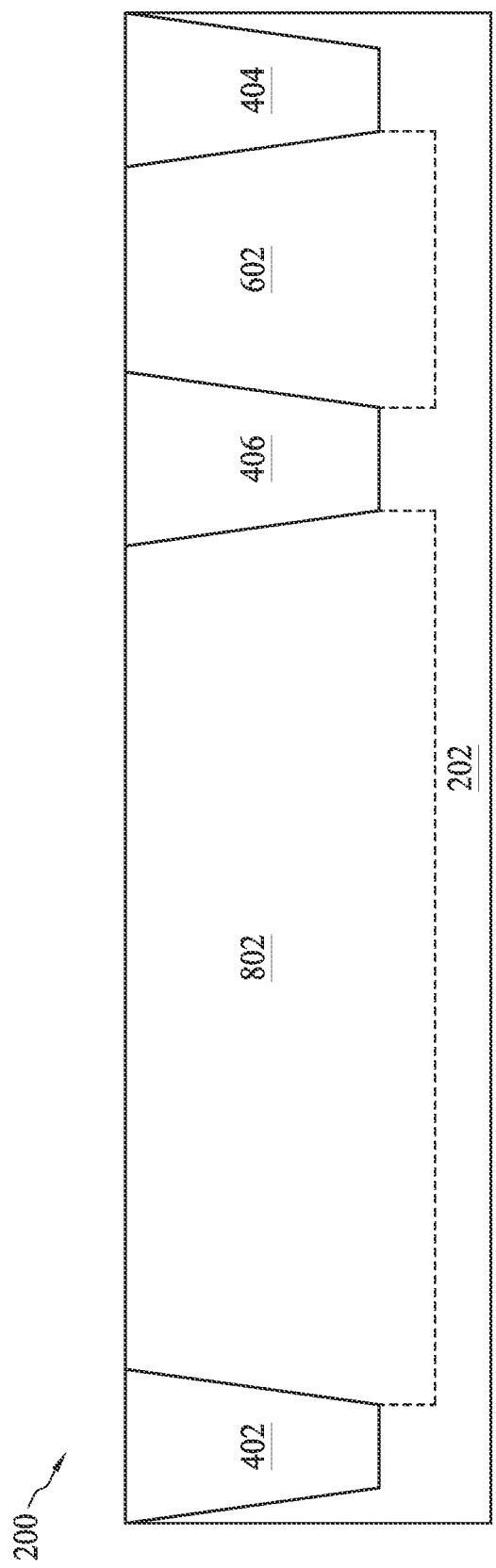

Corresponding to operation 108 of FIG. 1, FIG. 7 is a cross-sectional view of the first embodiment of the semiconductor device 200 including a second well 702 in the substrate 202, in which the first well 502 (FIG. 5) has been formed. Corresponding to the same operation, FIG. 8 is a cross-sectional view of the second embodiment of the semiconductor device 200 including a second well 802 in the substrate 202, in which the first well 602 (FIG. 6) has been formed.

The second wells 702 and 802 each have a second type of conductivity. For example, the second type of conductivity is a p-type, which causes the second well to sometimes be referred to as a P-well (PW). In the illustrated example of FIG. 7, such a P-well 702 may be formed in the p-substrate 202 next to the other of the STIs, e.g., 302. In the illustrated example of FIG. 8, such a P-well 802 may be formed in the p-substrate 202 between two of the STIs, e.g., 402 and 404.

The N-well and the P-well, as disclosed herein, may be a portion of the substrate 202, and may formed by various ion implantation processes. Alternatively, the N-well and the P-well may be portions of an epitaxy layer such as a silicon epitaxy layer formed by epitaxy processing. The N-well may have an n-type dopant such as phosphorus, and the P-well may have a p-type dopant such as boron. In one embodiment, the N-well and P-well may be formed by a plurality of processing steps, whether now known or to be developed, such as growing a sacrificial oxide on substrate, opening a pattern for the location(s) of the P-well regions or N-well region, and implanting the impurities.

Figure 9:
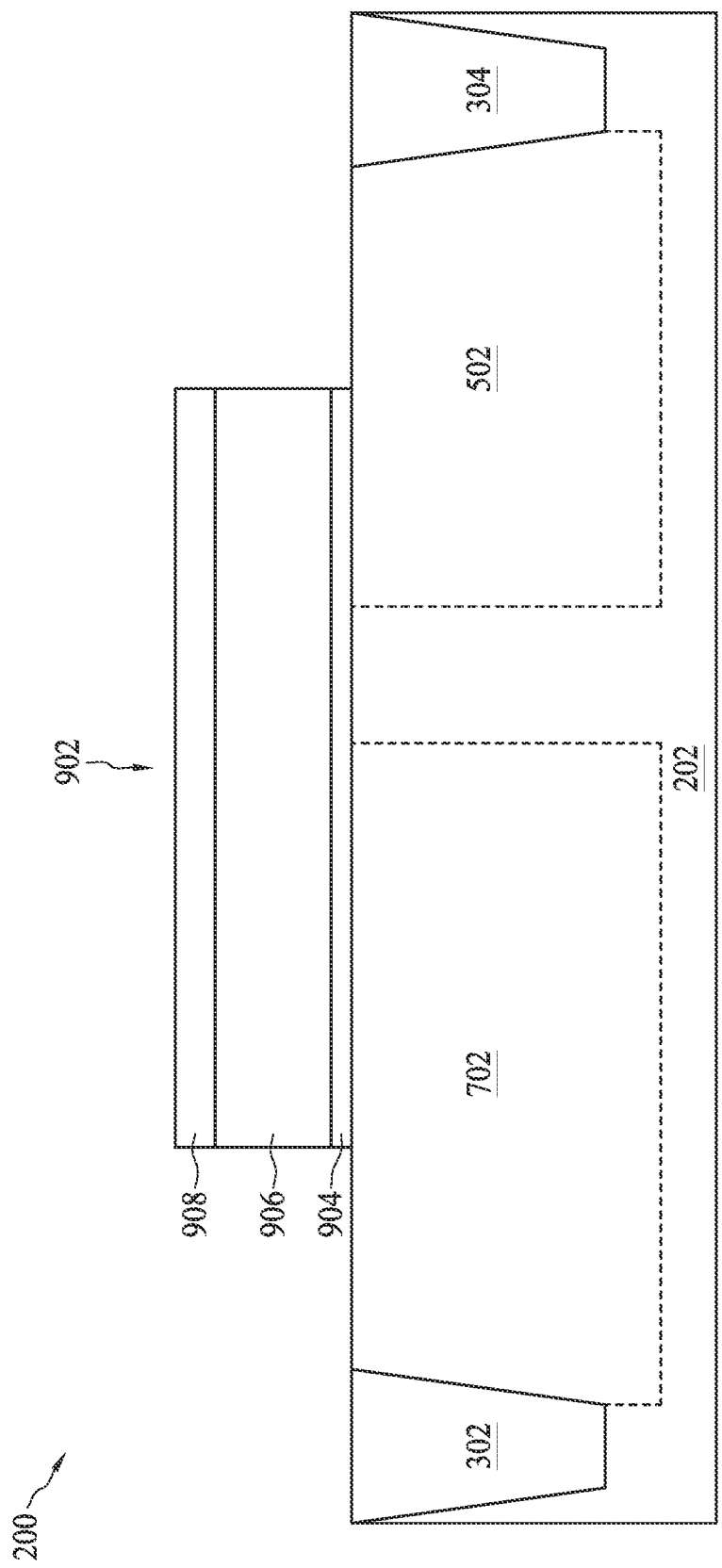
Figure 10:
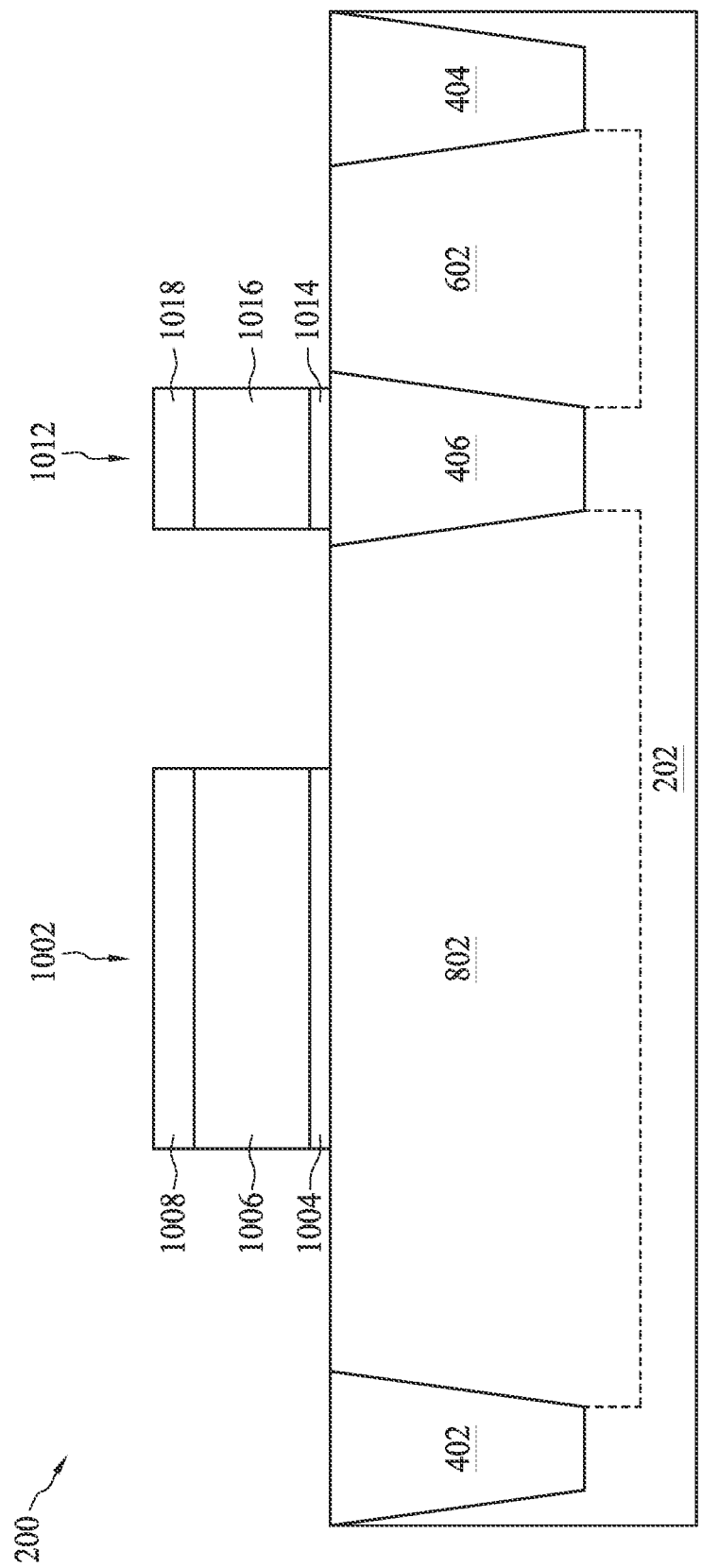

Corresponding to operation 110 of FIG. 1, FIG. 9 is a cross-sectional view of the first embodiment of the first semiconductor device 200 including an sacrificial gate structure 902 over the substrate 202, in which the second well 702 (FIG. 7) has been formed. Corresponding to the same operation, FIG. 10 is a cross-sectional view of the second embodiment of the semiconductor device 200 including sacrificial gate structures 1002 and 1004 over the substrate 202, in which the second well 802 (FIG. 8) has been formed.

The sacrificial gate structures 902, 1002, and 1012 are each formed to define the footprint of a gate metal structure. As shown in the example of FIG. 9, the sacrificial gate structure 902 has a first portion overlying the first well 502 and a second portion overlying the second well 702. In the example of FIG. 10, the sacrificial gate structure 1002 is disposed within the second well 802, with the sacrificial gate structure 1012 having a majority portion to overlay the STI 406. In some other embodiments, the sacrificial gate structure 1012 may laterally shift to not overlay the STI 406, or to have a first portion overlaying the STI 406 and a second portion overlaying the first well 602.

The sacrificial gate structure 1012 may be formed and processed concurrently with the sacrificial gate structure 1002, which, however, may serve as a dummy gate structure (after being replaced with a gate metal structure). In comparison with the active gate structure replacing the sacrificial gate structure 1002, such a dummy gate structure can function as a field plate, which helps to maintain the breakdown voltage of a formed high-voltage transistor. In addition, by separating the dummy gate structure (currently, the sacrificial gate structure 1012) from the active gate structure (currently, the sacrificial gate structure 1002), the overlap between a gate region and a drain region of the high-voltage transistor is reduced accordingly. Such a small overlap between gate region and drain region helps to reduce the gate-to-drain charge of the high-voltage transistor. Furthermore, the dummy gate structure can be biased by a voltage source. For example, when the high-voltage transistor is a 20V transistor, the bias voltage coupled to the dummy gate structure may be up to 20V. Such a bias voltage helps to reduce the on resistance of the high-voltage transistor.

To form the sacrificial gate structures 902, 1002, and 1012, one or more blanket sacrificial gate dielectric layers and one or more blanket sacrificial gate layers may be sequentially deposited over the substrate 202, followed by deposition of a hard mask layer. Next, the hard mask layer is patterned to define profiles and dimensions of the sacrificial gate structures 902, 1002, and 1012. Accordingly, the pattern of the hard mask layer can be transferred to the blanket sacrificial gate layer(s) and then to the blanket sacrificial gate dielectric layer(s), thereby forming the sacrificial gate structures 902, 1002, and 1012. As such, each of the sacrificial gate structures 902, 1002, and 1012 includes at least one sacrificial gate dielectric layer, at least one sacrificial gate layer over the sacrificial gate dielectric layer(s), and a hard mask layer over the sacrificial gate layer(s). As shown, the sacrificial gate structure 902 includes a sacrificial gate dielectric layer 904, a sacrificial gate layer 906, and a hard mask layer 908; the sacrificial gate structure 1002 includes a sacrificial gate dielectric layer 1004, a sacrificial gate layer 1006, and a hard mask layer 1008; and the sacrificial gate structure 1012 includes a sacrificial gate dielectric layer 1014, a sacrificial gate layer 1016, and a hard mask layer 1018.

The sacrificial gate dielectric layer may include a silicon dioxide (referred to as silicon oxide) layer. Alternatively, the sacrificial gate dielectric layer may optionally include a high-k dielectric material, silicon oxynitride, other suitable materials, or combinations thereof. The high-k dielectric material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The sacrificial gate dielectric layer may have a multilayer structure such as one layer of silicon oxide and another layer of high-k material. The sacrificial gate dielectric layer may have a thickness ranging between about 10 Angstroms (Å) and about 200 Å. The sacrificial gate dielectric layer may be formed using chemical vapor deposition (CVD), physical vapor deposition (PVD), atomic layer deposition (ALD), thermal oxide, other suitable processes, or combinations thereof. The sacrificial gate layer may include a doped or non-doped polycrystalline silicon (or polysilicon), which will be replaced with a metal such as, for example, Al, Cu, W, Ti, Ta, TiN, TaN, NiSi, CoSi, other suitable conductive materials, or combinations thereof. The sacrificial gate layer may be formed by CVD, PVD, ALD, plating, and other proper processes. The sacrificial gate layer may have a multilayer structure and may be formed in a multiple-step process. The hard mask layer may include silicon nitride, silicon oxynitride, silicon carbide, and/or other suitable dielectric materials, and may be formed using a method such as CVD or PVD.

Figure 11:
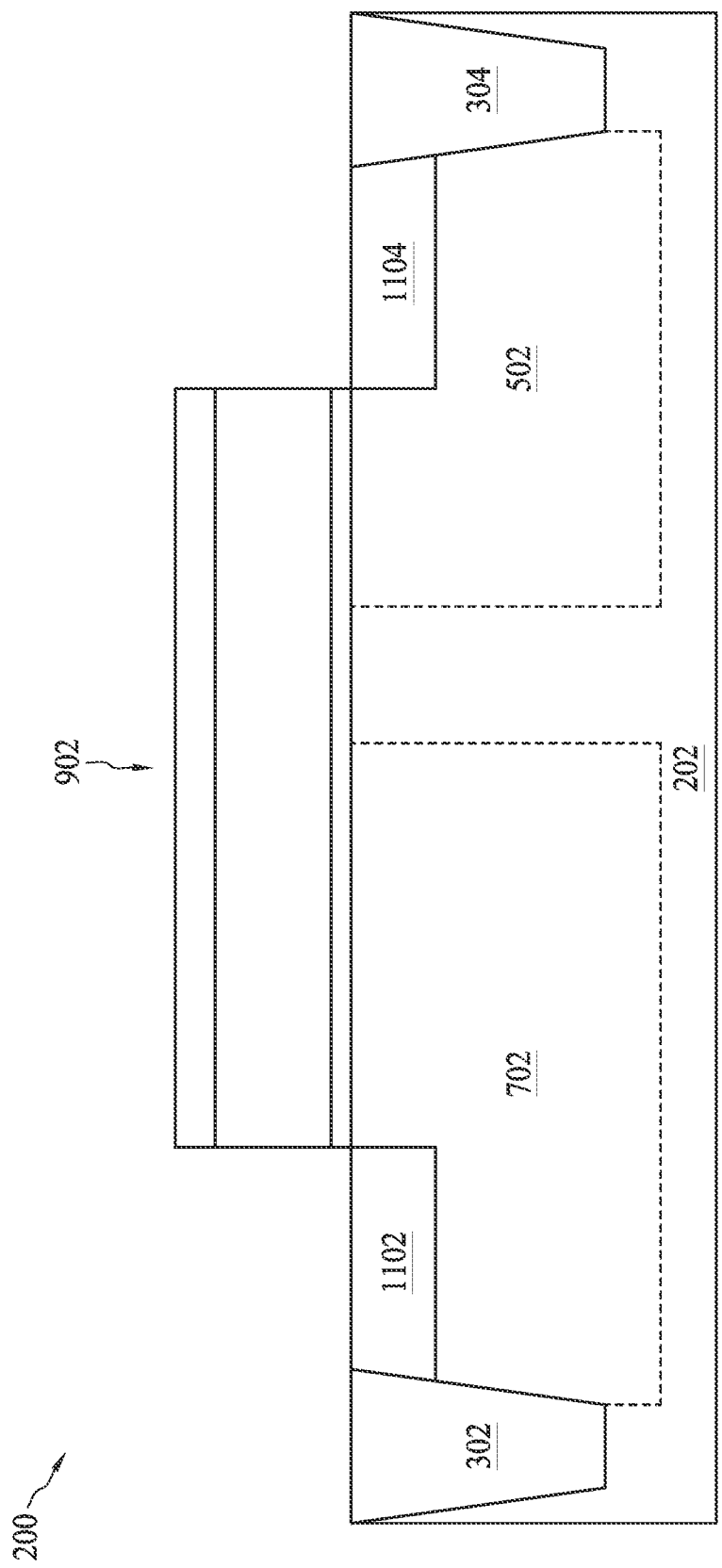
Figure 12:
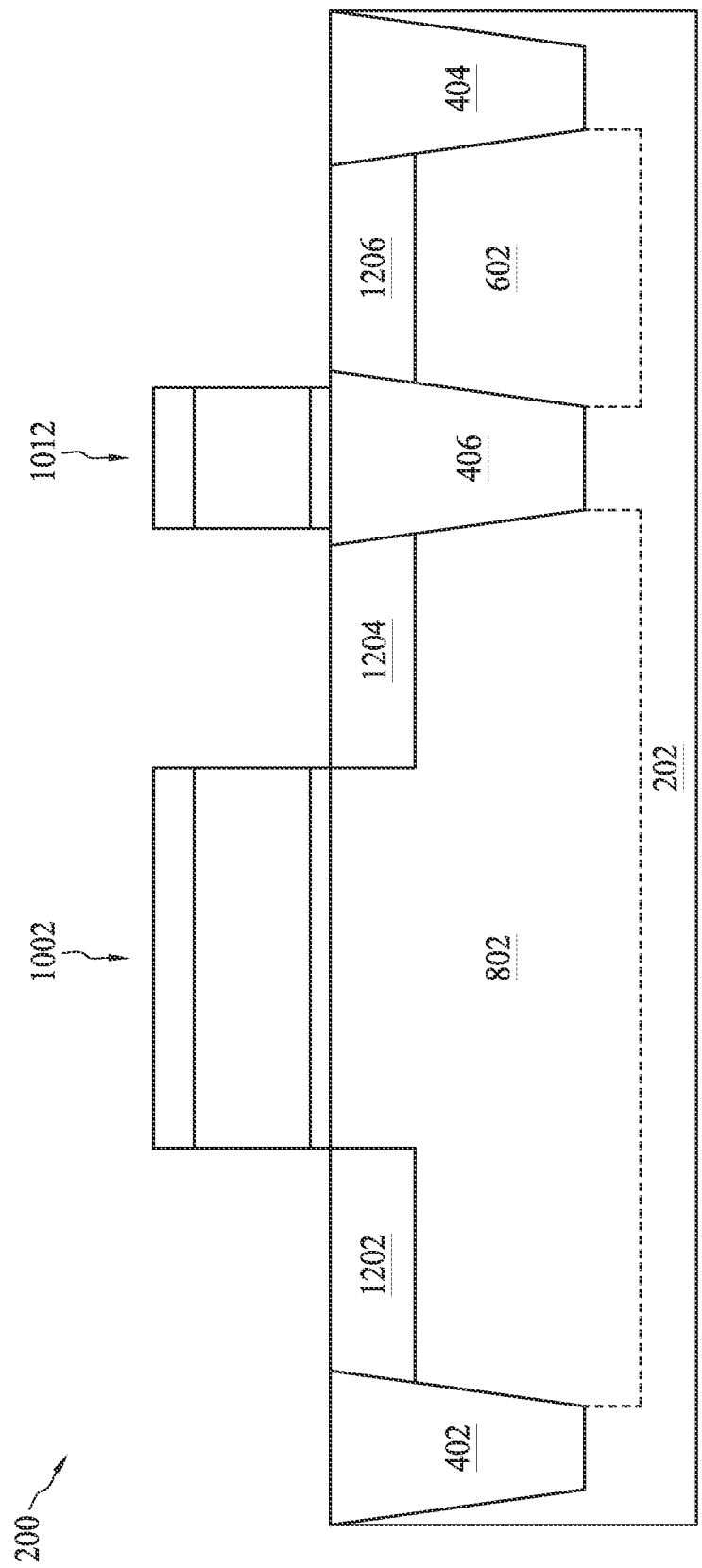

Corresponding to operation 112 of FIG. 1, FIG. 11 is a cross-sectional view of the first embodiment of the semiconductor device 200 including lightly doped drain (LDD) regions 1102 and 1104, in which the sacrificial gate structure 902 (FIG. 9) has been formed. Corresponding to the same operation, FIG. 12 is a cross-sectional view of the second embodiment of the semiconductor device 200 including LDD regions 1202, 1204, and 1206, in which the sacrificial gate structures 1002 and 1004 (FIG. 10) have been formed.

As shown in FIG. 11, the LDD regions 1102 and 1104 are formed in the second well 702 and the first well 502, respectively, and aligned with the sacrificial gate structure 902. The LDD regions 1102 and 1104 are each laterally positioned on a sidewall of the sacrificial gate structure 902, which can be self-aligned to those sidewalls. Similarly, in FIG. 12, the LDD regions 1202-1204 and 1206 are formed in the second well 802 and the first well 602, respectively. And, the LDD regions 1202 to 1206 are (e.g., self) aligned with the sacrificial gate structures 1002 and 1012. In the current example where the to-be-formed high-voltage transistor is configured as an n-type transistor, the LDD regions 1102-1104 and 1202-1206 each have the first type of conductivity (e.g., n-type). For example, the LDD regions 1102-1104 and 1202-1206 may each include n-type dopants such as phosphorus or arsenic. The LDD regions 1102-1104 and 1202-1206 can be formed by a method including ion implantation or diffusion.

Figure 13:
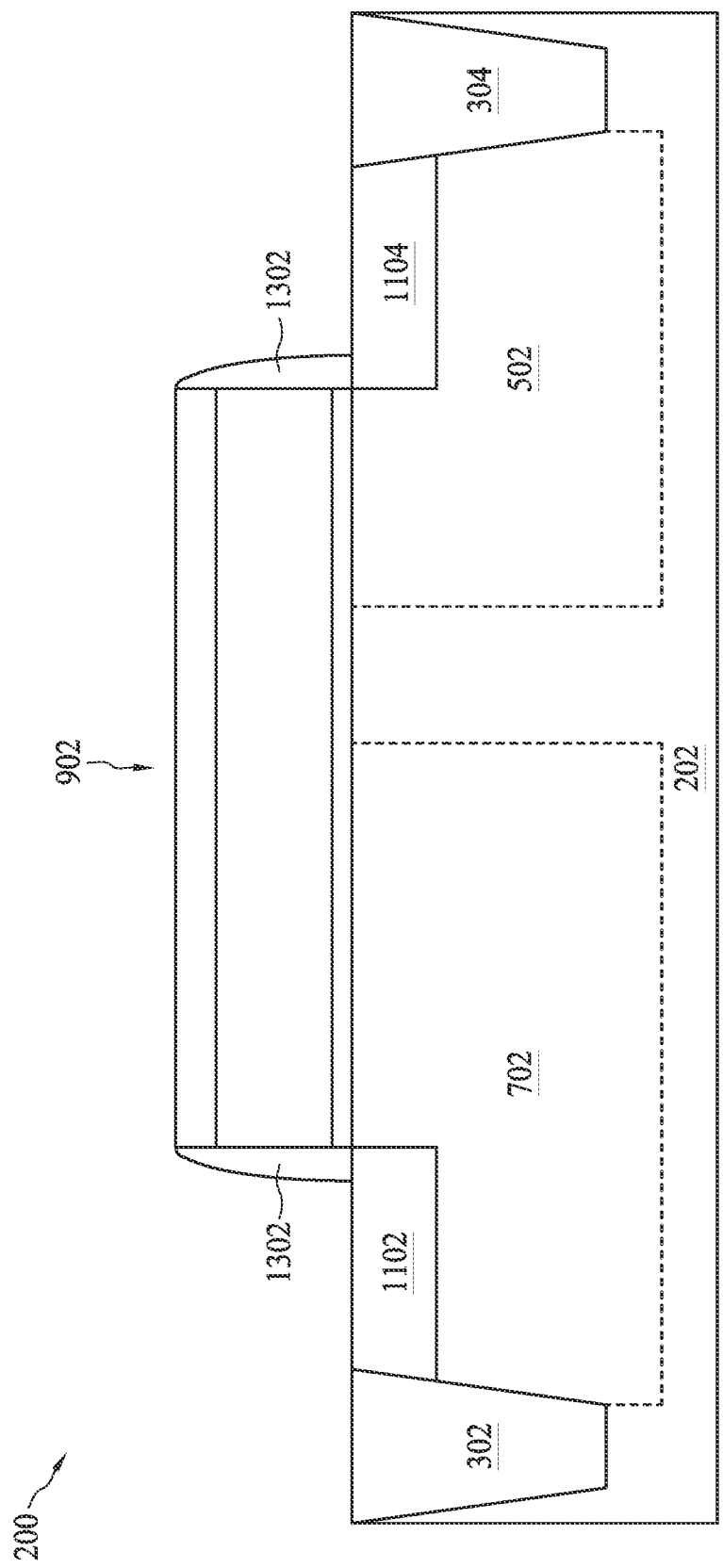

Corresponding to operation 114 of FIG. 1, FIG. 13 is a cross-sectional view of the first embodiment of the semiconductor device 200 including gate spacers 1302 disposed along opposite sidewalls of the sacrificial gate structure 902 (FIG. 9). Corresponding to the same operation, FIG. 14 is a cross-sectional view of the second embodiment of the semiconductor device 200 including gate spacers 1402 disposed along opposite sidewalls of the sacrificial gate structure 1002 and gate spacers 1412 disposed along opposite sidewalls of the sacrificial gate structure 1004 (FIG. 12).

Figure 14:
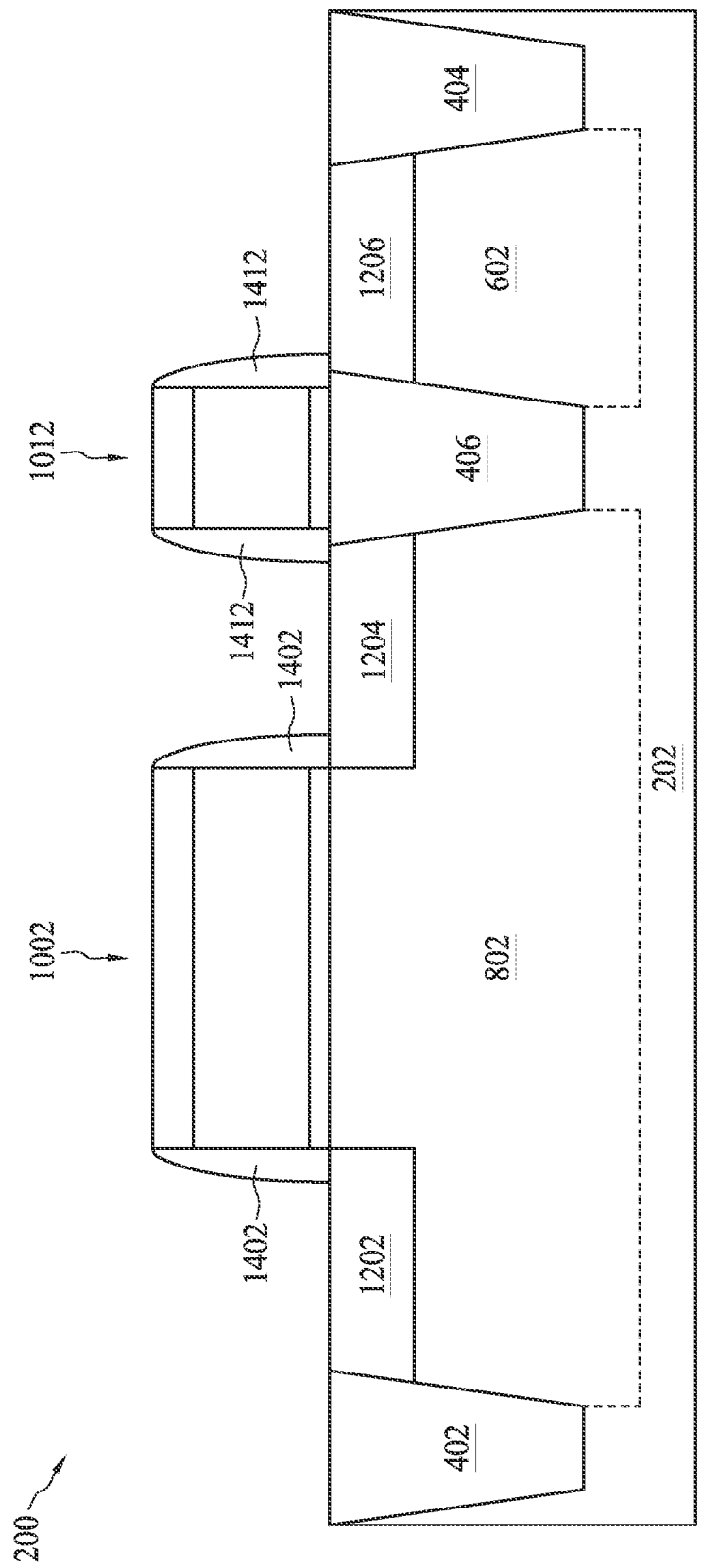

As shown in FIGS. 13 and 14, respectively, the gate spacers 1302 may be formed to extend along sidewalls of the sacrificial gate structure 902 (together with the corresponding hard mask layer); the gate spacers 1402 may be formed to extend along sidewalls of the sacrificial gate structure 1002 (together with the corresponding hard mask layer); and the gate spacers 1412 may be formed to extend along sidewalls of the sacrificial gate structure 1012 (together with the corresponding hard mask layer). Accordingly, the gate spacer may sometimes be referred to as a sidewall spacer. The gate spacers 1302, 1402, and 1412 may each include a dielectric material such as, for example, silicon oxide. Alternatively, the gate spacers 1302, 1402, and 1412 may each optionally include silicon nitride, silicon carbide, silicon oxynitride, or combinations thereof. Although the gate spacers are each shown having a single layer in the illustrated examples of FIGS. 13 and 14, it should be understood that the gate spacers 1302, 1402, and 1412 may each be implemented as a multilayer structure, while remaining within the scope of the present disclosure. The gate spacers 1302, 1402, and 1412 may be formed by a deposition and etching (anisotropic etching technique).

Figure 15:
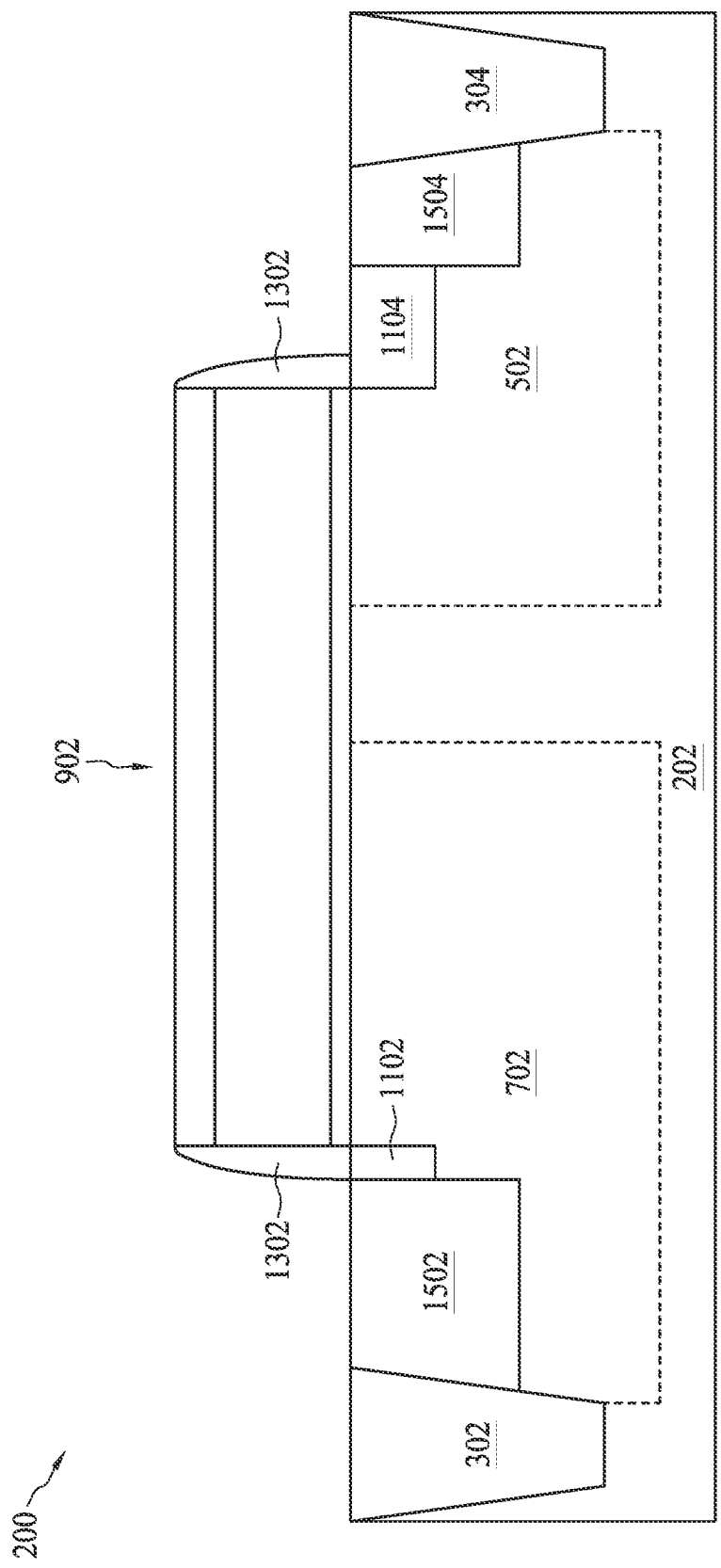

Corresponding to operation 116 of FIG. 1, FIG. 15 is a cross-sectional view of the first embodiment of the semiconductor device 200 including a source region 1502 and a drain region 1504 formed in the second well 702 and first well 502, respectively, (FIG. 13). Corresponding to the same operation, FIG. 16 is a cross-sectional view of the second embodiment of the semiconductor device 200 including a source region 1602 and a drain region 1604 formed in the second well 802 and first well 602, respectively, (FIG. 14).

In the current example where the to-be-formed transistor is configured in n-type, the source/drain regions 1502-1504 and 1602-1604 may each have the first type of conductivity (e.g., n-type). A source/drain region of an n-type is sometimes referred to as an N+ or a heavily doped region. Accordingly, the source/drain regions 1502-1504 and 1602-1604 each include n-type dopant such as P or As. The source/drain regions 1502-1504 and 1602-1604 may be formed by a method such as ion implantation or diffusion. A rapid thermal annealing (RTA) process may be used to activate the implanted dopant. In various embodiments, the source and drain regions may have different doping profiles formed by multi-process implantation.

In the example of FIG. 15, the source region 1502 and drain region 1504 are positioned on opposite sides of the sacrificial gate structure 902. The source region 1502 may include an edge substantially self-aligned to one of the sidewall spacers 1302. However, the drain region 1504 may include an edge that is laterally spaced from the other of the sidewall spacers 1302 with a certain distance. Accordingly, a patterned photoresist layer may protect a portion of the LDD region 1104 that extends beyond an outer edge (or sidewall) of the other one of the sidewall spacers 1302. In the example of FIG. 16, the source region 1602 is positioned on a first side of the sacrificial gate structure 1002, with the LDD region 1204 positioned on a second side of the sacrificial gate structure 1002. The source region 1602 may include an edge substantially self-aligned to one of the sidewall spacers 1402 on the first side. The drain region 1604 is positioned on a first side of the sacrificial gate structure 1012 opposite to a second side where the LDD region 1204 is formed. Further, the drain region 1604 may include an edge that is laterally spaced from one of the sidewall spacers 1412 on the second side of the sacrificial gate structure 1012 with a certain distance. Accordingly, a patterned photoresist layer may protect the LDD region 1204 and a portion of the LDD region 1106 that extends beyond an outer edge (or sidewall) of the sidewall spacer 1412 on the second side.

Figure 16:
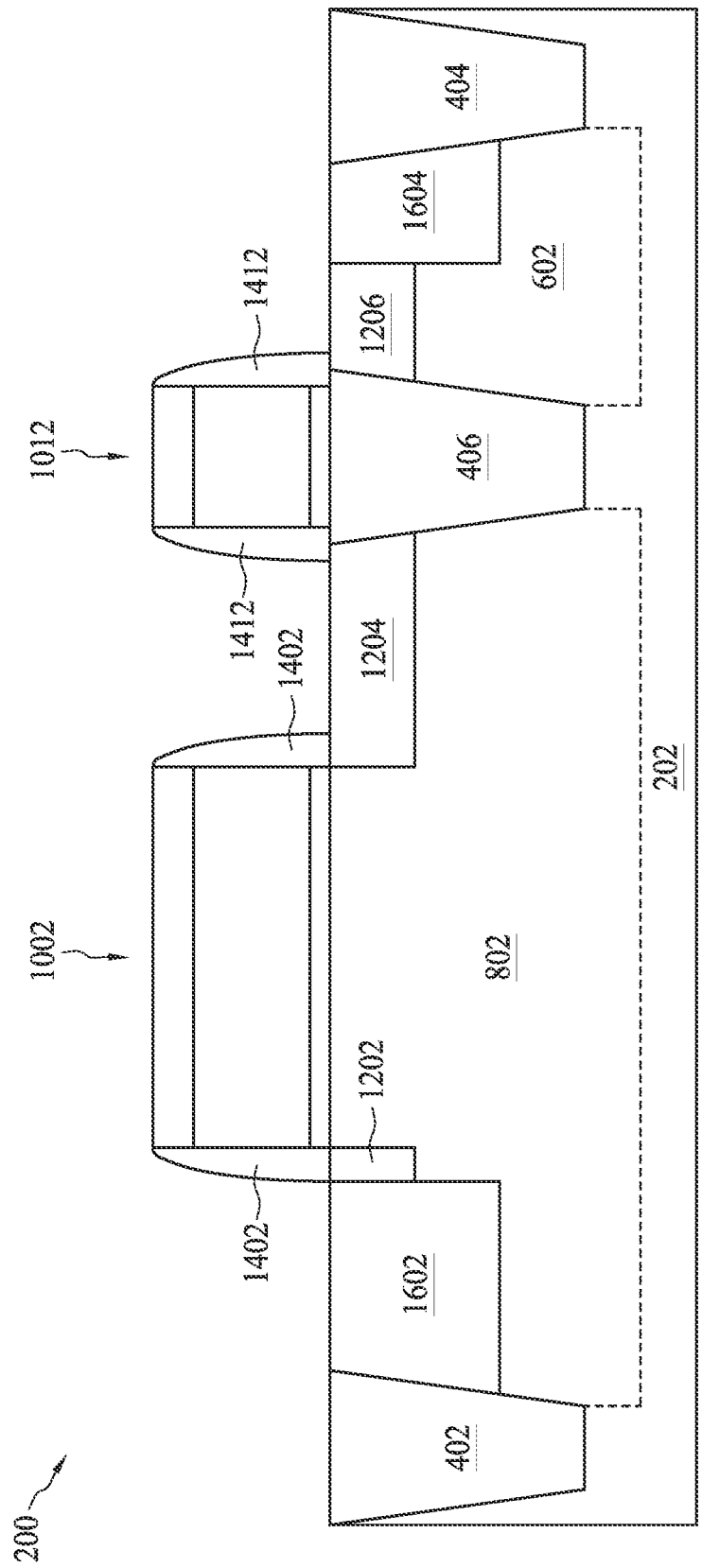

As such, in either of the example of FIG. 15 or 16, the source region and drain region are asymmetrically disposed with respect to a corresponding active gate structure. Stated another way, the source region may be disposed next to a first sidewall spacer of a gate structure, while the drain region may be spaced from a second, opposite sidewall spacer of the gate structure with a distance. This distance, by which the drain region is spaced from a corresponding sidewall spacer, may constitute at least a portion of a drift length of the to-be-formed high-voltage transistor. With adjustment of the drift length, a breakdown voltage of the high-voltage transistor can be optimized accordingly.

Figure 17:
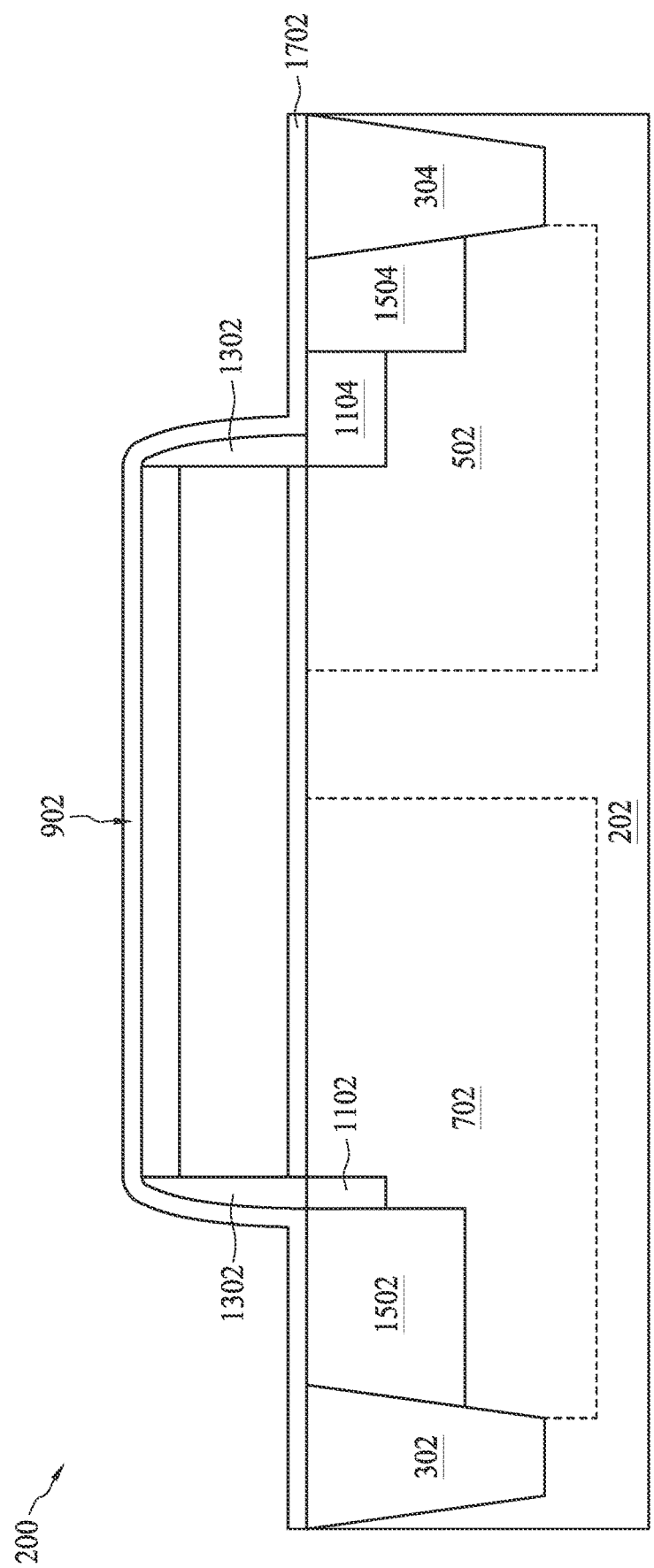
Figure 18:
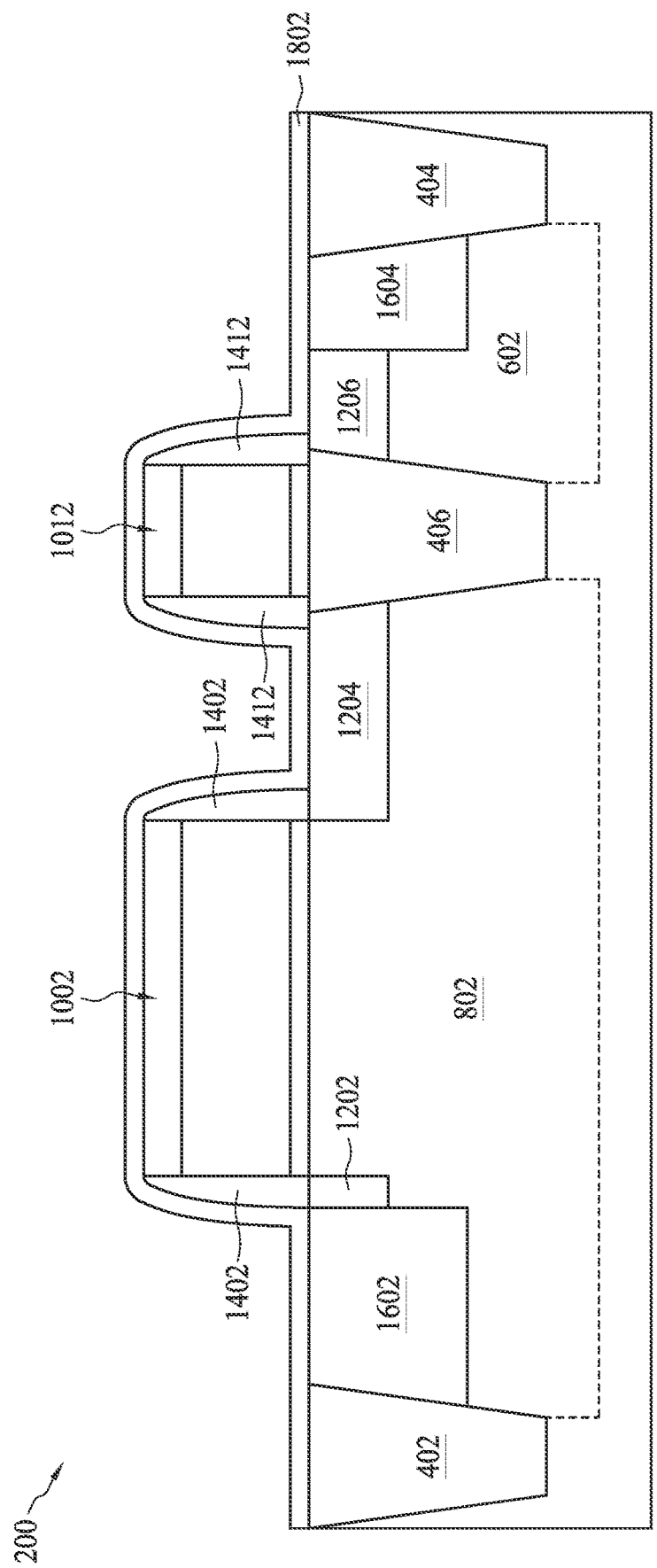

Corresponding to operation 118 of FIG. 1, FIG. 17 is a cross-sectional view of the first embodiment of the semiconductor device 200 including a resist protective oxide (RPO) 1702 formed over the sacrificial gate structure 902 and the substrate 202 (FIG. 15). Corresponding to the same operation, FIG. 18 is a cross-sectional view of the second embodiment of the semiconductor device 200 including an RPO 1802 formed over the sacrificial gate structures 1002 and 1102 and the substrate 202 (FIG. 16). The RPOs 1702 and 1802 may each function as a silicide blocking layer during a subsequent salicide process. The RPOs 1702 and 1802 may each be first formed as a blanket layer. Next, as will be discussed below, the RPOs 1702 and 1802 may each be patterned to have a profile covering one or more portions of the substrate 202 where a silicide layer is not to be formed. The PRO 1702/1802 is generally formed of silicon oxide. In some embodiments, the silicon oxide used to form the PRO 1702/1802 may have a greater porosity than the oxide filled in the STIs (e.g., 302-304, 402-406). Alternatively, the PRO 1702/1802 may include a dielectric material selected from the group consisting of: silicon nitride, silicon oxy-nitride, oxygen-doped silicon nitride, nitrided oxides, and combinations thereof.

Figure 19:
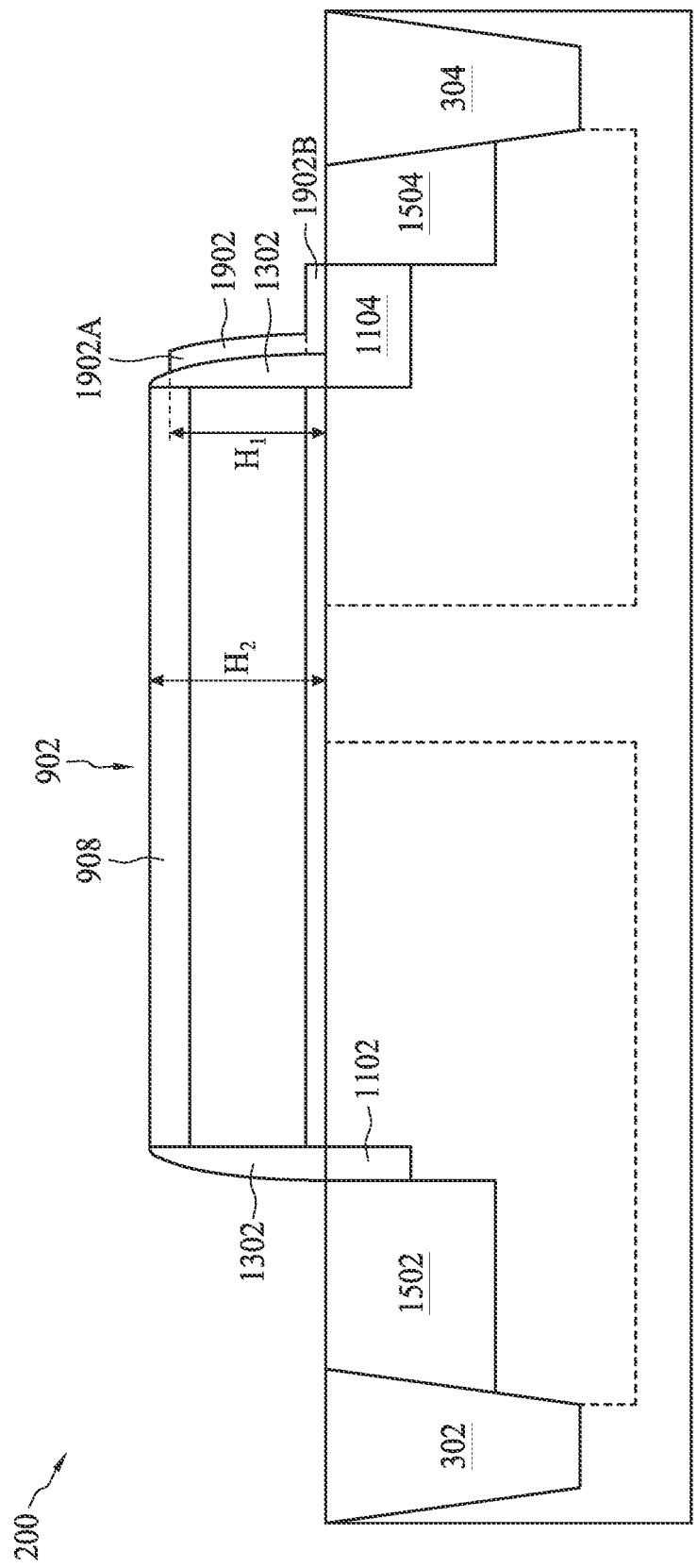
Figure 20:
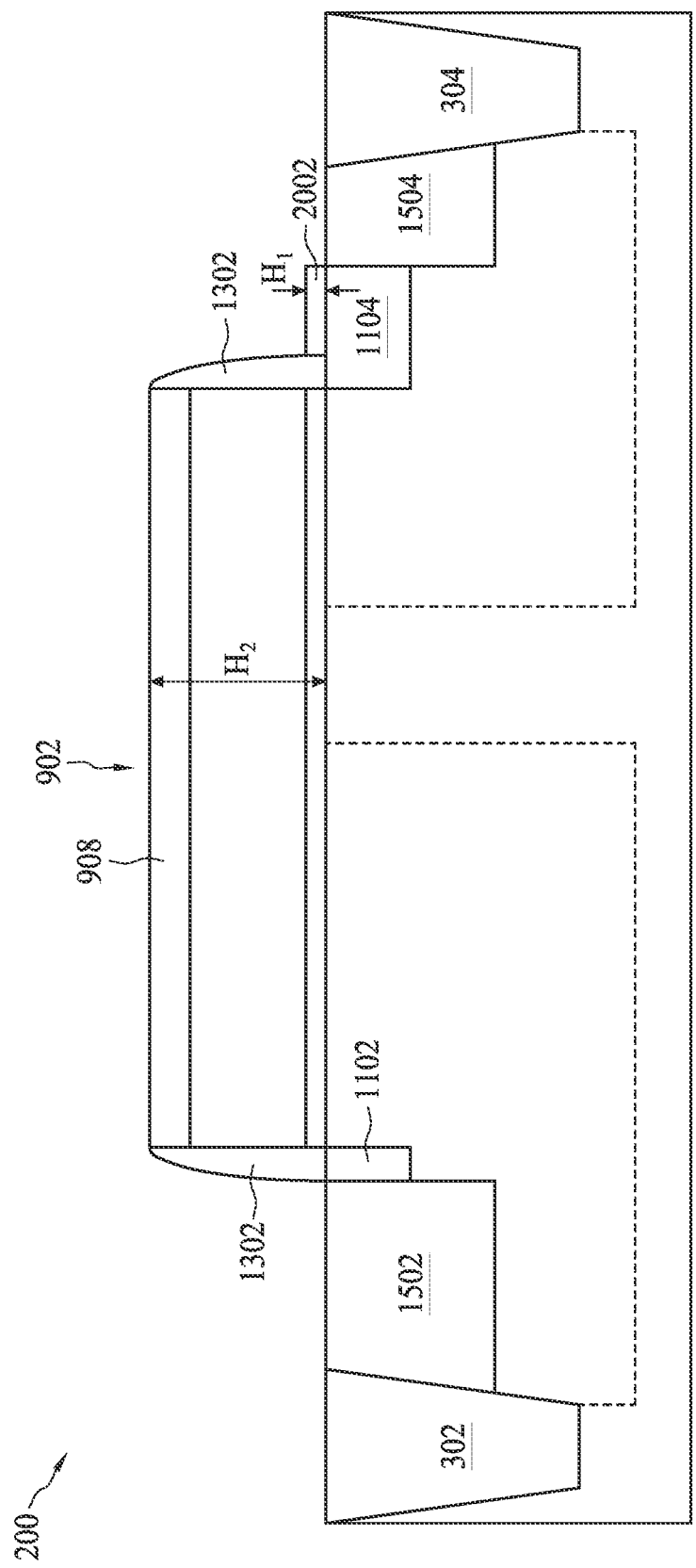
Figure 22:
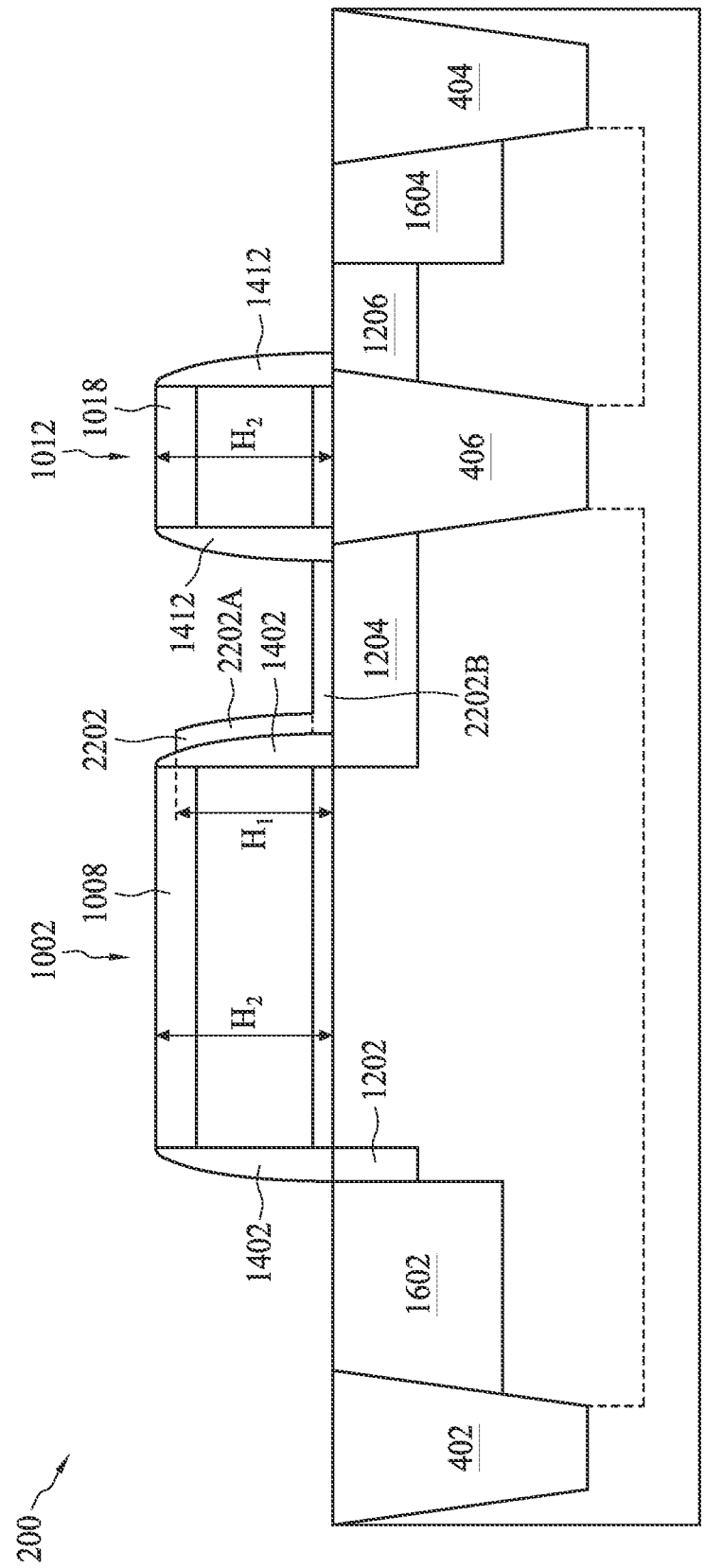
Figure 23:
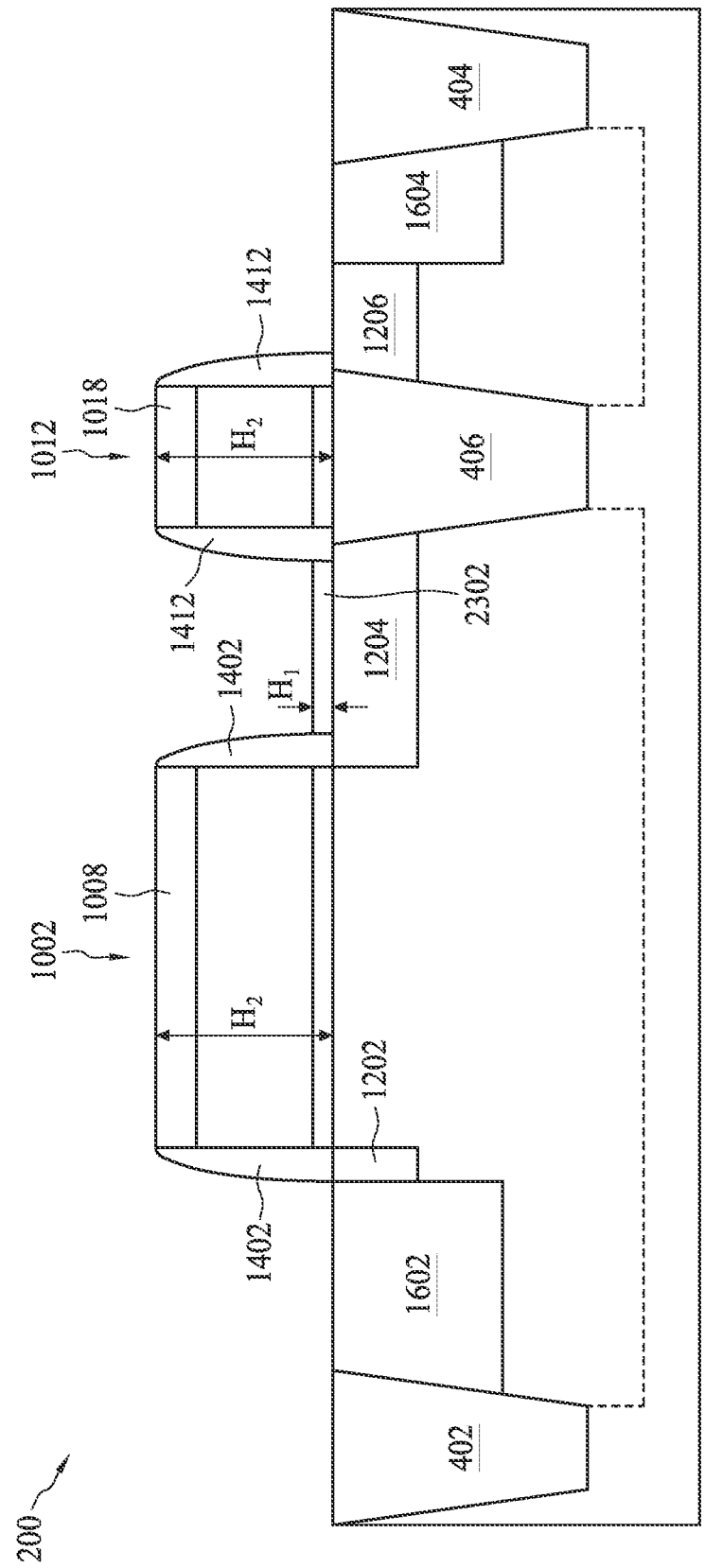

Corresponding to operation 120 of FIG. 1, FIG. 19 is a cross-sectional view of the first embodiment of the semiconductor device 200 in which the RPO 1702 (FIG. 17) is patterned to have a first profile. Corresponding to the same operation, FIG. 20 is a cross-sectional view of the first embodiment of the semiconductor device 200 in which the RPO 1702 (FIG. 17) is patterned to have a second profile. Still corresponding to the same operation, FIGS. 21, 22, and 23 illustrate cross-sectional views of the second embodiment of the semiconductor device 200 in which the RPO 1802 (FIG. 18) is patterned to have a first, second, and third profile, respectively.

Referring first to FIG. 19, the (blanket) RPO 1702 is patterned (hereinafter "patterned RPO 1902") to have the first profile that includes a first portion 1902A and a second portion 1902B. The first portion 1902A vertically extends along a sidewall of one of the gate spacers 1302 (closer to the drain region 1504). The second portion 1902B laterally overlays at least the LDD region 1104. Such a first profile is sometimes be referred to as an "L-shaped" profile. In some embodiments, the second portion 1902B may have an edge aligned with an interface between the LDD region 1104 and drain region 1504. In some other embodiments, the second portion 1902B may have an edge extending beyond the interface between the LDD region 1104 and drain region 1504, i.e., with a portion of the drain region 1504 being overlaid by the second portion 1902B. With the patterned RPO 1902 having the first profile, it can be assured that the LDD region 1104 corresponding to at least a portion of a drift region of the to-be-formed high-voltage transistor can be covered.

Referring next to FIG. 20, the (blanket) RPO 1702 is patterned (hereinafter "patterned RPO 2002") to have the second profile that laterally overlays at least the LDD region 1104. Such a second profile is sometimes be referred to as an "I-shaped" profile. In some embodiments, the patterned RPO 2002 may have an edge aligned with an interface between the LDD region 1104 and drain region 1504. In some other embodiments, the patterned RPO 2002 may have an edge extending beyond the interface between the LDD region 1104 and drain region 1504, i.e., with a portion of the drain region 1504 being overlaid by the patterned RPO 2002. With the patterned RPO 2002 having the second profile, it can be assured that the LDD region 1104 corresponding to at least a portion of a drift region of the to-be-formed high-voltage transistor can be covered.

Figure 21:
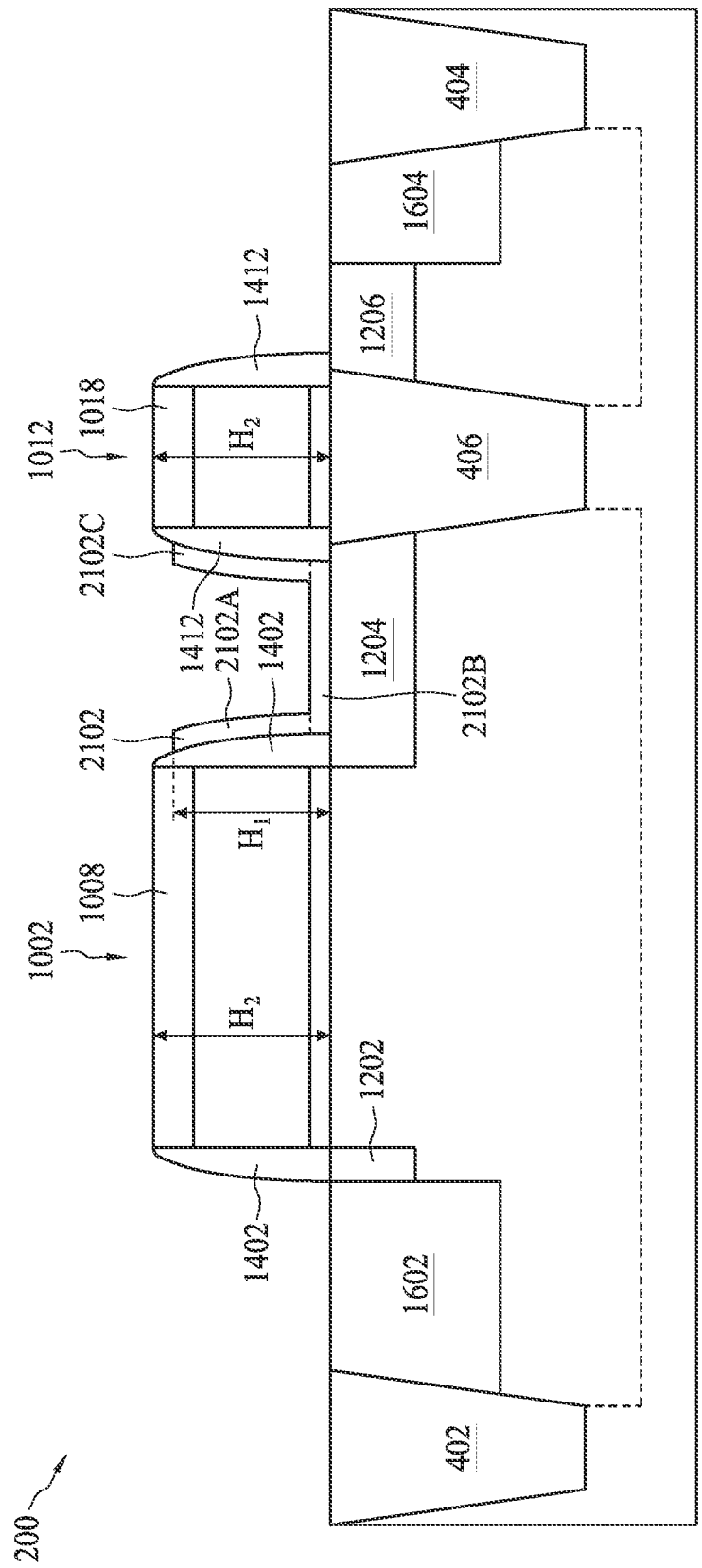

Referring next to FIG. 21, the (blanket) RPO 1802 is patterned (hereinafter "patterned RPO 2102") to have the third profile that includes a first portion 2102A, second portion 2102B, and third portion 2102C. The first portion 2102A vertically extends along a sidewall of one of the gate spacers 1402 (opposite the sacrificial gate structure 1002 from the other gate spacer 1402 adjacent the source region 1602). The second portion 2102B laterally overlays at least the LDD region 1204. The third portion 2102C vertically extends along a sidewall of one of the gate spacers 1412 (opposite the sacrificial gate structure 1012 from the other gate spacer 1412 adjacent the drain region 1604). Such a third profile is sometimes be referred to as a "U-shaped" profile. With the patterned RPO 2102 having the third profile, it can be assured that the LDD region 1204 corresponding to at least a portion of a drift region of the to-be-formed high-voltage transistor can be covered.

Referring next to FIG. 22, the (blanket) RPO 1802 is patterned (hereinafter "patterned RPO 2202") to have the fourth profile that includes a first portion 2202A and a second portion 2202B. The first portion 2202A vertically extends along a sidewall of one of the gate spacers 1402 (opposite the sacrificial gate structure 1002 from the other gate spacer 1402 adjacent the source region 1602). The second portion 2202B laterally overlays at least the LDD region 1204. Such a fourth profile is sometimes be referred to as an "L-shaped" profile. The second portion 2202B has two ends in contact with one of the gate spacers 1402 and one of the gate spacers 1412, respectively, in various embodiments. These two gate spacers 1402 and 1412 face each other, with the LDD region 1204 interposed therebetween. With the patterned RPO 2202 having the fourth profile, it can be assured that the LDD region 1204 corresponding to at least a portion of a drift region of the to-be-formed high-voltage transistor can be covered.

Referring next to FIG. 23, the (blanket) RPO 1802 is patterned (hereinafter "patterned RPO 2302") to have the fifth profile that that laterally overlays at least the LDD region 1204. Such a fifth profile is sometimes be referred to as an "I-shaped" profile. The patterned RPO 2302 has two ends in contact with one of the gate spacers 1402 and one of the gate spacers 1412, respectively, in various embodiments. These two gate spacers 1402 and 1412 face each other, with the LDD region 1204 interposed therebetween. With the patterned RPO 2302 having the fifth profile, it can be assured that the LDD region 1204 corresponding to at least a portion of a drift region of the to-be-formed high-voltage transistor can be covered.

In accordance with various embodiments of the present disclosure, the patterned RPOs 1902, 2002, 2102, 2202, and 2302 may each be formed through at least some of the following processes: forming a patternable photoresist layer over a corresponding blanket RPO (e.g., with one or more portions of the blanket RPO covered by the patternable photoresist layer); performing at least one dry and/or wet etching processes to transfer the pattern of the patternable photoresist layer to the blanket RPO; and removing the patternable photoresist layer.

With the pattern transferred to the blanket RPO, the patterned RPO has no portion extending above a top surface of the adjacent gate structure(s) or a top surface of mask layer(s) respectively disposed thereon. For example, in FIG. 19, the highest point of the patterned RPO 1902 has a height ($H_1$) shorter than a height ($H_2$) of the sacrificial gate structure 902 and its mask layer 908 combined; in FIG. 20, the highest point of the patterned RPO 2002 has a height ($H_1$) shorter than a height ($H_2$) of the sacrificial gate structure 902 and its mask layer 908 combined; in FIG. 21, the highest point of the patterned RPO 2102 has a height ($H_1$) shorter than a height ($H_2$) of the sacrificial gate structures 1002 and 1012 and their respective mask layers, 1008 and 1018, combined; in FIG. 22, the highest point of the patterned RPO 2202 has a height ($H_1$) shorter than a height ($H_2$) of the sacrificial gate structures 1002 and 1012 and their respective mask layers, 1008 and 1018, combined; and in FIG. 23, the highest point of the patterned RPO 2202 has a height ($H_1$) shorter than a height ($H_2$) of the sacrificial gate structures 1002 and 1012 and their respective mask layers, 1008 and 1018, combined.

As a non-limiting example, a hybrid etching process may be used to etch the blanket RPO. First a highly anisotropic (dry) plasma etching process is used to etch most of the blanket RPO that is designed to be removed. A typical process uses gaseous plasma of gases like $CF_4$+$CHF_3$, $C_5F_8$, and/or $C_4F_8$ with additive gases like $N_2$, Ar, and/or $O_2$. The etching reactors used may be parallel plate type with or without enhancement by magnetic fields or electron cyclotron resonance (ECR) type available commercially. After timed plasma etching, the remaining portion of the RPO (designed to be removed) is etched using a wet etching process (e.g., with dilute HF solution and/or an aqueous buffered HF solution) for a relatively short period of time. Plasma etching produces a non-undercut profile with superior dimension control whereas the final brief wet etching process achieves high selectivity to the underlying film.

Figure 24:
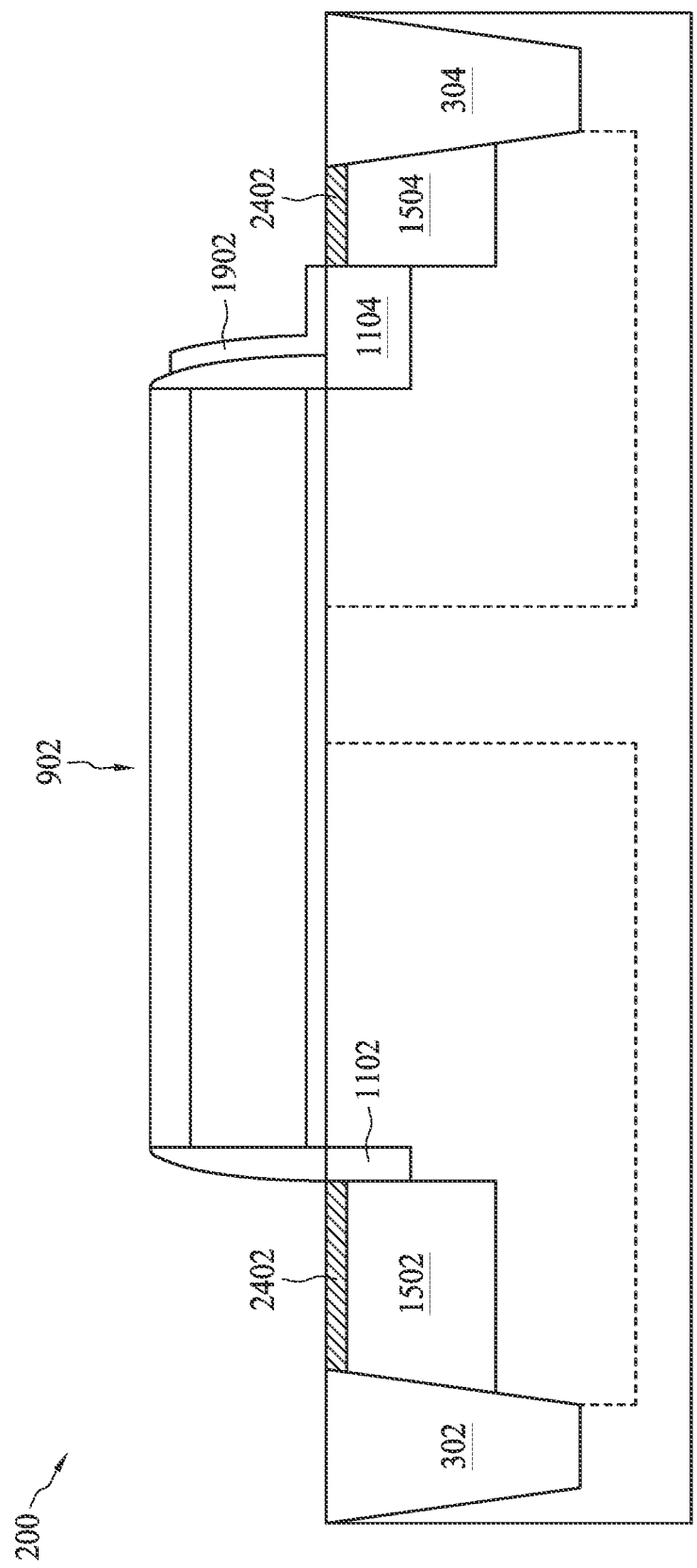
Figure 25:
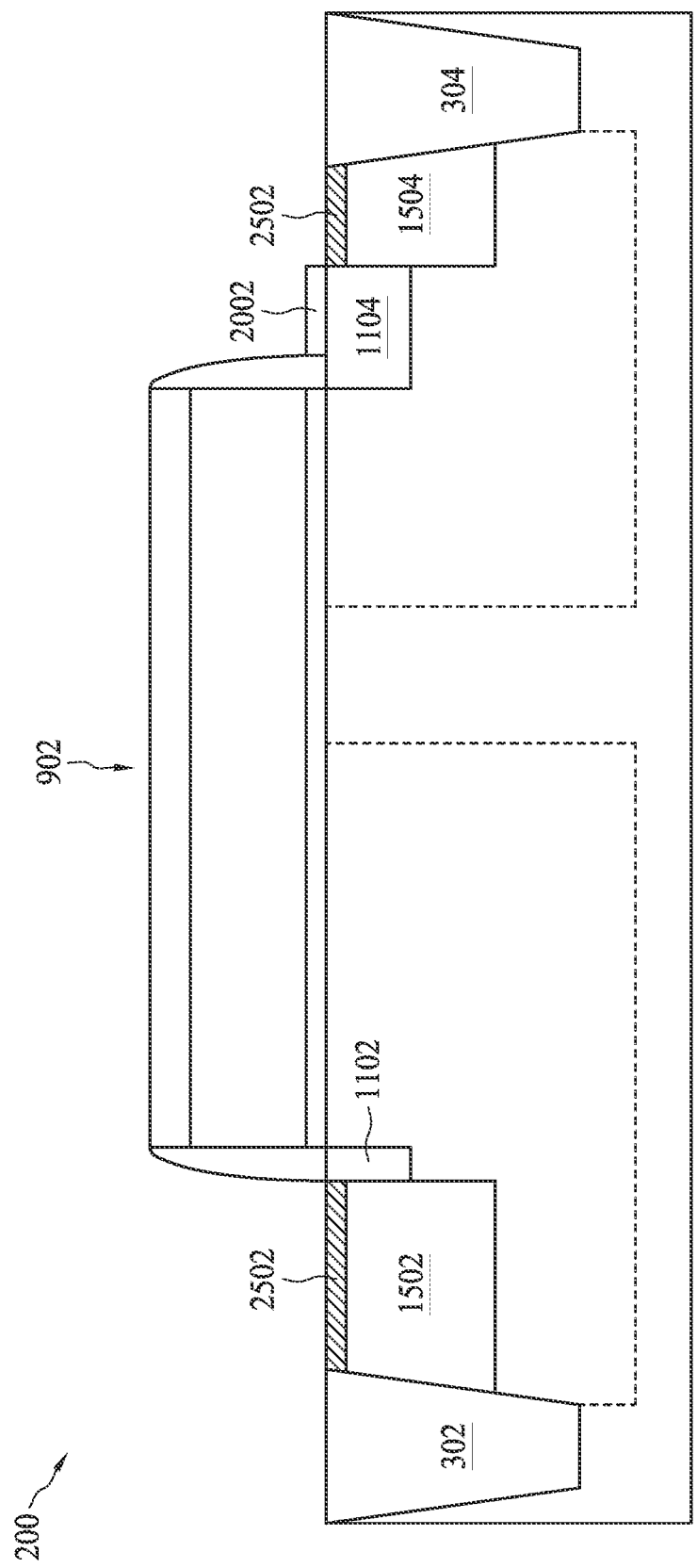

Corresponding to operation 122 of FIG. 1, FIG. 24 is a cross-sectional view of the first embodiment of the semiconductor device 200 including a number of silicide layers 2402 formed according to the patterned RPO 1902. Corresponding to the same operation, FIG. 25 is a cross-sectional view of the first embodiment of the semiconductor device 200 including a number of silicide layers 2502 formed according to the patterned RPO 2002. Still corresponding to the same operation, FIGS. 26, 27, and 28 illustrate cross-sectional views of the second embodiment of the semiconductor device 200 including a number of silicide layers 2602, 2702, and 2802 formed according to the patterned RPOs 2102, 2202, and 2302, respectively.

The silicide layers 2402, 2502, 2602, 2702, and 2802 are each formed by silicidation such as a self-aligned silicide process (sometimes referred to as a salicide process) in which a metal material is formed next to a structure or region containing silicon, then the temperature is raised to anneal and cause reaction between the silicon and the metal to form a silicide layer, and un-reacted metal is etched away. The silicide layer may be self-aligned on various features such as a source region, drain region and/or gate electrode to reduce corresponding contact resistance.

According to various embodiments of the present disclosure, the patterned RPOs 1902, 2002, 2102, 2202, and 2302 are each formed to block a respective portion of the substrate 202 where no silicide layer is desired to be formed (i.e., no salicide process occurs, even having silicon). Such a "blocked" portion may serve as at least a portion of the drift region of the to-be-formed high-voltage transistor, where the corresponding drift resistance is generally desired to remain relatively high.

Figure 26:
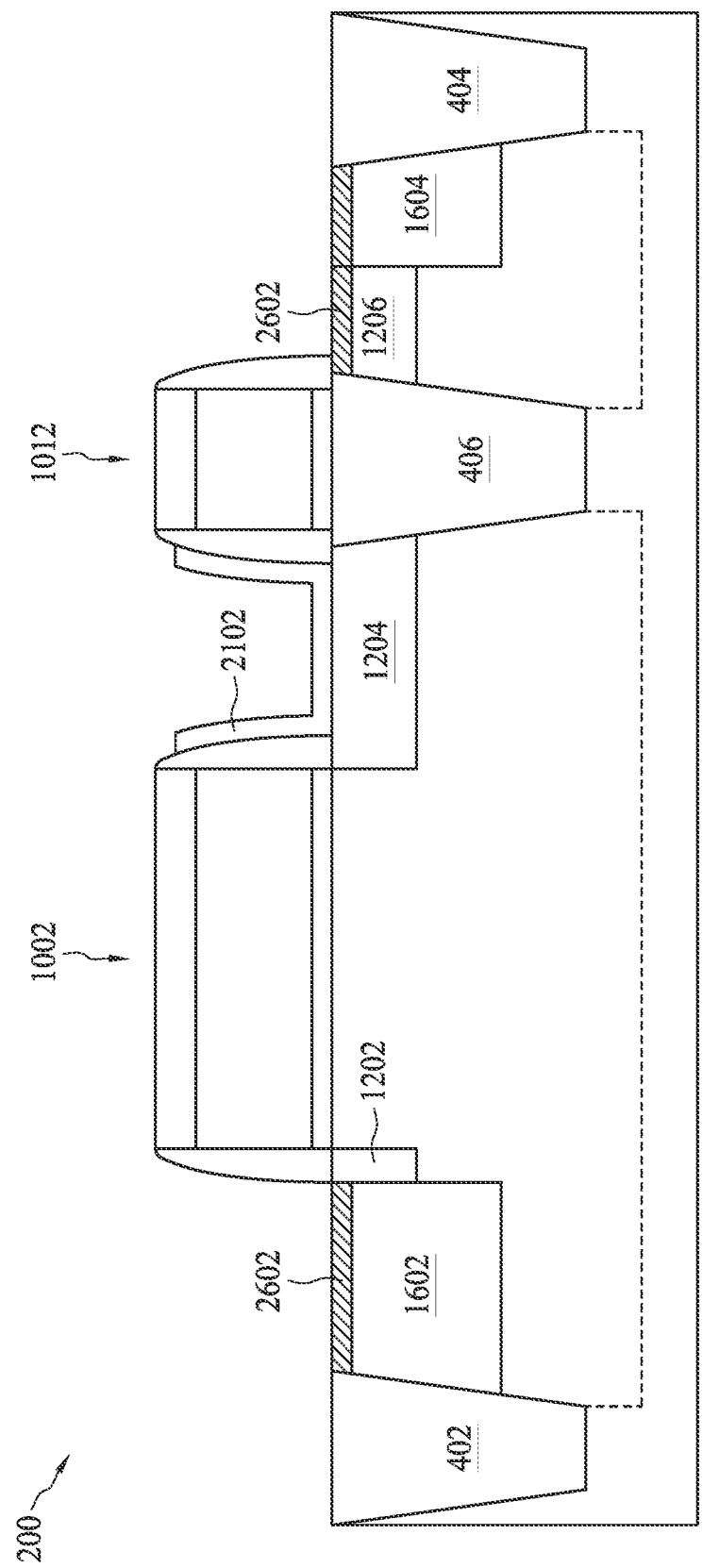
Figure 27:
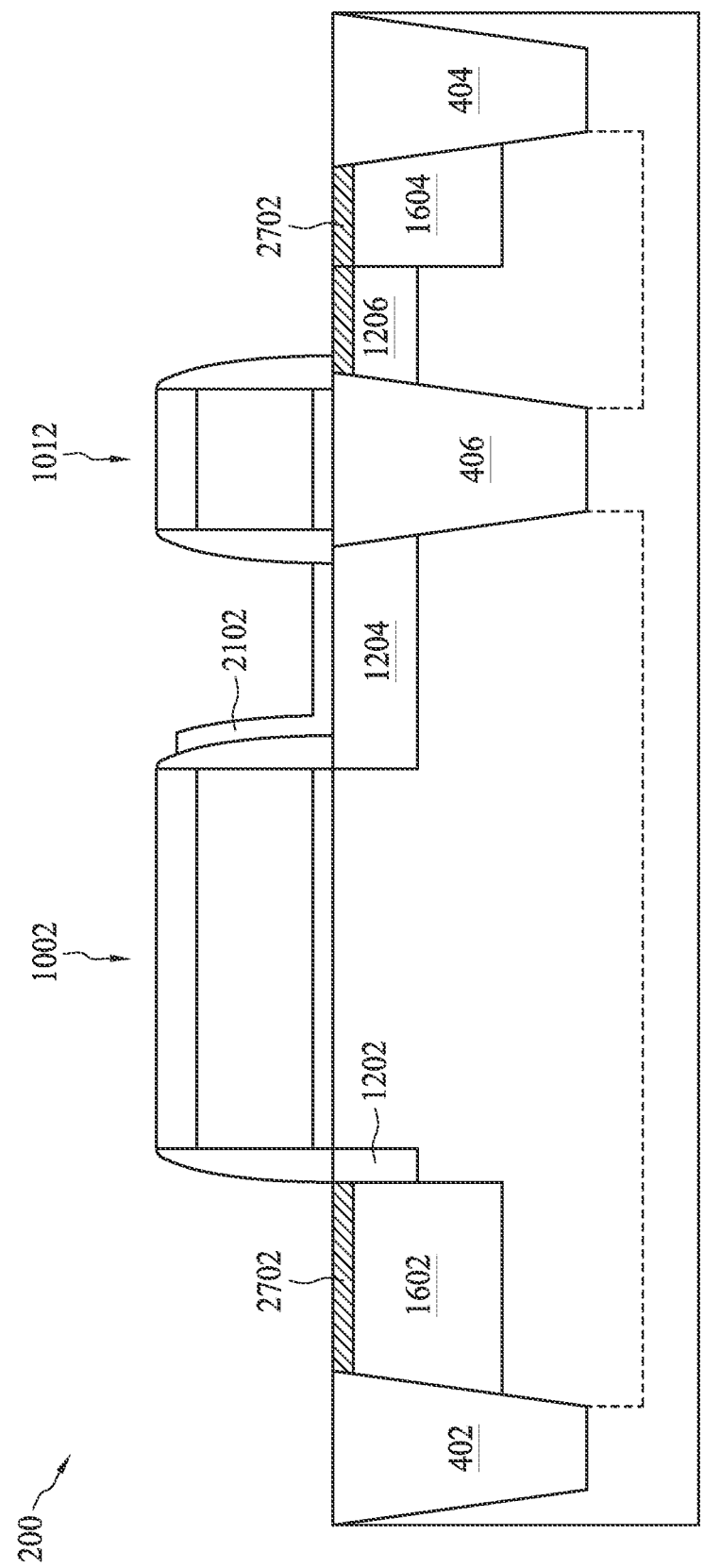
Figure 28:
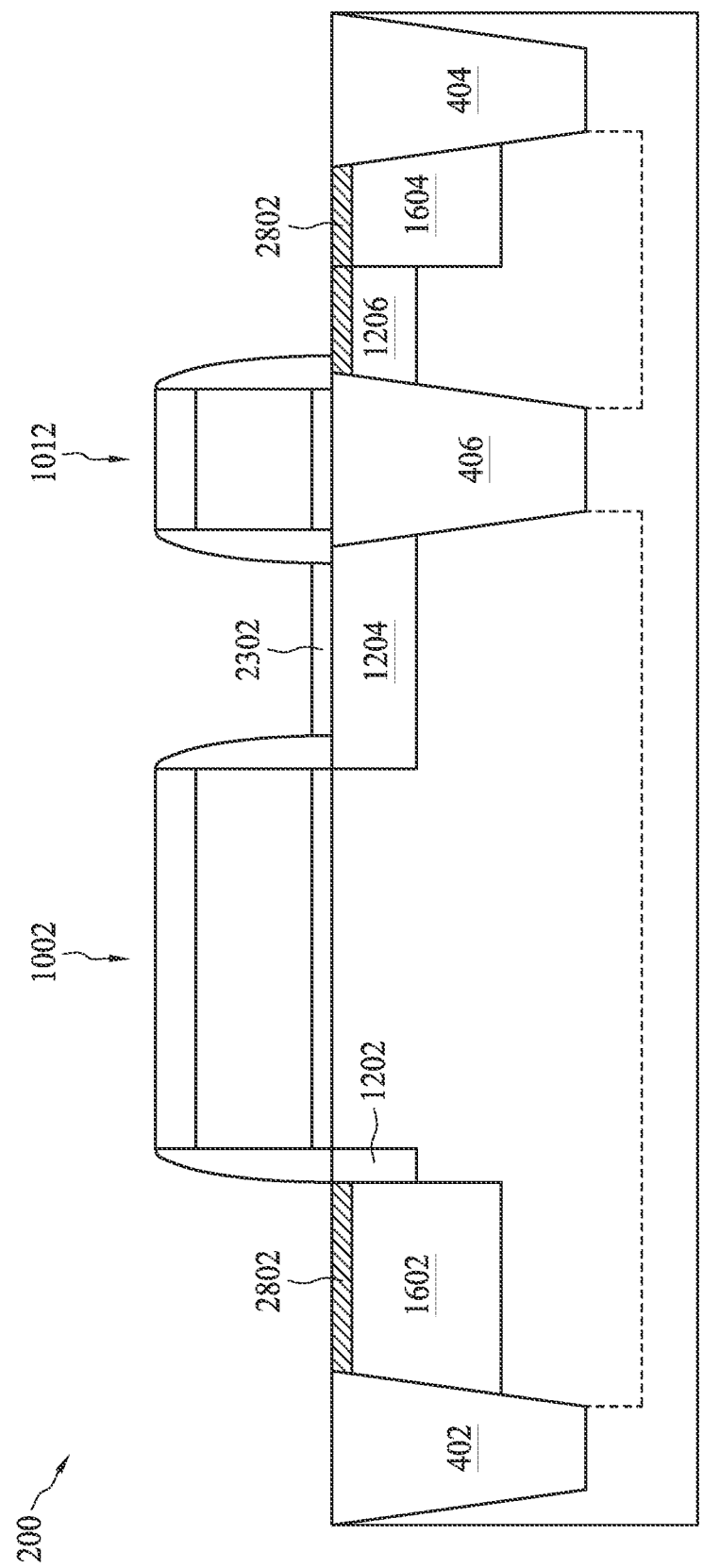
Figure 29:
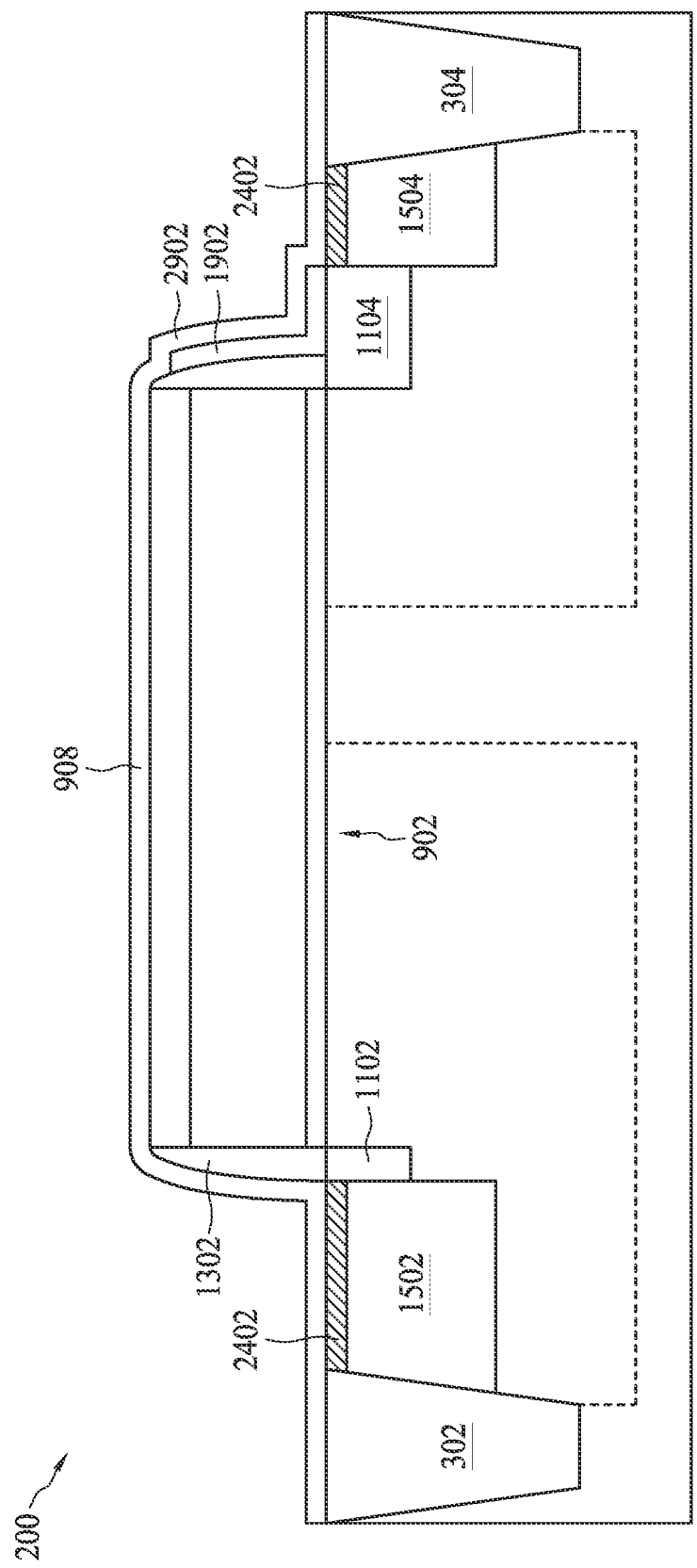
Figure 30:
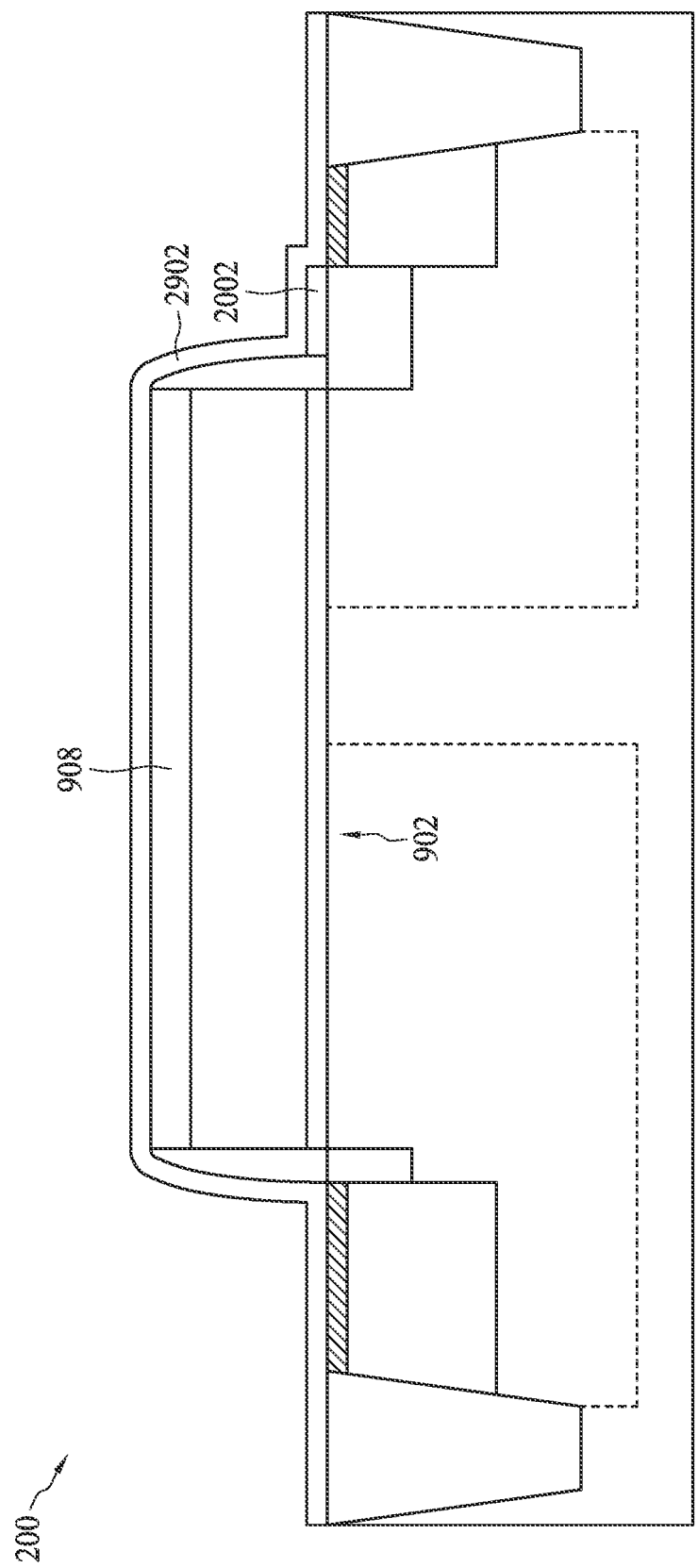
Figure 31:
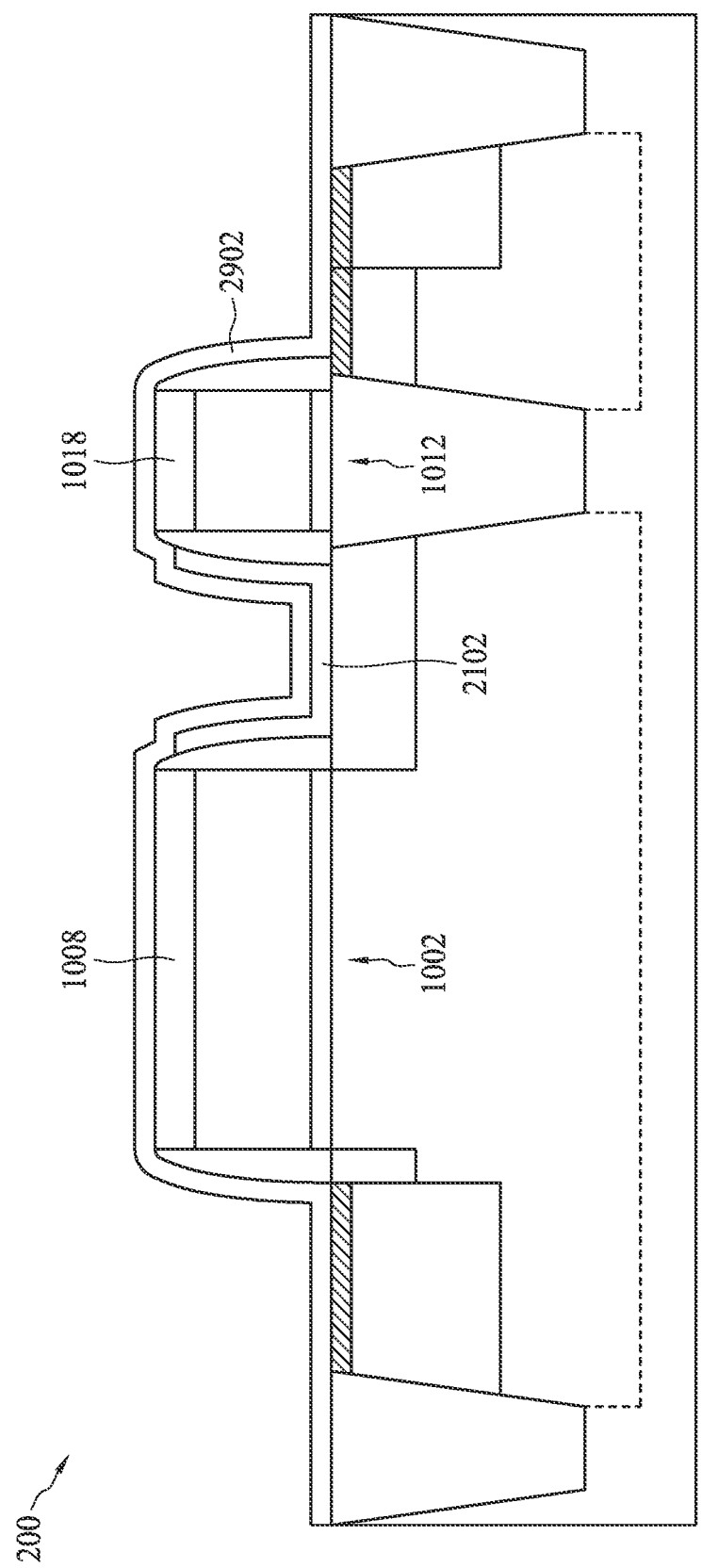
Figure 32:
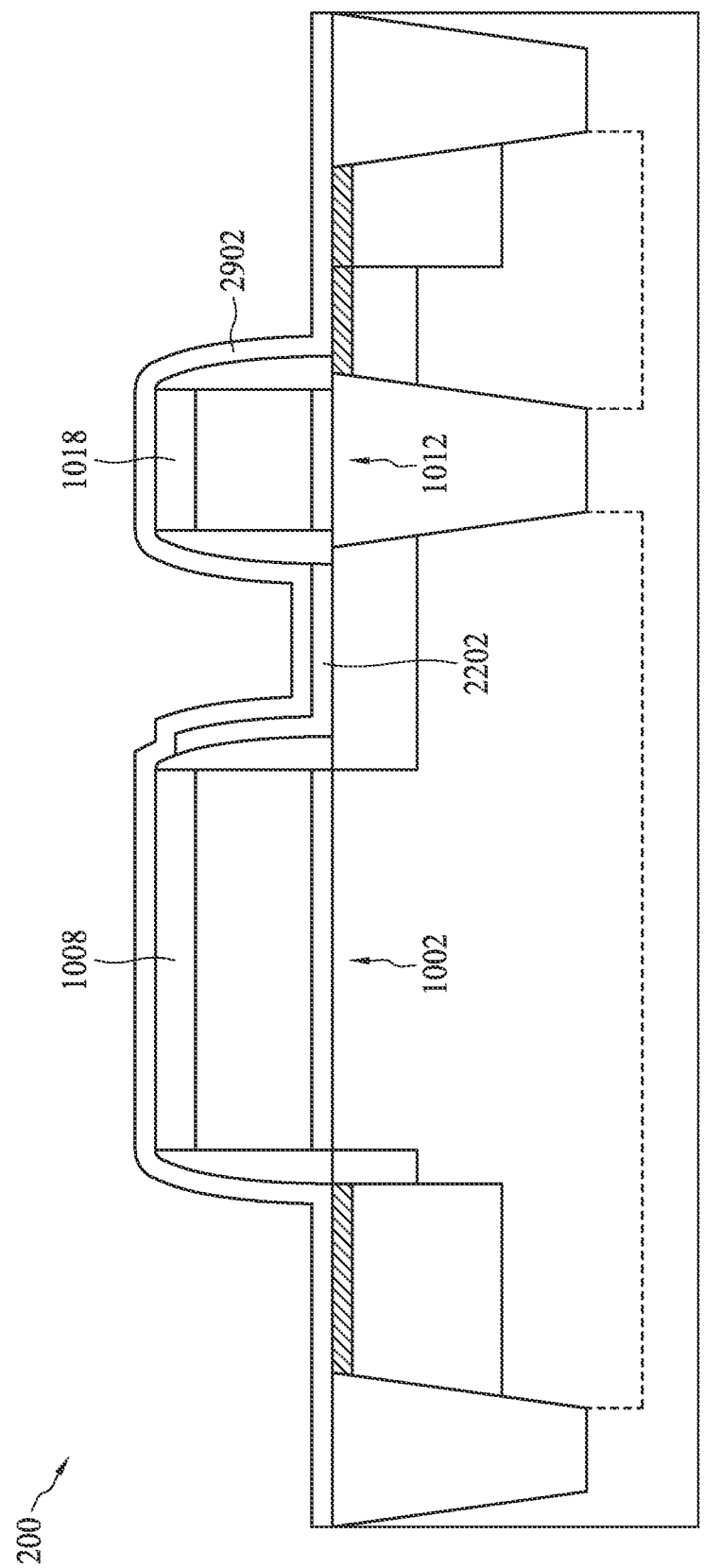
Figure 33:
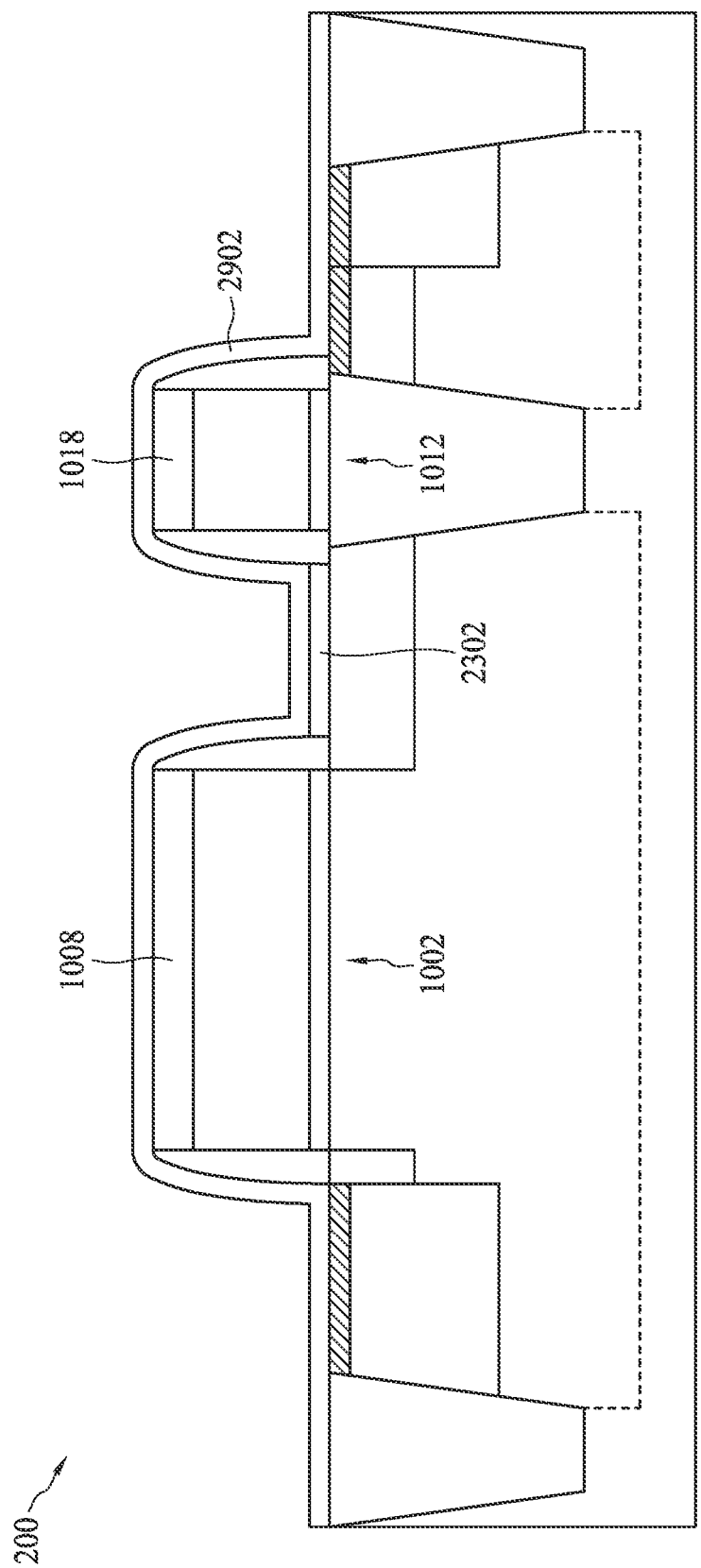
Figure 34:
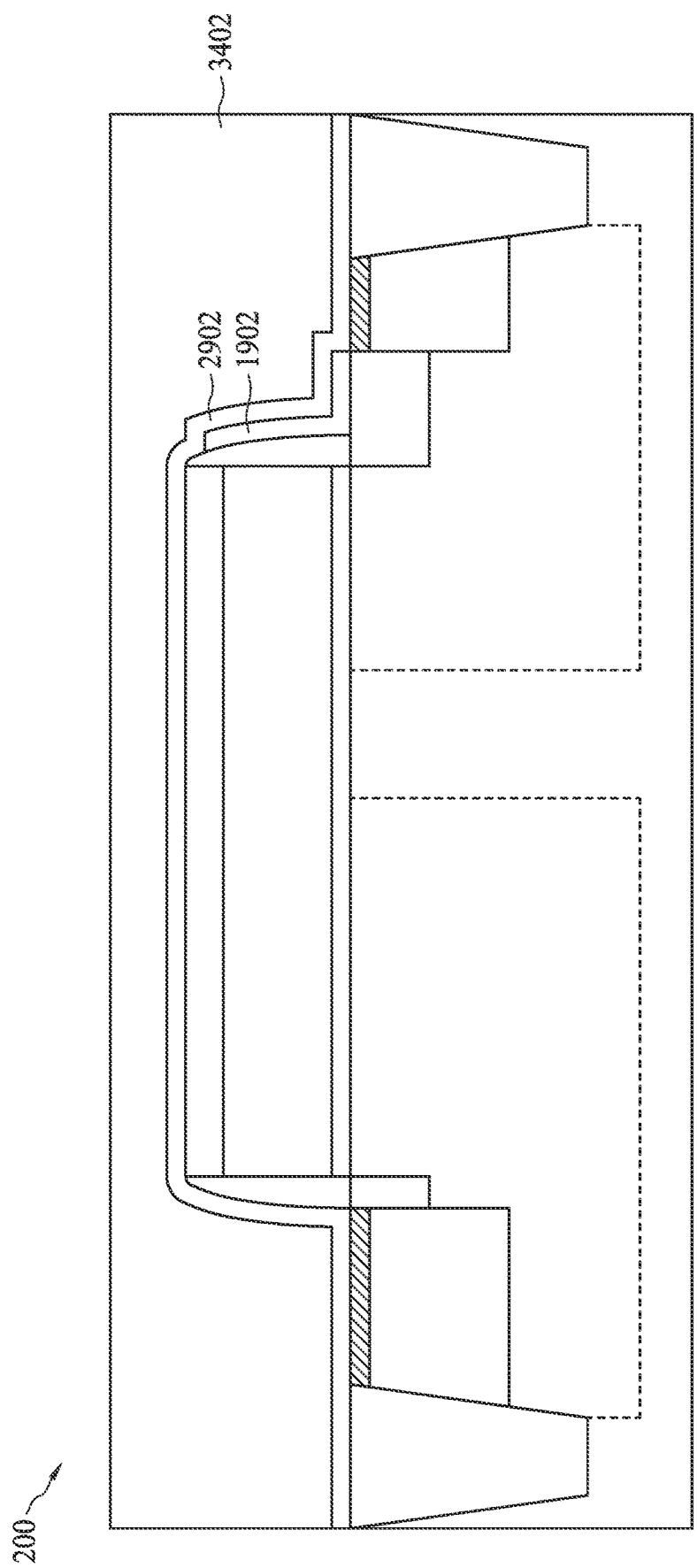
Figure 35:
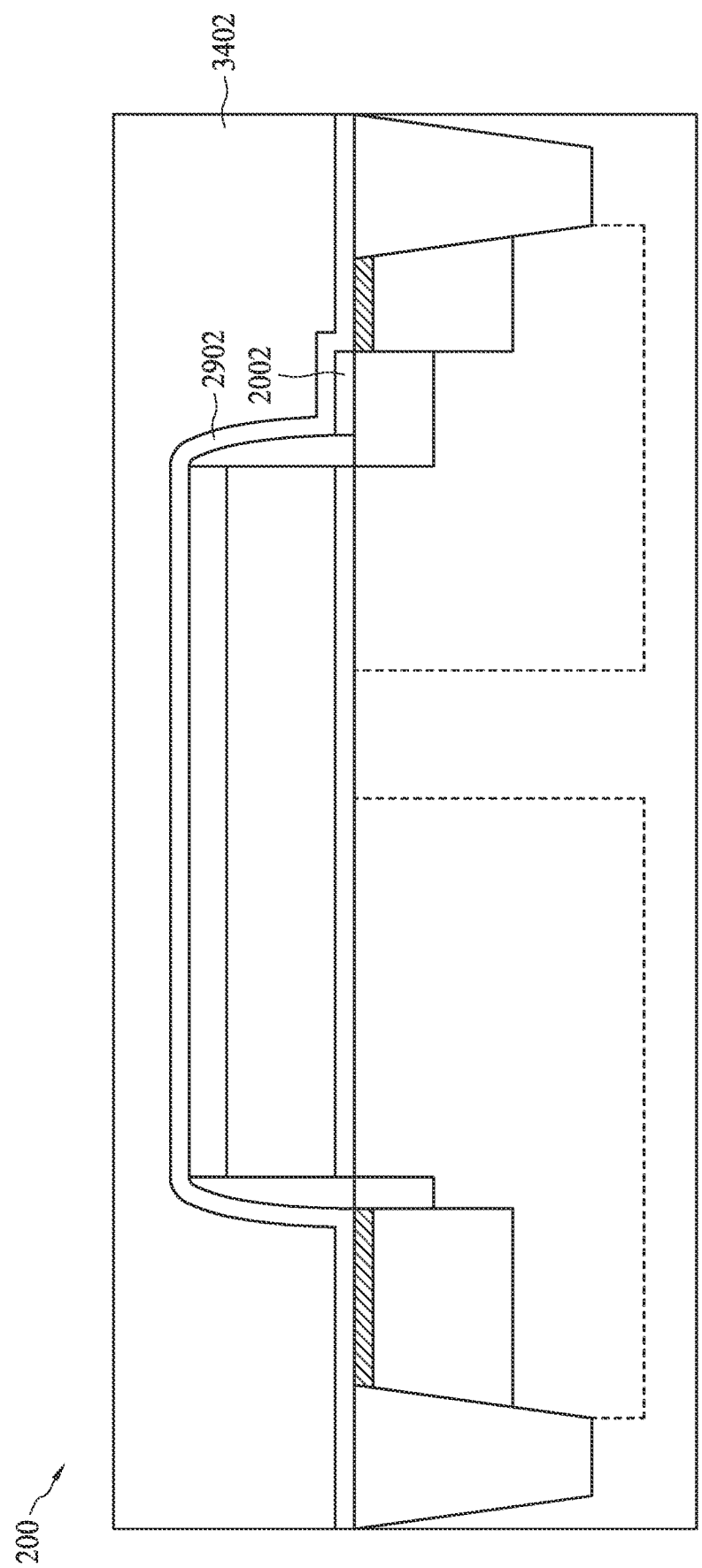
Figure 36:
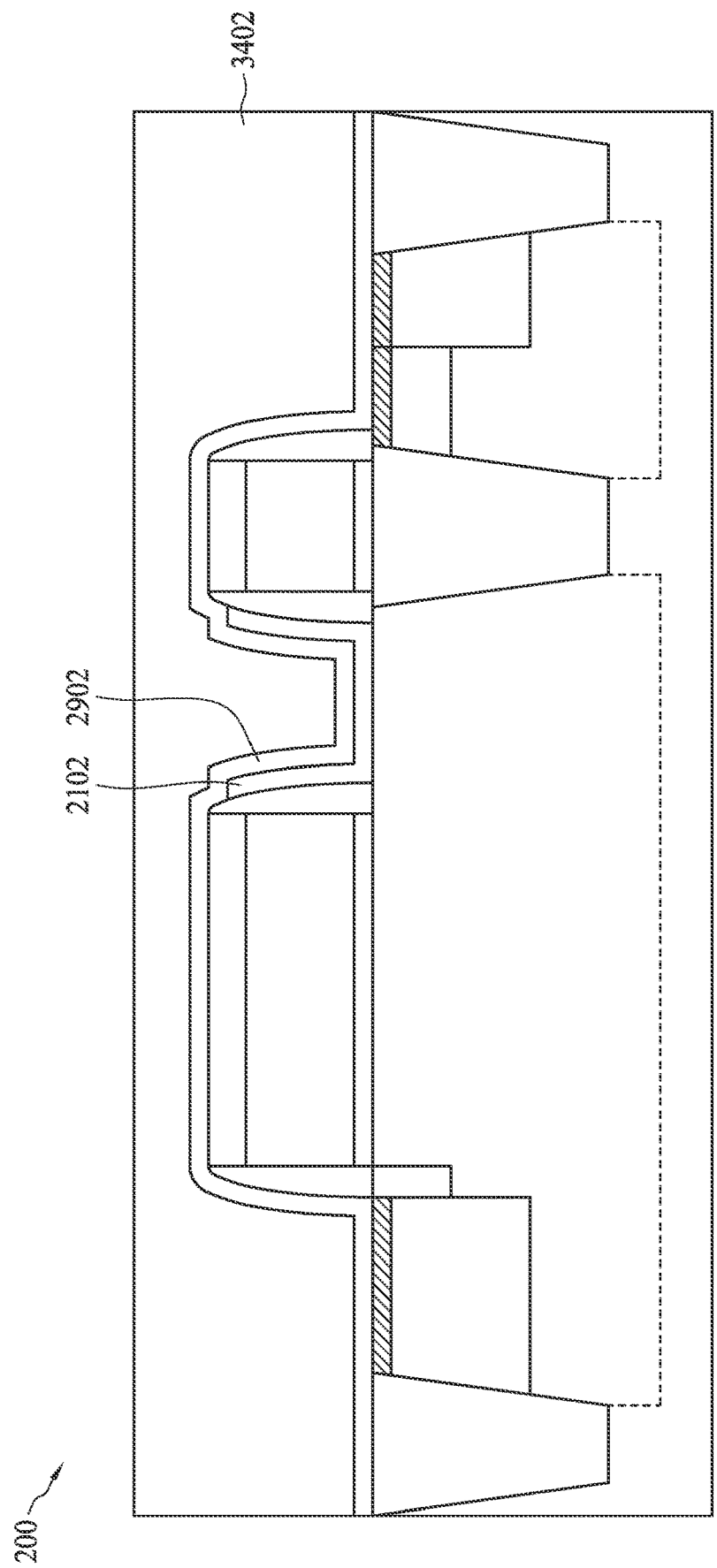
Figure 37:
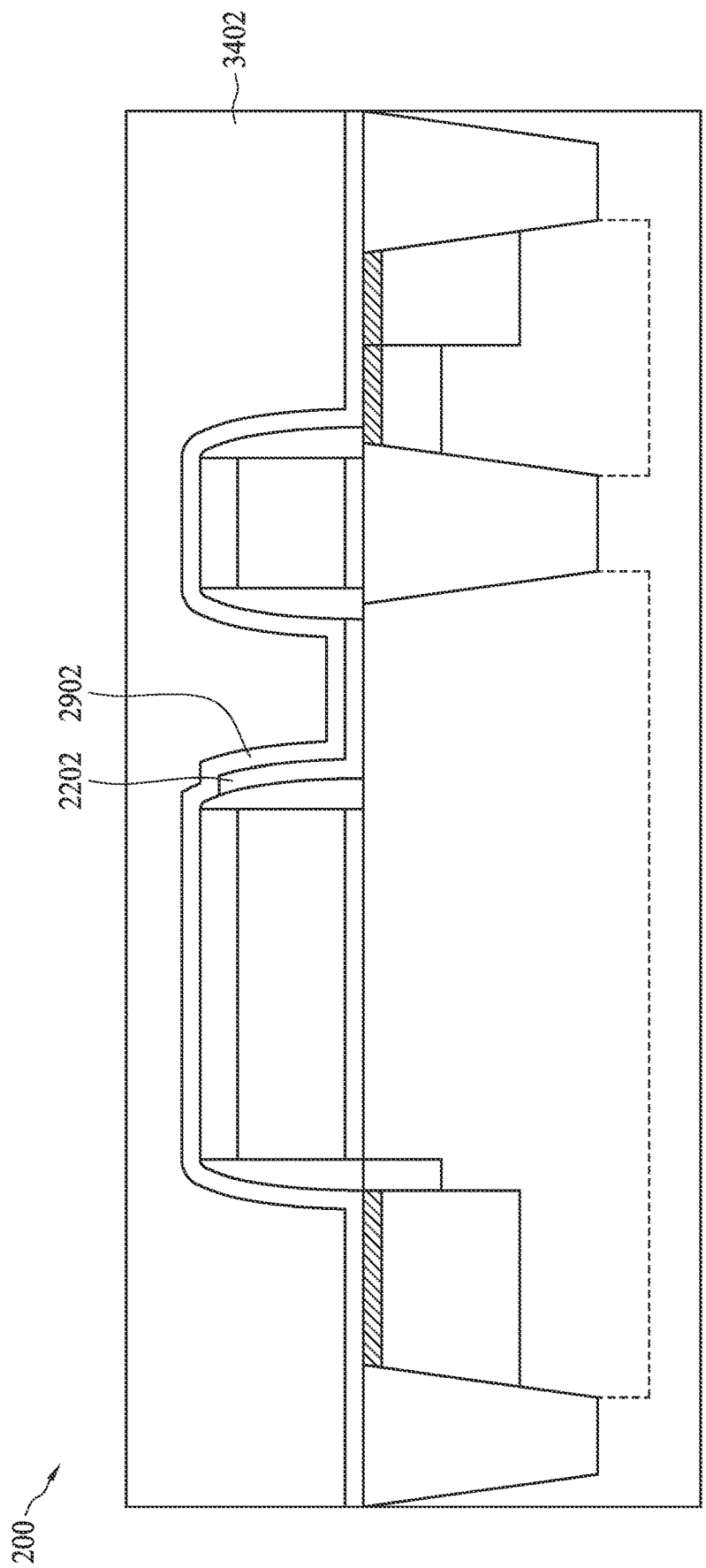
Figure 38:
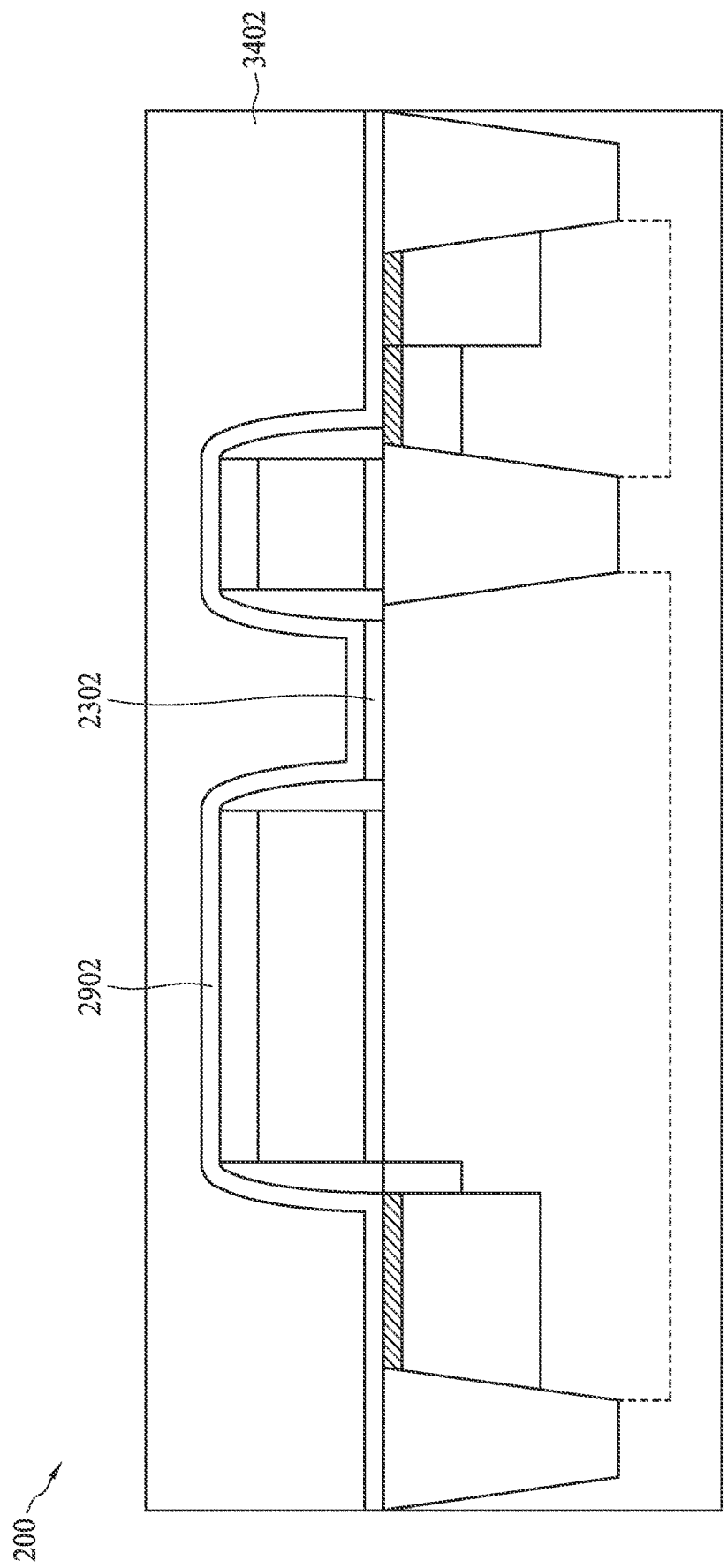
Figure 39:
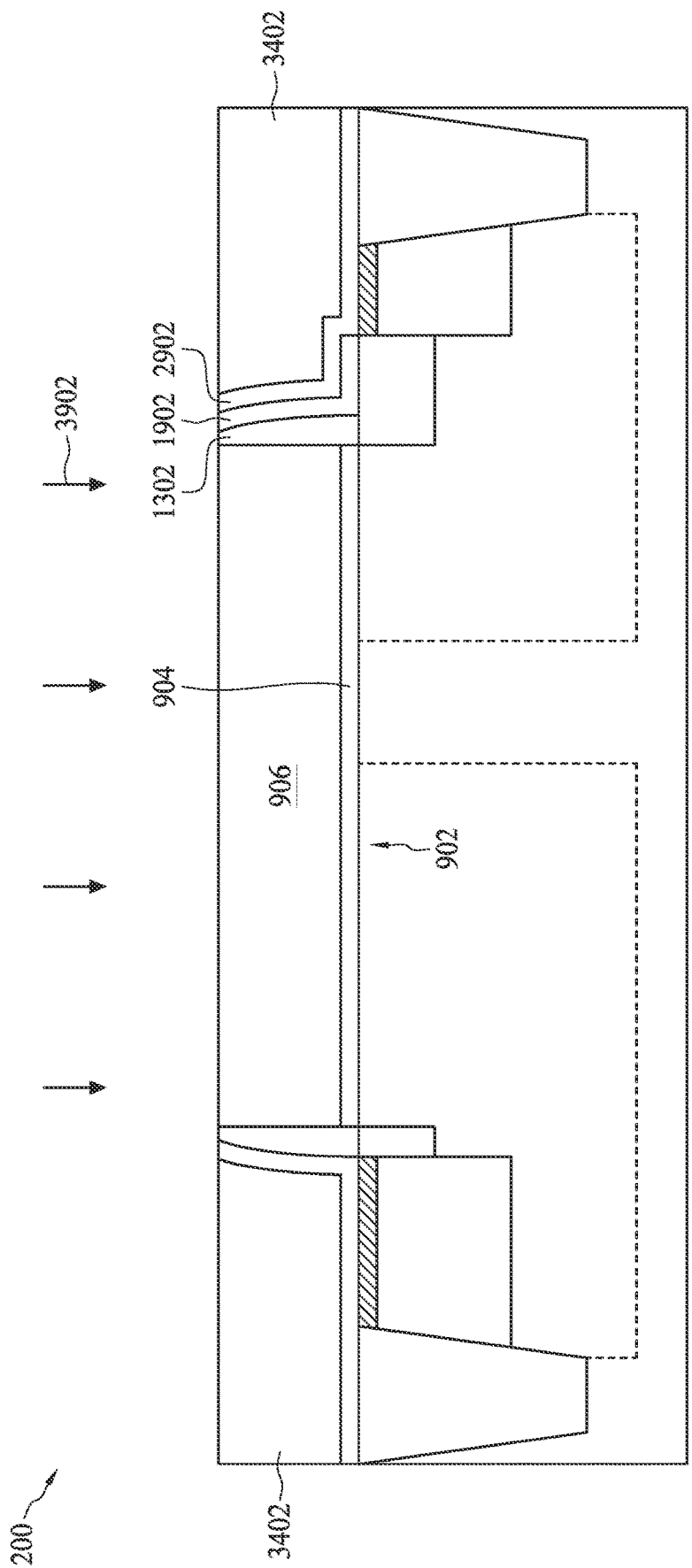

For example, in FIG. 24, according to the patterned RPO 1902, the silicide layer 2402 is formed along a respective top surface of each of the source region 1502 and drain region 1504 (i.e., no silicide layer formed along a top surface of the LDD region 1104); in FIG. 25, according to the patterned RPO 2002, the silicide layer 2502 is formed along a respective top surface of each of the source region 1502 and drain region 1504 (i.e., no silicide layer formed along a top surface of the LDD region 1104); in FIG. 26, according to the patterned RPO 2102, the silicide layer 2602 is formed along a respective top surface of each of the source region 1602, LDD region 1206, and drain region 1604 (i.e., no silicide layer formed along a top surface of the LDD region 1204); in FIG. 27, according to the patterned RPO 2202, the silicide layer 2702 is formed along a respective top surface of each of the source region 1602, LDD region 1206, and drain region 1604 (i.e., no silicide layer formed along a top surface of the LDD region 1204); and in FIG. 28, according to the patterned RPO 2302, the silicide layer 2802 is formed along a respective top surface of each of the source region 1602, LDD region 1206, and drain region 1604 (i.e., no silicide layer formed along a top surface of the LDD region 1204).

Corresponding to operation 124 of FIG. 1, FIGS. 29, 30, 31, 32, and 33 are cross-sectional views of the first/second embodiment of the semiconductor device 200 in which an etch stop layer 2902 is formed over the workpiece having the patterned RPOs 1902, 2002, 2102, 2202, and 2302, respectively.

The etch stop layer 2902 (formed of, e.g., silicon nitride or otherwise suitable nitride-based dielectric materials) generally serves as a stop layer for one or more etching processes performed to form a contact hole for a source region, a drain region or a gate structure. The etch stop layer 2902 may be formed as a liner structure along exposed surfaces of the features currently formed over the substrate 202. For example in FIG. 29, the etch stop layer 2902 extends over various features formed along the top surface of the substrate 202 (e.g., the STIs 302 and 304, the silicide layers 2402), one of the gate spacers 1902, and the hard mask layer 908. With each of the patterned RPOs 1902, 2002, 2102, 2202, and 2302 having no portion extending above any of the adjacent sacrificial gate structures and their mask layers, the etch stop layer 2902 has no abnormal hump formed above the sacrificial gate structures. Such an abnormal hump can disadvantageously cause the following CMP process to fail, since the hump, typically formed at an upper corner of the hard mask layer, can prevent a certain portion of the etch stop layer disposed over the top surface of the hard mask layer from being polished. If this portion of the etch stop layer remains after the CMP process, the sacrificial gate structure cannot be exposed during the following gate replacement process. As such, the sacrificial gate structure cannot be replaced with a desired gate metal structure.

Corresponding to operation 126 of FIG. 1, FIGS. 34, 35, 36, 37, and 38 are cross-sectional views of the first/second embodiment of the semiconductor device 200 in which a first interlayer dielectric (ILD) 3402 is formed over the workpiece having the patterned RPOs 1902, 2002, 2102, 2202, and 2302, respectively.

In general, the first ILD 3402 is formed with a relatively thick height (thickness) to embed or otherwise overlay every features currently formed over the substrate 202. For example, every feature of the semiconductor device 200 at the current fabrication stage, lined by the etch stop layer 2902, may be further overlaid by the first ILD 3402. The ILD 3402 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric protection layer (not shown) is formed over the ILD. The dielectric protection layer can prevent or reduces the loss of the ILD in subsequent etching processes. The dielectric protection layer may be formed of a suitable material, such as silicon nitride, silicon carbonitride, or the like, using a suitable method such as CVD, PECVD, or FCVD.

Corresponding to operation 128 of FIG. 1, FIGS. 39, 40, 41, 42, and 43 are cross-sectional views of the first/second embodiment of the semiconductor device 200 in which a planarization or polishing process (e.g., a CMP process) 3902 is performed on the workpiece having the patterned RPOs 1902, 2002, 2102, 2202, and 2302, respectively.

Figure 40:
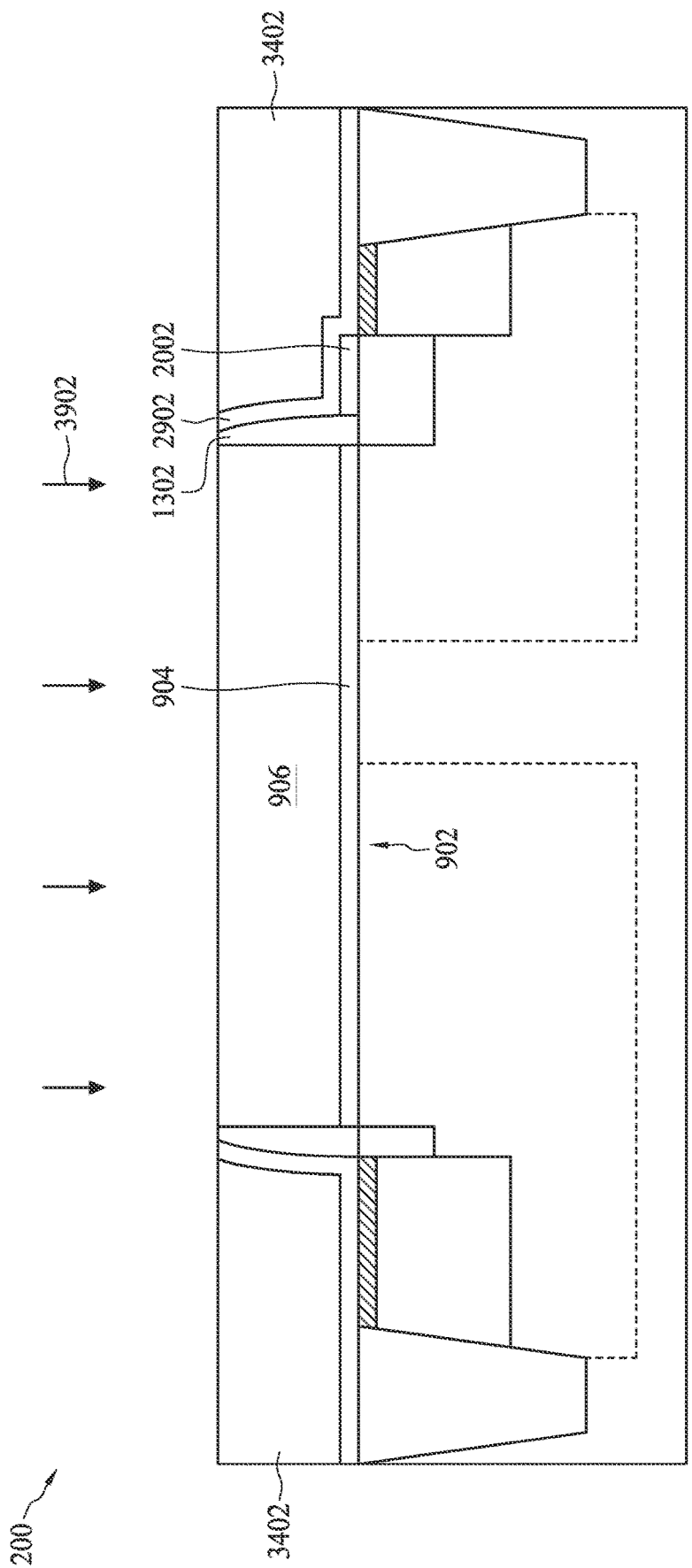
Figure 41:
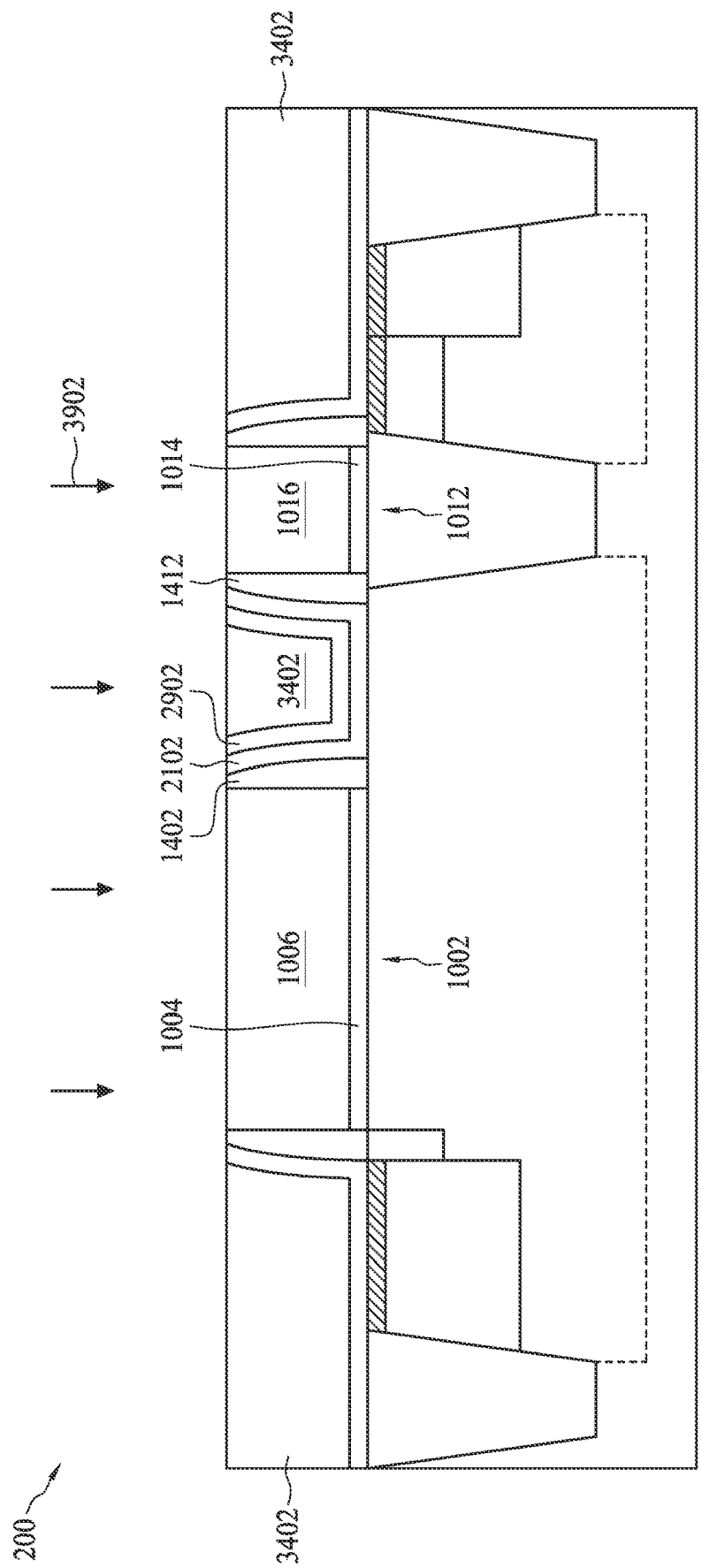
Figure 42:
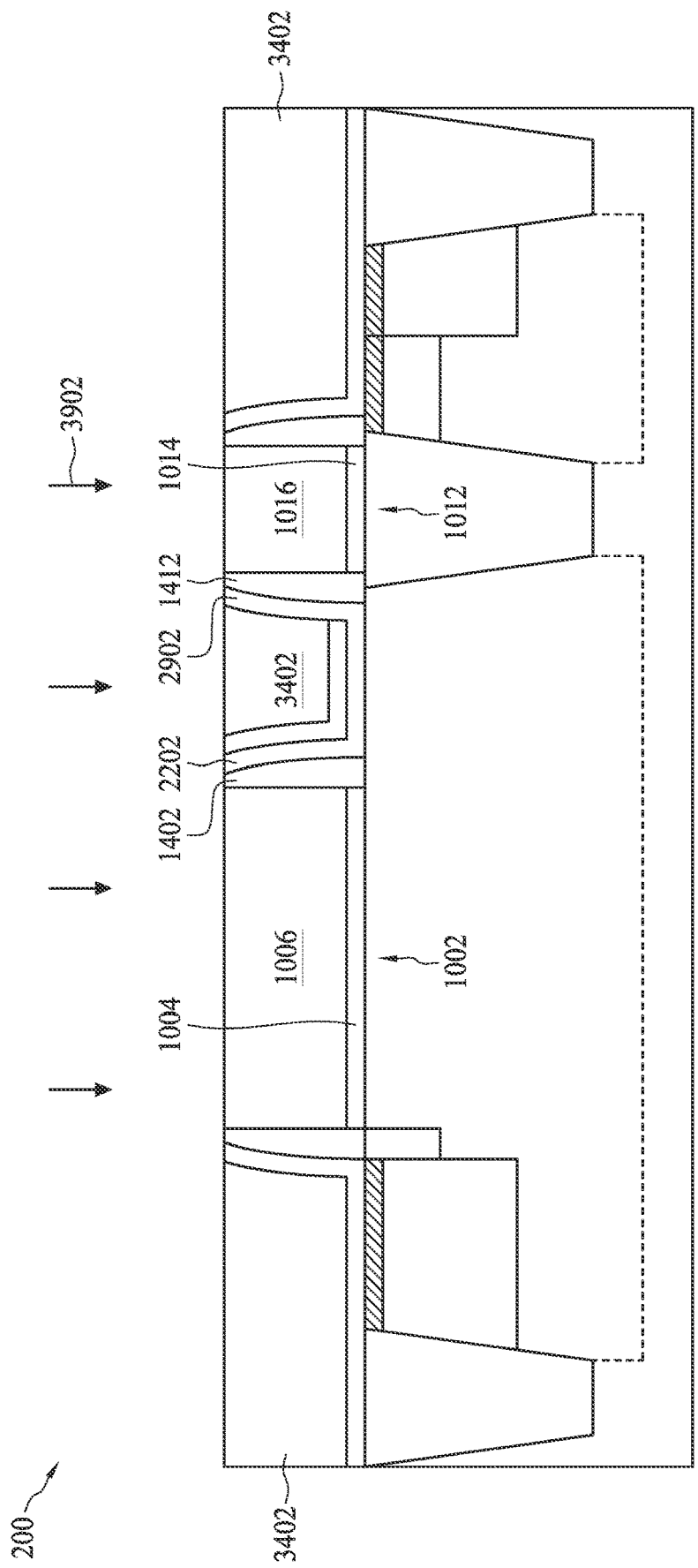
Figure 43:
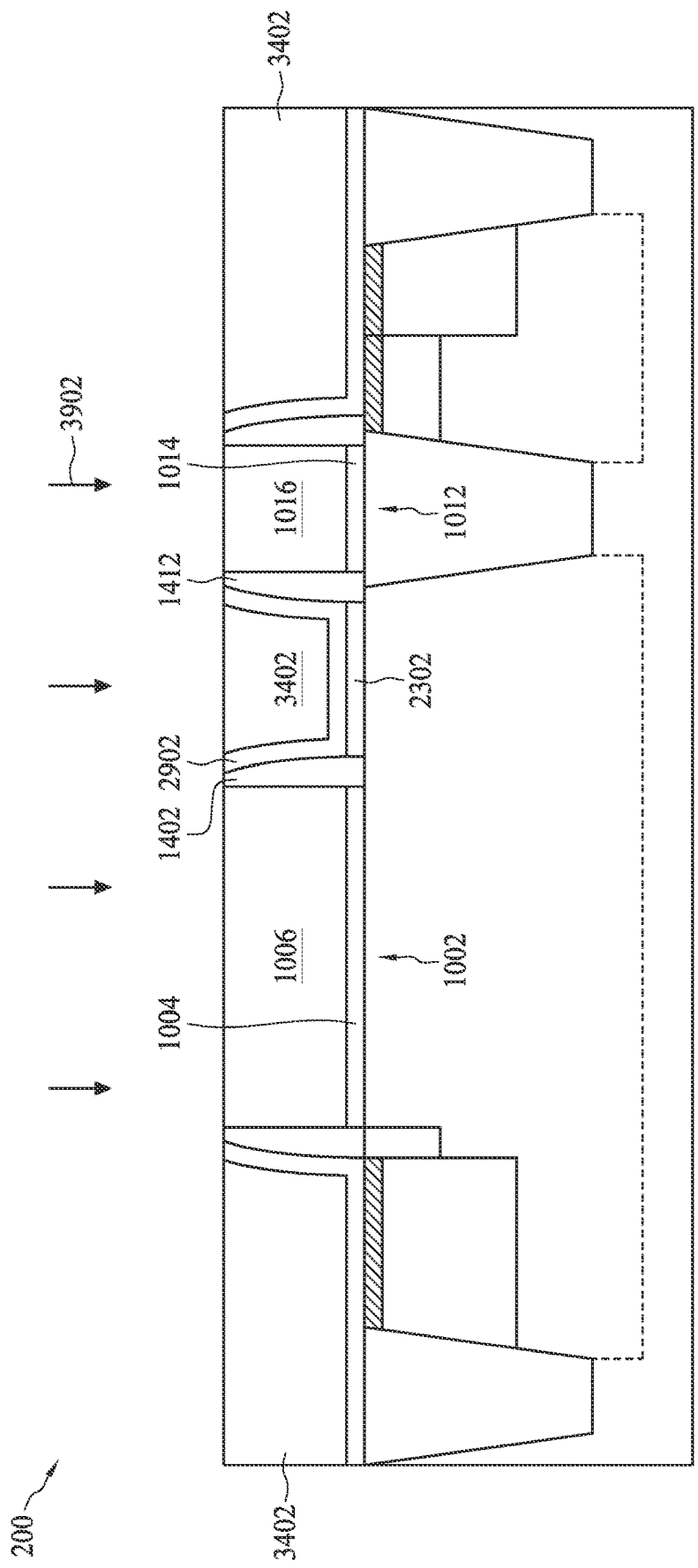

Upon forming the first ILD 3402, the CMP process 3902 is performed on the workpiece until the underlying sacrificial gate layer(s) are exposed. For example in the first embodiment of the semiconductor device 200 (FIGS. 39 and 40), the CMP process 3902 is performed to first remove the first ILD 3402, a portion of the etch stop layer 2902 disposed over the top surface of the hard mask layer 908, and then the hard mask layer 908 until the top surface of the sacrificial gate layer 906 is exposed. In addition to exposing the sacrificial gate layer, portions of the gate spacers 1302, the patterned RPO 1902, and the etch stop layer 2902 may also be exposed, respectively (FIG. 39); and portions of the gate spacers 1302, and the etch stop layer 2902 may also be exposed, respectively (FIG. 40). In another example of the second embodiment of the semiconductor device 200 (FIGS. 41, 42, and 43), the CMP process 3902 is performed to first remove the first ILD 3402, a portion of the etch stop layer 2902 disposed over the top surface of the hard mask layers 1008 and 1018, and then the hard mask layers 1008 and 1018 until the top surfaces of the sacrificial gate layers 1006 and 1016 are exposed. In addition to exposing the sacrificial gate layers, portions of the gate spacers 1402, the gate spacers 1412, the patterned RPO 2102, and the etch stop layer 2902 may also be exposed, respectively (FIG. 41); portions of the gate spacers 1402, the gate spacers 1412, the patterned RPO 2202, and the etch stop layer 2902 may also be exposed, respectively (FIG. 42); and portions of the gate spacers 1402, the gate spacers 1412 and the etch stop layer 2902 may also be exposed, respectively (FIG. 43).

Figure 44:
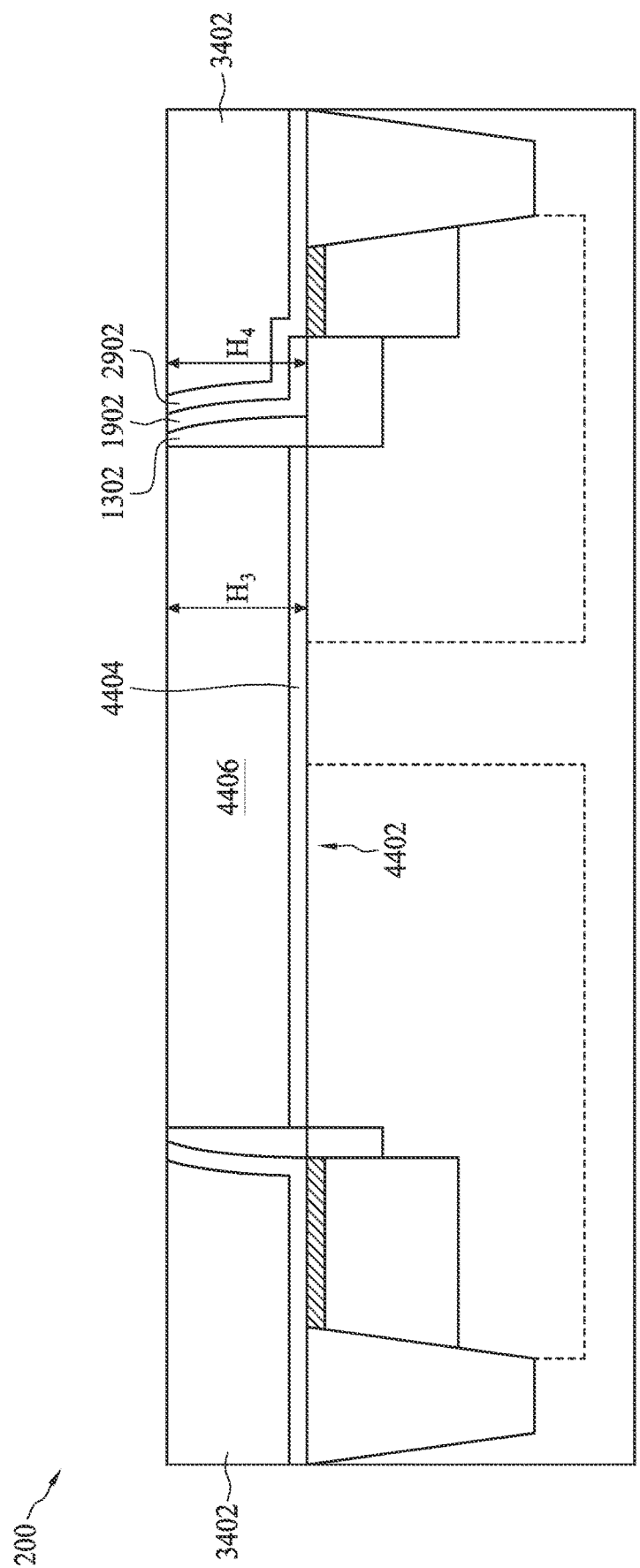
Figure 45:
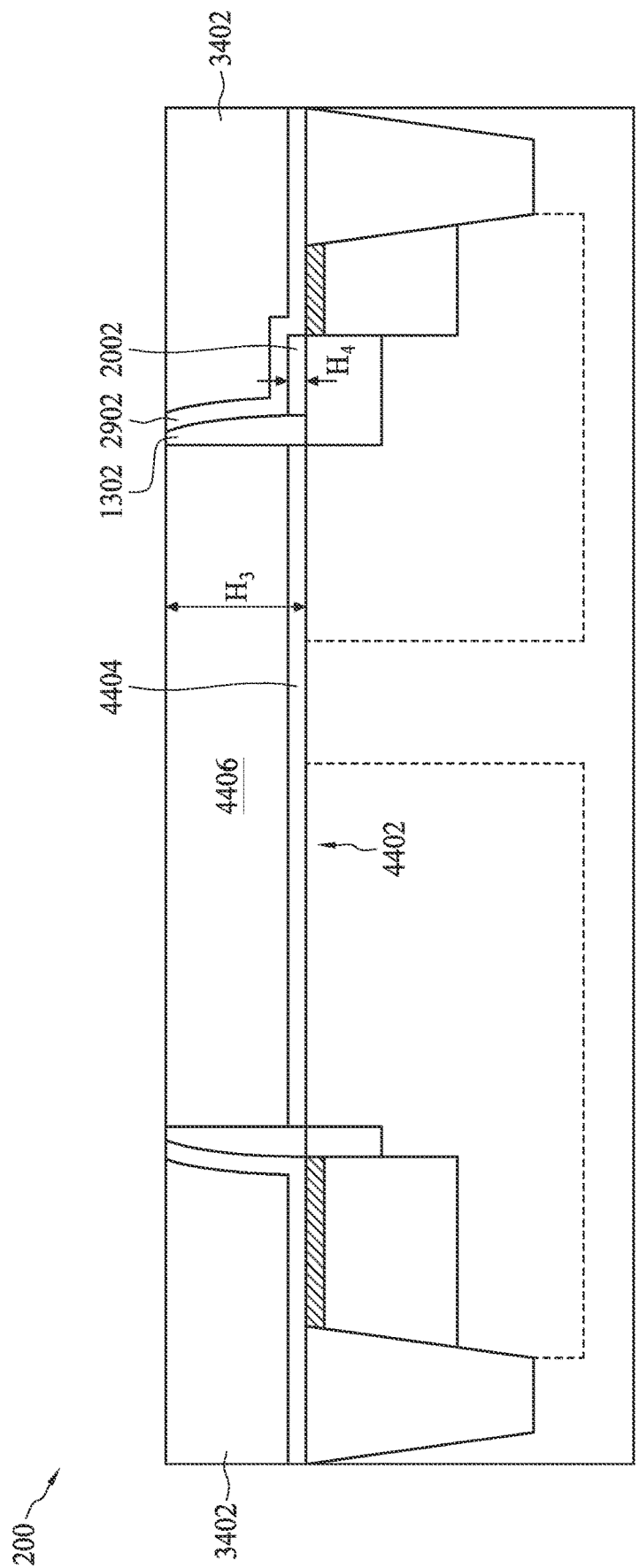
Figure 46:
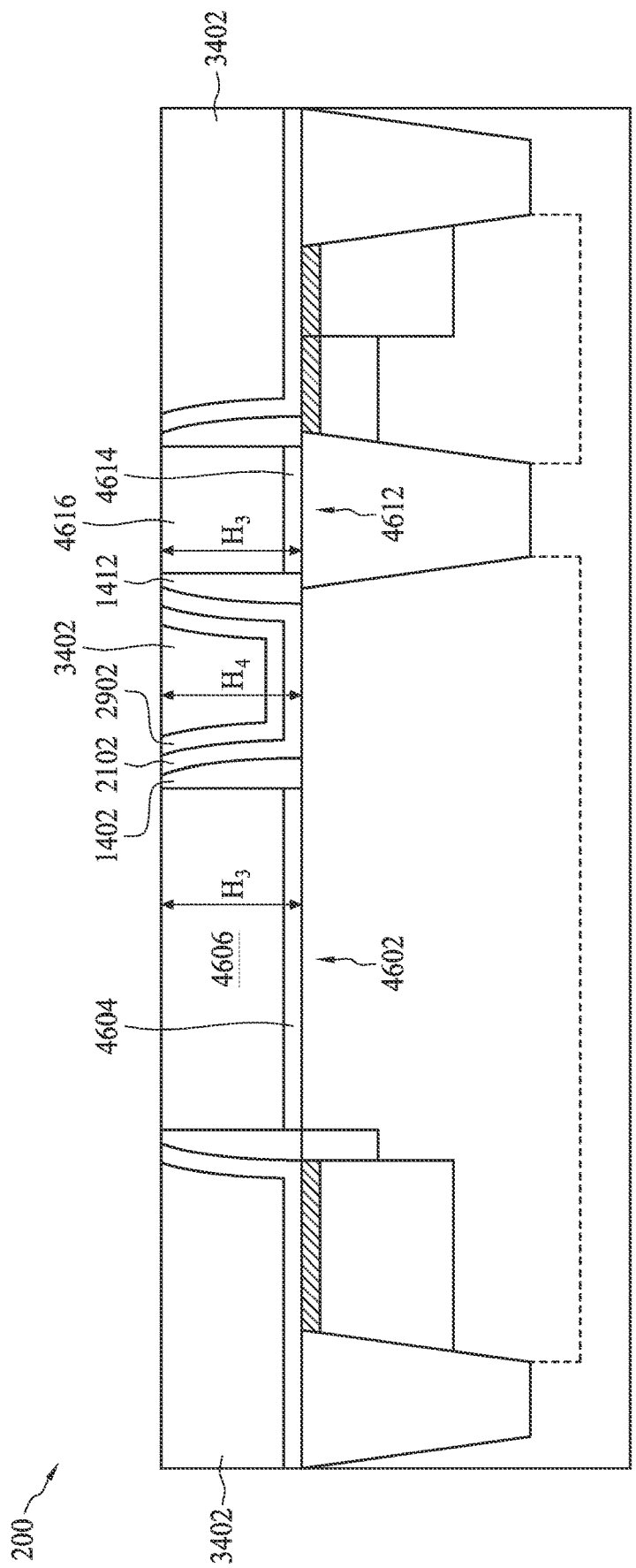
Figure 47:
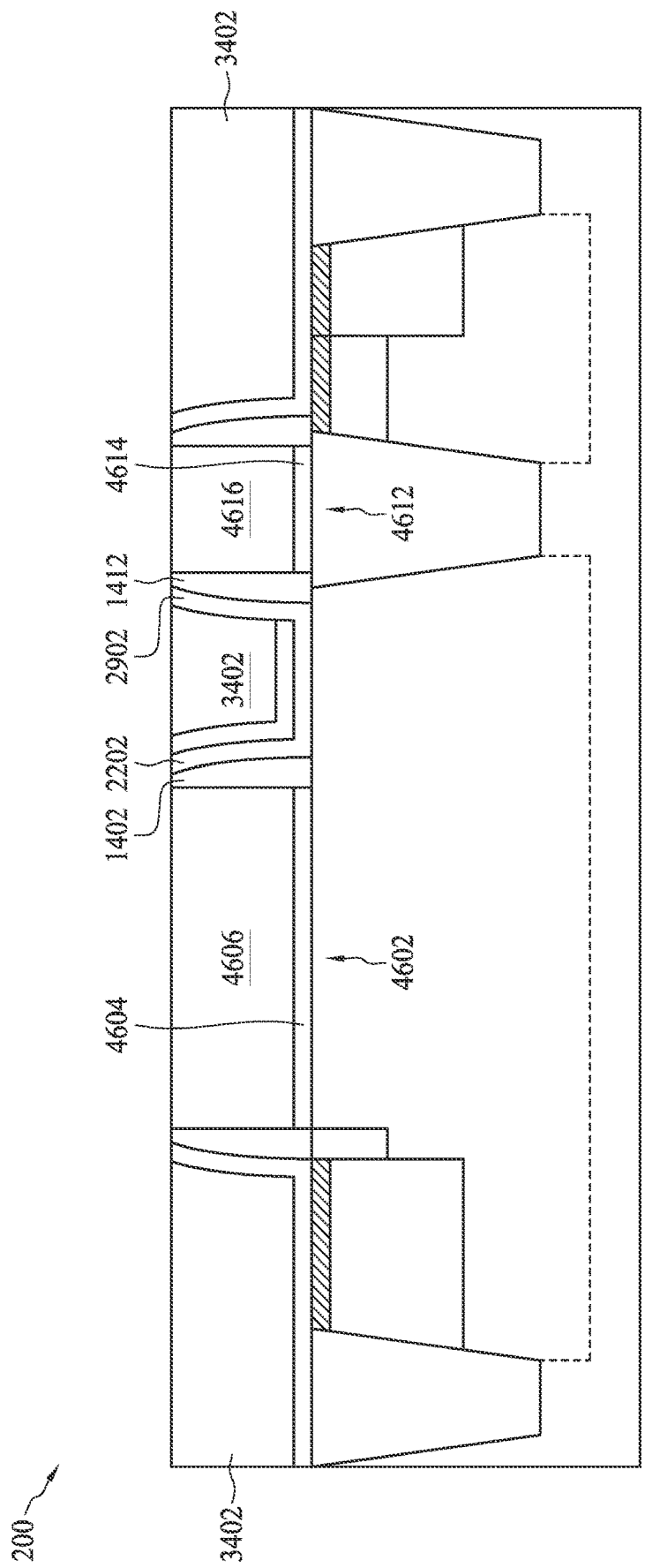
Figure 48:
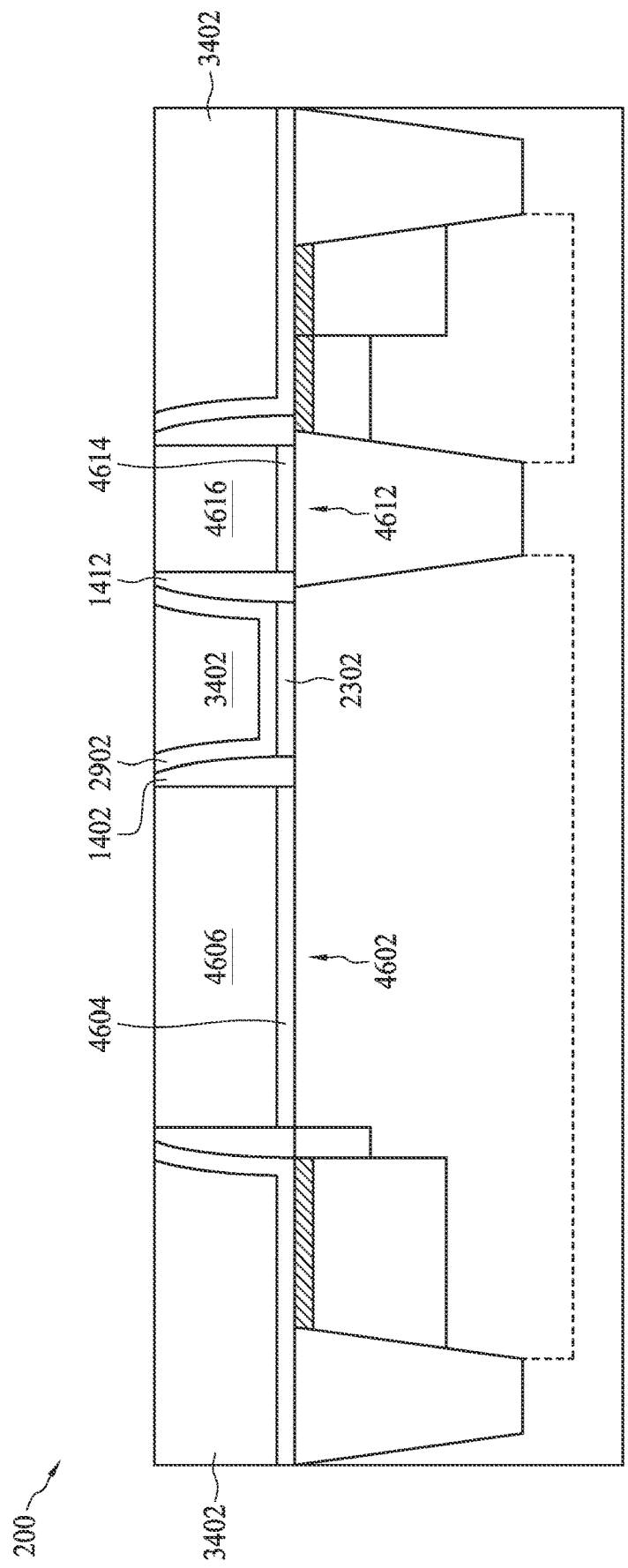

Corresponding to operation 130 of FIG. 1, FIGS. 44 and 45 are cross-sectional views of the first embodiment of the semiconductor device 200 in which the sacrificial gate structure 902 is replaced with a gate metal structure 4402. Corresponding to the same operation, FIGS. 46, 47, and 48 are cross-sectional views of the second embodiment of the semiconductor device 200 in which the sacrificial gate structures 1002 and 1012 are replaced with gate metal structures 4602 and 4612, respectively.

Upon exposing the sacrificial gate layer, the sacrificial gate structure, which includes the sacrificial gate layer and the underlying sacrificial gate dielectric layer, is removed (with the gate spacers remaining substantially intact), thereby forming a gate trench. The gate trench is sequentially filled with a gate dielectric layer and a gate metal layer, which are sometimes collectively referred to as a gate metal structure. Alternatively stated, the sacrificial gate layer and sacrificial gate dielectric layer are replaced by the gate dielectric layer and the gate metal layer, respectively. In some other embodiments, the sacrificial gate dielectric layer may remain (i.e., removing only the sacrificial gate layer). For example in FIGS. 44-45, the gate metal structure 4402 includes a gate dielectric layer 4404 and a gate metal layer 4406; and in FIGS. 46-48, the gate metal structure 4602 includes a gate dielectric layer 4604 and a gate metal layer 4606, and the gate metal structure 4612 includes a gate dielectric layer 4614 and a gate metal layer 4616.

With no portion of the patternable RPO disposed above the hard mask layer, the CMP can successfully remove the hard mask layer to expose the sacrificial gate structure. As such, after replacing the sacrificial gate structure with a metal gate structure, the metal gate structure can have a height equal to or substantially higher than the height of a highest point of the patternable RPO. For example in FIG. 44, the metal gate structure 4402 has a height ($H_3$) which is about equal to the height ($H_4$) of a highest point of the patternable RPO 1902; in the example of FIG. 45, the metal gate structure 4402 has a height ($H_3$) which is substantially higher the height ($H_4$) of a highest point of the patternable RPO 2002; in the example of FIG. 46, the metal gate structures 4602 and 4612 have a height ($H_3$) which is about equal to the height ($H_4$) of a highest point of the patternable RPO 2102; in the example of FIG. 47, the metal gate structure 4602 and 4612 have a height ($H_3$) which is about equal to the height ($H_4$) of a highest point of the patternable RPO 2202; and in the example of FIG. 48, the metal gate structure 4602 and 4612 have a height ($H_3$) which is substantially higher the height ($H_4$) of a highest point of the patternable RPO 2302.

The gate dielectric layer may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric layer may include a stack of multiple high-k dielectric materials. The gate dielectric layer can be deposited using any suitable method, including, for example, molecular beam deposition (MBD), atomic layer deposition (ALD), PECVD, and the like. In some embodiments, the gate dielectric layer may optionally include a substantially thin oxide (e.g., $SiO_x$) layer, which may be a native oxide layer formed on the surface of the substrate 202.

The gate metal layer may include a stack of multiple metal materials. For example, the gate metal layer may be a p-type work function layer, an n-type work function layer, multilayers thereof, or combinations thereof. The work function layer may also be referred to as a work function metal. Example p-type work function metals may include TiN, TaN, Ru, Mo, Al, WN, ZrSi$_2$, MoSi$_2$, TaSi$_2$, NiSi$_2$, WN, other suitable p-type work function materials, or combinations thereof. Example n-type work function metals may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage V$_t$ is achieved in the device that is to be formed. The work function layer(s) may be deposited by CVD, PVD, ALD, and/or other suitable process.

Figure 49:
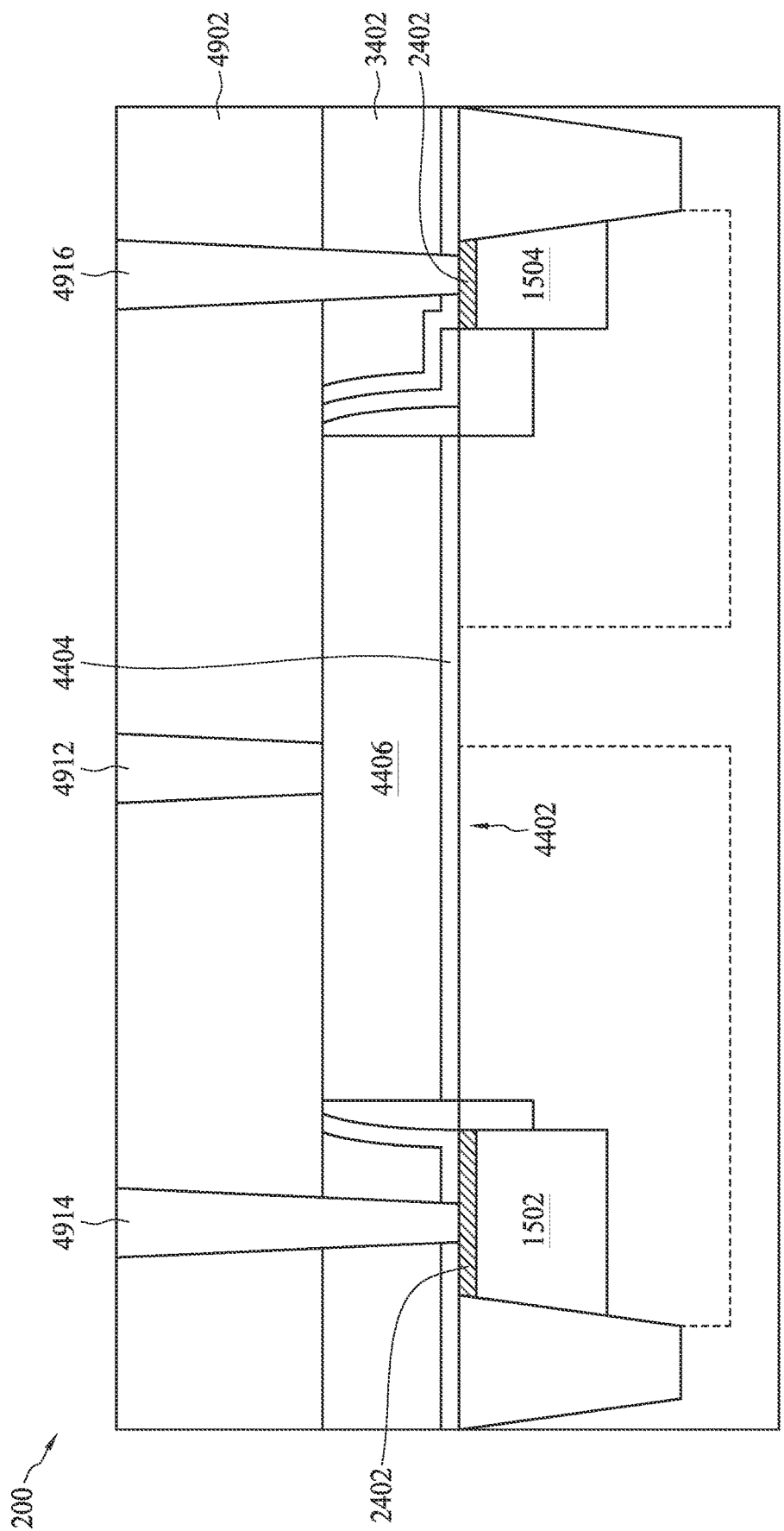
Figure 50:
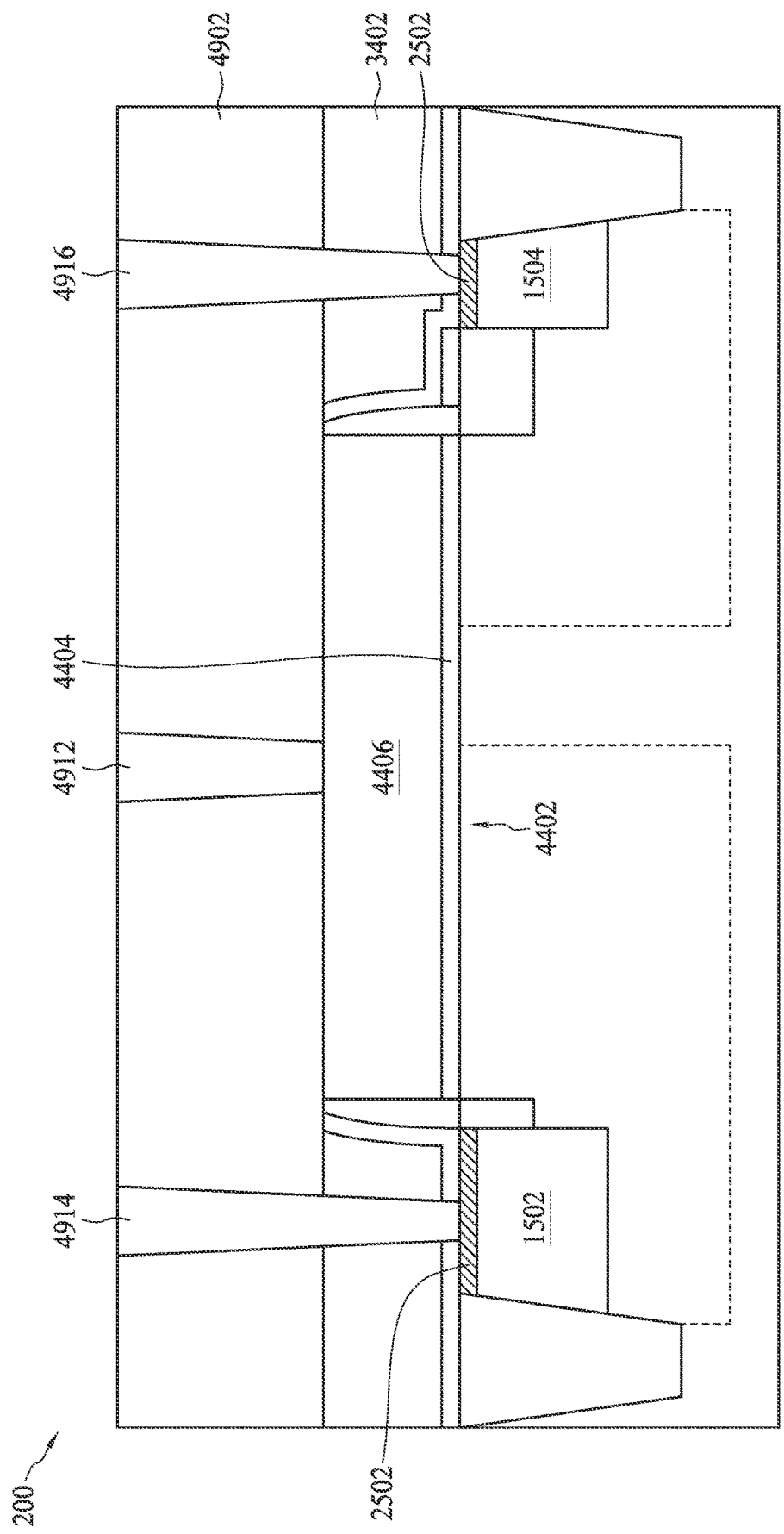
Figure 51:
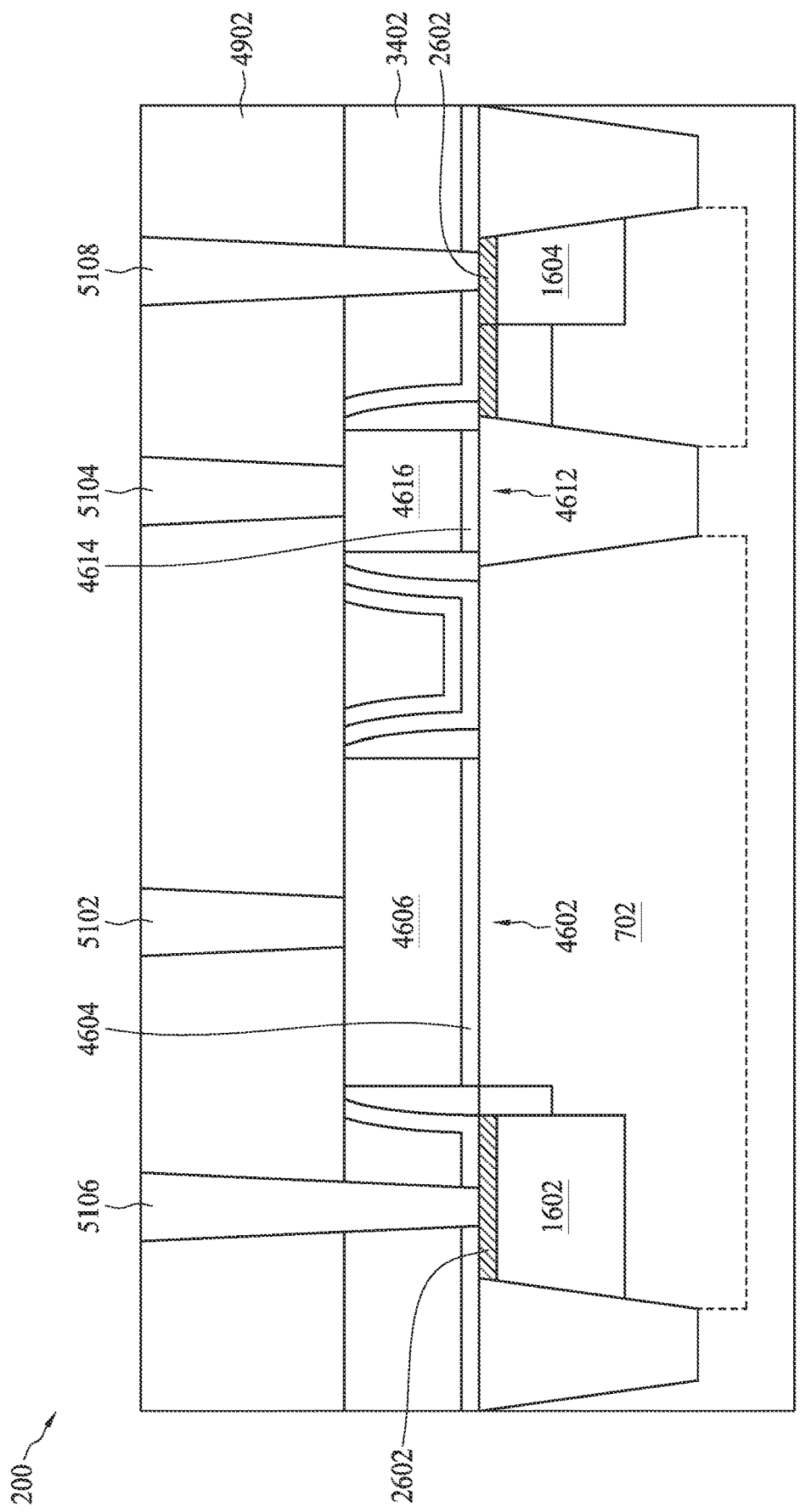
Figure 52:
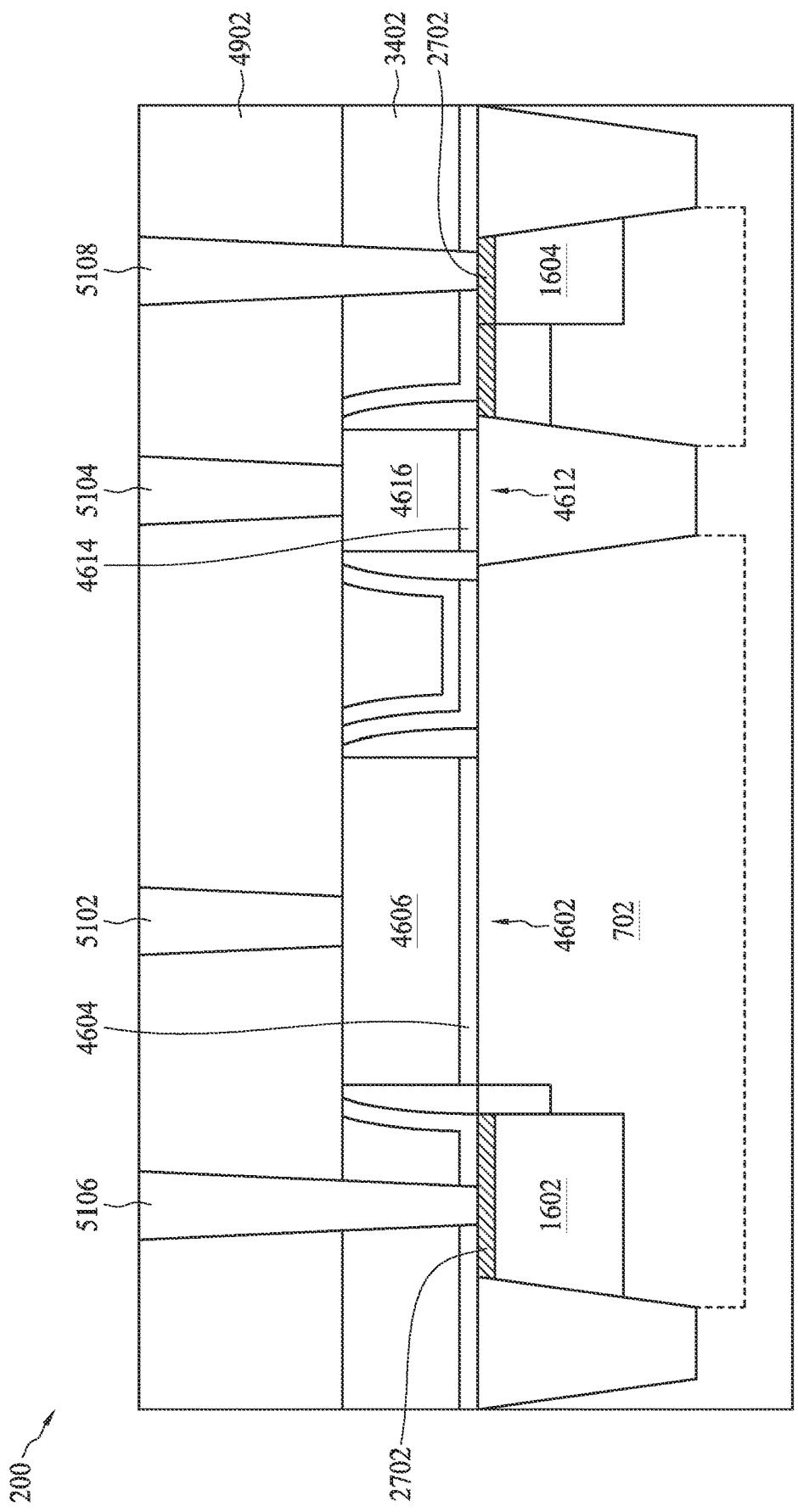

Corresponding to operation 132 of FIG. 1, FIGS. 49 and 50 are cross-sectional views of the first embodiment of the semiconductor device 200 including a number of contact structures 4912, 4914, and 4916. Corresponding to the same operation, FIGS. 51, 52, and 53 are cross-sectional views of the second embodiment of the semiconductor device 200 including a number of contact structures 5102, 5104, 5106, and 5108.

Following the formation of gate metal structure(s), a second ILD can be formed to overlay the workpiece (e.g., the first ILD 3402). Next, a number of contact structures can be formed to extend through the second ILD to (e.g., electrically) couple to a number of device features, respectively. In various embodiments, the contact structures can be formed by performing some of the following processes: forming a patternable layer over the second ILD that includes a pattern defining locations of the contact structures; etching at least the second ILD to form a number of cavities, with the patternable layer as a mask; and filling the cavities with a metal material (e.g., Al, Cu, W, Ti, Ta, TiN, TaN).

For example in FIGS. 49 and 50, the contact structures 4912, 4914, and 4916 extend through the second ILD 4902 and/or the first ILD 3402 to (e.g., electrically) couple to the gate metal structure 4402 (specifically, the gate metal layer 4406), the source region 1502 (through the silicide layer 2402/2502), and the drain region 1504 (through the silicide layer 2402/2502), respectively. In some embodiments, the metal gate structure 4402 may function as an active or controlled gate. In the examples of FIGS. 51, 52, and 53, the contact structures 5102, 5104, 5106, and 5108 extend through the second ILD 4902 and/or the first ILD 3402 to (e.g., electrically) couple to the gate metal structure 4602 (specifically, the gate metal layer 4606), the gate metal structure 4612 (specifically, the gate metal layer 4616), the source region 1602 (through the silicide layer 2602/2702/2802), and the drain region 1504 (through the silicide layer 2602/2702/2802), respectively. In some embodiments, the metal gate structure 4612 may function as a dummy or non-controlled gate, in comparison with the metal gate structure 4602 that may function as an active or controlled gate. As used herein, an active or controlled gate is a gate receiving a voltage to activate, i.e., turn on or off, a corresponding transistor, and a dummy or non-controlled gate can float or be coupled to a pre-determined reference voltage (not shown).

In one aspect of the present disclosure, a semiconductor device is disclosed. The semiconductor device includes a first gate metal structure disposed over a substrate with a first height, wherein a first gate spacer and a second gate spacer extend along first and second sidewalls of the first gate metal structure, respectively. The semiconductor device includes a first source/drain region disposed opposite the first gate spacer from the first gate metal structure. The semiconductor device includes a second source/drain region disposed opposite the second gate spacer from the first gate metal structure, wherein a first lateral distance between the first sidewall and the first source/drain region is less than a second lateral distance between the second gate spacer and the second source/drain region. The semiconductor device includes a dielectric layer extending over a portion of a major surface of the substrate that is laterally located opposite the second gate spacer from the first gate metal structure, wherein the dielectric layer further extends along a sidewall of the second gate spacer with a second height that is substantially identical to the first height.

In another aspect of the present disclosure, a semiconductor device is disclosed. The semiconductor device includes an active gate metal structure disposed over a substrate, the active gate metal structure having a first sidewall and a second sidewall opposite to each other. The semiconductor device includes a first source/drain region disposed adjacent the first sidewall of the active gate metal structure with a first lateral distance. The semiconductor device includes a second source/drain region disposed adjacent the second sidewall of the active gate metal structure with a second lateral distance, wherein the second lateral distance is substantially greater than the first lateral distance. The semiconductor device includes a resist protective oxide (RPO) comprising a first portion extending over a portion of a major surface of the substrate that is laterally located between the second sidewall and the second source/drain region, wherein the RPO has no portion extending over a top surface of the active gate metal structure.

In yet another aspect of the present disclosure, a method for fabricating semiconductor devices is disclosed. The method includes forming a first poly gate structure over a substrate, wherein the first poly gate structure is overlaid by a first mask layer. The method includes forming a first source/drain region and a second source/drain region along a major surface of the substrate, wherein the first source/drain region and second source/drain region are asymmetrically disposed with respect to the first poly gate structure. The method includes overlaying the first poly gate structure, the first source/drain region, and the second source/drain region with a dielectric layer. The method includes patterning the dielectric layer thereby causing at least one of the following portions of the dielectric layer to be removed: a first portion overlaying a top surface of the first mask layer, a second portion extending along one or more sidewalls of the first poly gate structure and the first mask layer, a third portion overlaying the first source/drain region, or a fourth portion overlaying the second source/drain region.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gate metal structure disposed over a substrate with a first height, wherein a first gate spacer and a second gate spacer extend along first and second sidewalls of the first gate metal structure, respectively;
   a first source/drain region disposed opposite the first gate spacer from the first gate metal structure;
   a second source/drain region disposed opposite the second gate spacer from the first gate metal structure, wherein a first lateral distance between the first sidewall and the first source/drain region is less than a second lateral distance between the second gate spacer and the second source/drain region; and
   a dielectric layer extending over a portion of a major surface of the substrate that is laterally located opposite the second gate spacer from the first gate metal structure, wherein the dielectric layer further extends along a sidewall of the second gate spacer with a second height that is substantially identical to the first height.

2. The semiconductor device of claim 1, further comprising a second gate metal structure disposed over the substrate with the first height, wherein a third gate spacer and a fourth gate spacer extend along first and second sidewalls of the second gate metal structure, respectively, and wherein the third gate spacer faces the second gate spacer.

3. The semiconductor device of claim 2, wherein the second source/drain region is laterally located opposite the second gate metal structure from the portion of the major surface.

4. The semiconductor device of claim 2, wherein the dielectric layer further extends along a sidewall of the third gate spacer with the second height.

5. The semiconductor device of claim 2, wherein the dielectric layer has a lateral end terminating at a sidewall of the third gate spacer.

6. The semiconductor device of claim 1, wherein the first source/drain region and the second source/drain region are overlaid by a first silicide layer and a second silicide layer, respectively, with the portion of the major surface being free of any silicide layer.

7. The semiconductor device of claim 1, further comprising an etch stop layer comprising a first portion that lines the dielectric layer, wherein the etch stop layer has no portion extending over a top surface of the first gate metal structure.

8. The semiconductor device of claim 7, wherein the etch stop layer further comprises:
   a second portion extending along a sidewall of the first gate spacer with the second height;
   a third portion overlaying at least a portion of the first source/drain region; and
   a fourth portion overlaying at least a portion of the second source/drain region.

9. The semiconductor device of claim 1, wherein the dielectric layer essentially consists of a resist protective oxide (RPO).

10. A semiconductor device, comprising:
    a first gate metal structure disposed over a substrate with a first height, wherein a first gate spacer and a second gate spacer extend along first and second sidewalls of the first gate metal structure, respectively;
    a first source/drain region disposed opposite the first gate spacer from the first gate metal structure;
    a second source/drain region disposed opposite the second gate spacer from the first gate metal structure, wherein a first lateral distance between the first sidewall and the first source/drain region is less than a second lateral distance between the second gate spacer and the second source/drain region;
    a dielectric layer extending over a portion of a major surface of the substrate that is laterally located opposite the second gate spacer from the first gate metal structure, wherein the dielectric layer further extends along a sidewall of the second gate spacer with a second height that is substantially identical to the first height; and
    a second gate metal structure disposed over the substrate with the first height, wherein a third gate spacer and a fourth gate spacer extend along first and second sidewalls of the second gate metal structure, respectively, and wherein the third gate spacer faces the second gate spacer.

11. The semiconductor device of claim 10, wherein the second source/drain region is laterally located opposite the second gate metal structure from the portion of the major surface.

12. The semiconductor device of claim 10, wherein the dielectric layer further extends along a sidewall of the third gate spacer with the second height.

13. The semiconductor device of claim 10, wherein the dielectric layer has a lateral end terminating at a sidewall of the third gate spacer.

14. The semiconductor device of claim 10, wherein the first source/drain region and the second source/drain region are overlaid by a first silicide layer and a second silicide layer, respectively, with the portion of the major surface being free of any silicide layer.

15. The semiconductor device of claim 10, further comprising an etch stop layer comprising a first portion that lines the dielectric layer, wherein the etch stop layer has no portion extending over a top surface of the first gate metal structure.

16. The semiconductor device of claim 15, wherein the etch stop layer further comprises:
    a second portion extending along a sidewall of the first gate spacer with the second height;
    a third portion overlaying at least a portion of the first source/drain region; and
    a fourth portion overlaying at least a portion of the second source/drain region.

17. The semiconductor device of claim 10, wherein the dielectric layer essentially consists of a resist protective oxide (RPO).

18. A semiconductor device, comprising:
    a first gate metal structure disposed over a substrate with a first height, wherein a first gate spacer and a second gate spacer extend along first and second sidewalls of the first gate metal structure, respectively;
    a first source/drain region disposed opposite the first gate spacer from the first gate metal structure;
    a second source/drain region disposed opposite the second gate spacer from the first gate metal structure, wherein a first lateral distance between the first sidewall and the first source/drain region is less than a second lateral distance between the second gate spacer and the second source/drain region; and
    a dielectric layer extending over a portion of a major surface of the substrate that is laterally located opposite the second gate spacer from the first gate metal structure, wherein the dielectric layer further extends along a sidewall of the second gate spacer with a second height that is substantially identical to the first height;
wherein the dielectric layer essentially consists of a resist protective oxide (RPO).

19. The semiconductor device of claim 18, further comprising a second gate metal structure disposed over the substrate with the first height, wherein a third gate spacer and a fourth gate spacer extend along first and second sidewalls of the second gate metal structure, respectively, and wherein the third gate spacer faces the second gate spacer.

20. The semiconductor device of claim 19, wherein the second source/drain region is laterally located opposite the second gate metal structure from the portion of the major surface.

* * * * *